(12) United States Patent
Shen et al.

(10) Patent No.: US 7,958,428 B2
(45) Date of Patent: Jun. 7, 2011

(54) LDPC (LOW DENSITY PARITY CHECK) CODED SIGNAL DECODING USING PARALLEL AND SIMULTANEOUS BIT NODE AND CHECK NODE PROCESSING

(75) Inventors: Ba-Zhong Shen, Irvine, CA (US); Hau Thien Tran, Irvine, CA (US); Kelly Brian Cameron, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 951 days.

(21) Appl. No.: 11/846,761

(22) Filed: Aug. 29, 2007

(65) Prior Publication Data

US 2008/0215950 A1 Sep. 4, 2008

Related U.S. Application Data

(63) Continuation of application No. 10/851,614, filed on May 21, 2004, now Pat. No. 7,281,192.

(60) Provisional application No. 60/559,701, filed on Apr. 5, 2004.

(51) Int. Cl.
*H03M 13/00* (2006.01)
(52) U.S. Cl. ...................................................... 714/755
(58) Field of Classification Search .................... 714/755
See application file for complete search history.

(56) References Cited

U.S. PATENT DOCUMENTS 4,975,828 A * 12/1990 Wishneusky et al. ........... 710/11
5,968,198 A * 10/1999 Hassan et al. .................. 714/752

OTHER PUBLICATIONS

Hai-Gang Zhang; Dong-Feng Yuan; Pi-Ming Ma; Xiu-Mei Yang, "Low-density parity-check code (LDPC) schemes with BICM," Communication Technology Proceedings, 2003. ICCT 2003. International Conference on vol. 2, Issue , Apr. 9-11, 2003, pp. 1148-1151 vol. 2.
Jian Sun, "An Introduction to Low Density Parity Check (LDPC) Codes," WCRL Seminar Series, West Virginia University, Jun. 3, 2003, pp. 1-21.
Mohommad M. Mansour, "High-Performance Decoders for Regular and Irregular Repeat-Accumulate Codes," IEEE Communications Society, IEEE Global Telecommunications Conference, Globecom 2004, vol. 4, Issue 29, pp. 2583-2588, ISBN: 7-7803-8794-5/04.
Eran Sharon, Simon Litsyn, Jacob Goldberger, "An efficient message-passing schedule for LDPC decoding," Proceedings. 2004 23rd IEEE Convention of Electrical and Electronics Engineers in Israel, 2004, Sep. 6-7, 2004, pp. 223-226.

* cited by examiner

*Primary Examiner* — M. Mujtaba K Chaudry
*Assistant Examiner* — Enam Ahmed
(74) *Attorney, Agent, or Firm* — Garlick Harrison & Markison; Shayne X. Short

(57) ABSTRACT

LDPC (Low Density Parity Check) coded signal decoding using parallel and simultaneous bit node and check node processing. This novel approach to decoding of LDPC coded signals may be described as being LDPC bit-check parallel decoding. In some alternative embodiment, the approach to decoding LDPC coded signals may be modified to LDPC symbol-check parallel decoding or LDPC hybrid-check parallel decoding. A novel approach is presented by which the edge messages with respect to the bit nodes and the edge messages with respect to the check nodes may be updated simultaneously and in parallel to one another. Appropriately constructed executing orders direct the sequence of simultaneous operation of updating the edge messages at both nodes types (e.g., edge and check). For various types of LDPC coded signals, including parallel-block LDPC coded signals, this approach can perform decoding processing in almost half of the time as provided by previous decoding approaches.

20 Claims, 53 Drawing Sheets hybrid decoding functionality (having reduced complexity of symbol decoding) of LDPC coded modulation signals HDTV (High Definition Television) communication system uni-directional cellular communication system uni-directional cellular communication system bi-directional cellular communication system uni-directional microwave communication system bi-directional microwave communication system uni-directional point-to-point radio communication system bi-directional point-to-point radio communication system uni-directional communication system bi-directional communication system Fig. 11 one to many communication system WLAN (Wireless Local Area Network) communication system satellite receiver STB (Set Top Box) system communication system LDPC (Low Density Parity Check) code bipartite graph LDPC (Low Density Parity Check) coded modulation decoding functionality using bit metric LDPC (Low Density Parity Check) coded modulation decoding functionality using bit metric (with bit metric updating)

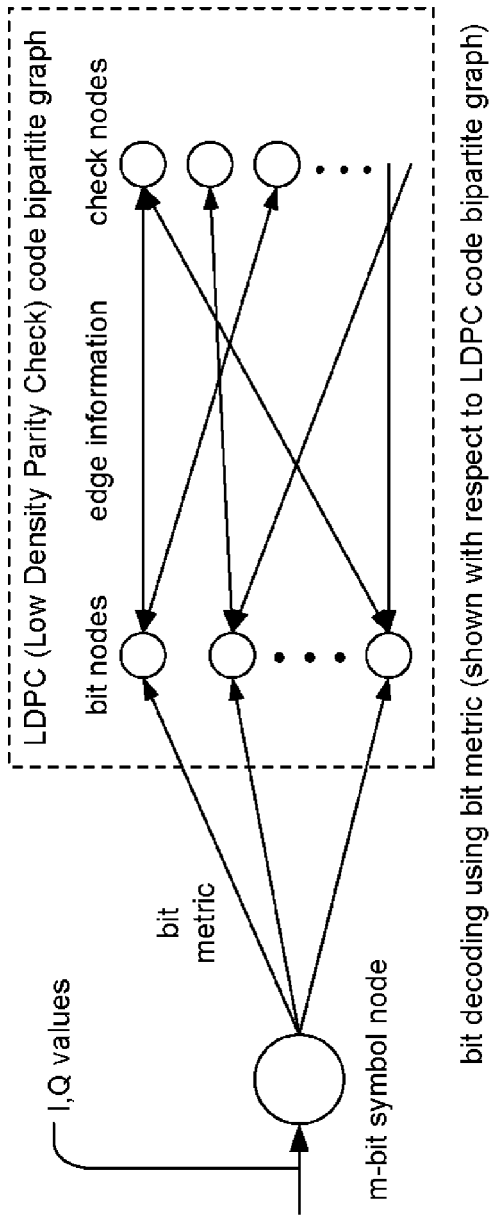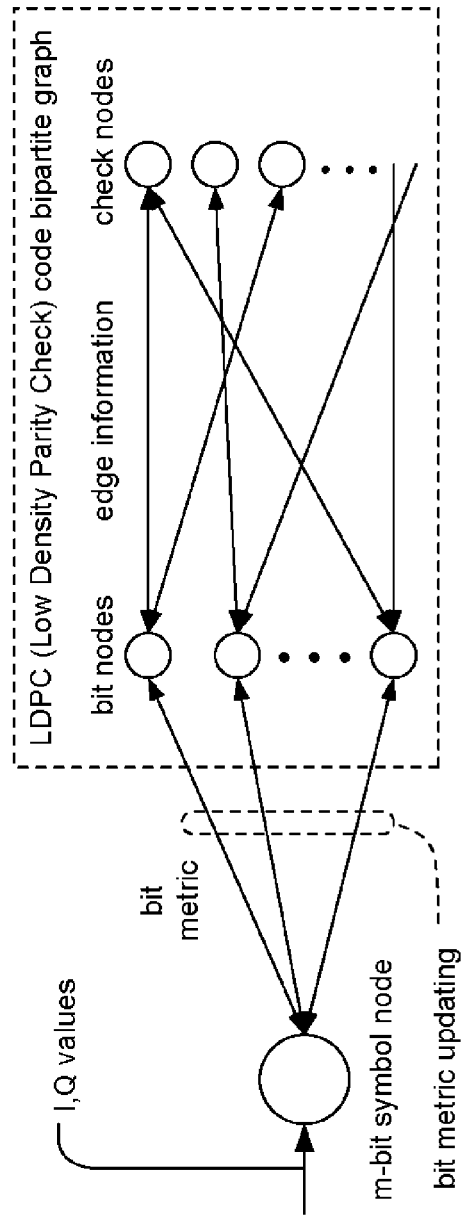

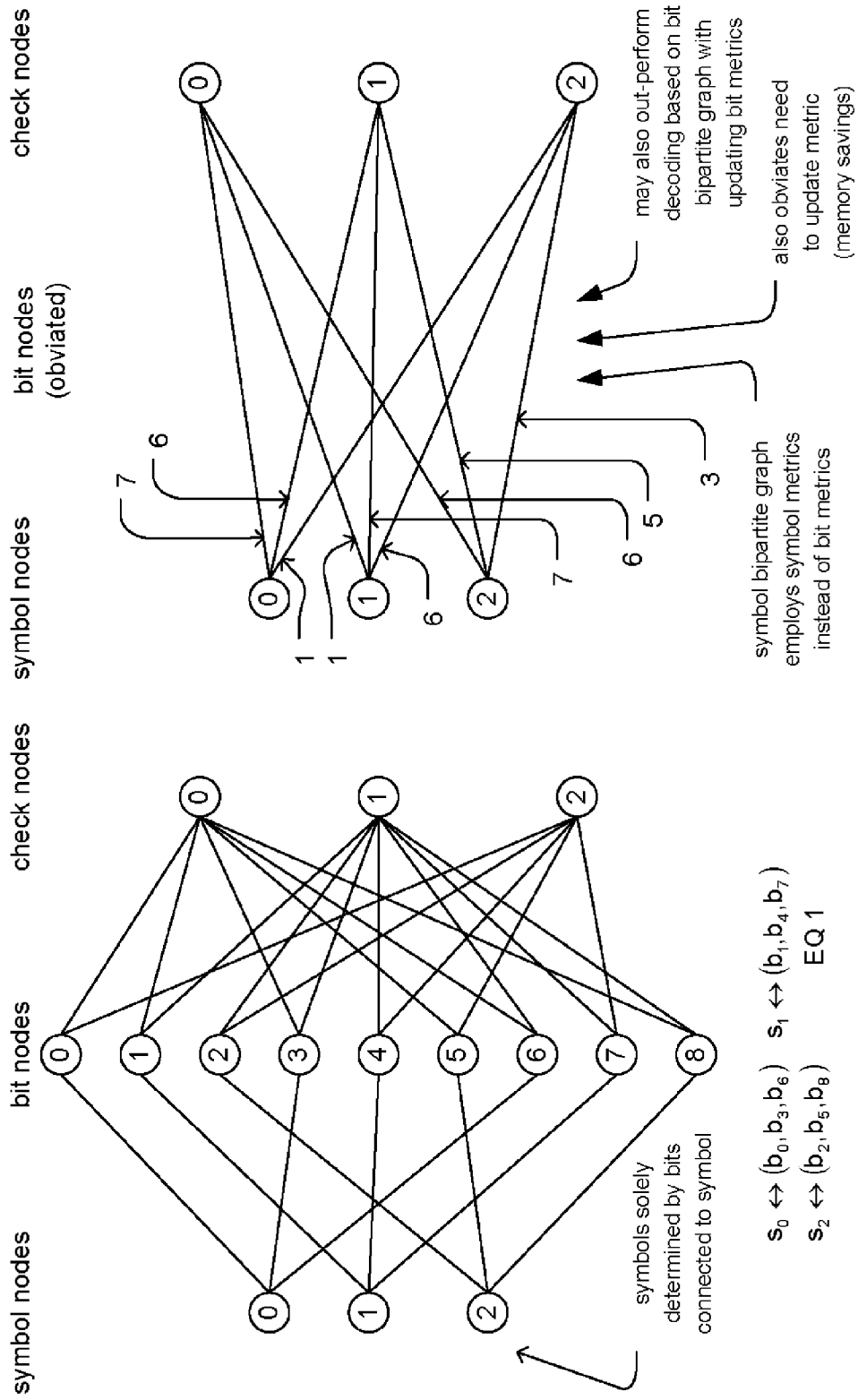

hybrid decoding functionality (having reduced complexity of symbol decoding) of LDPC coded modulation signals LDPC bit-check parallel decoding set up

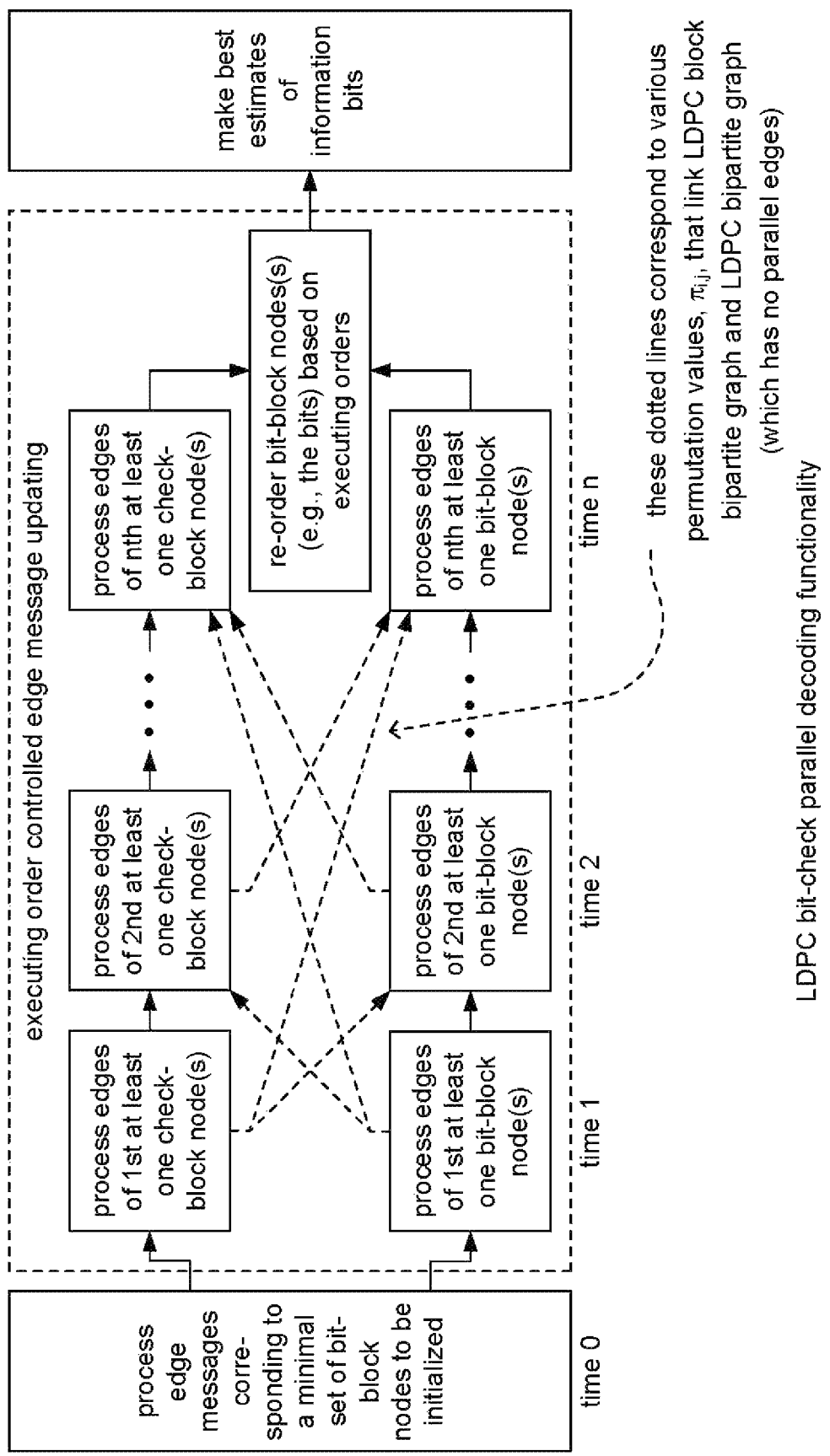

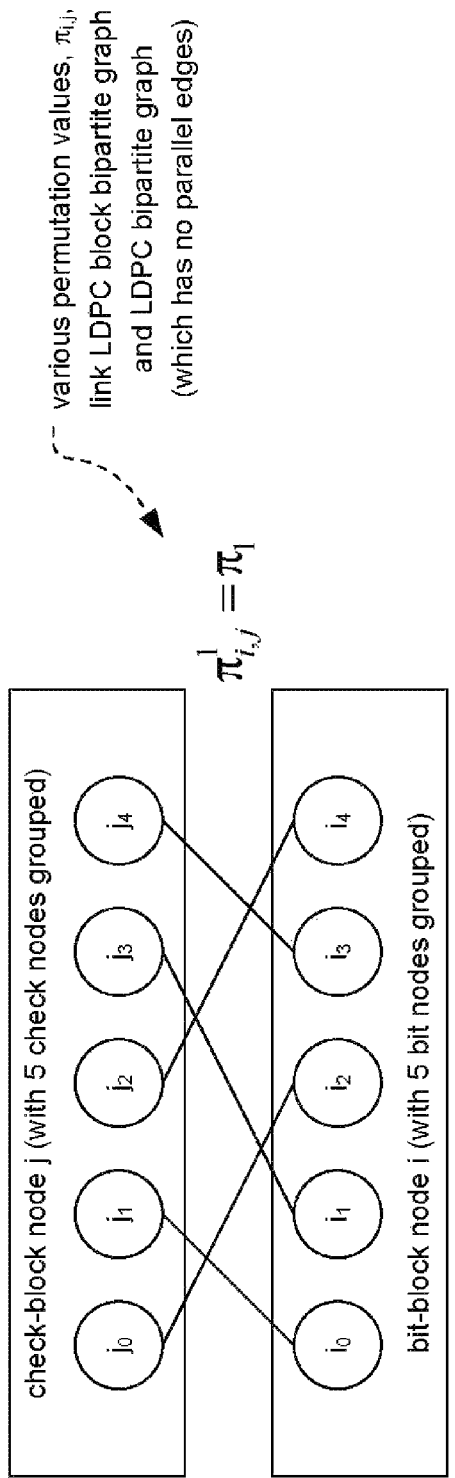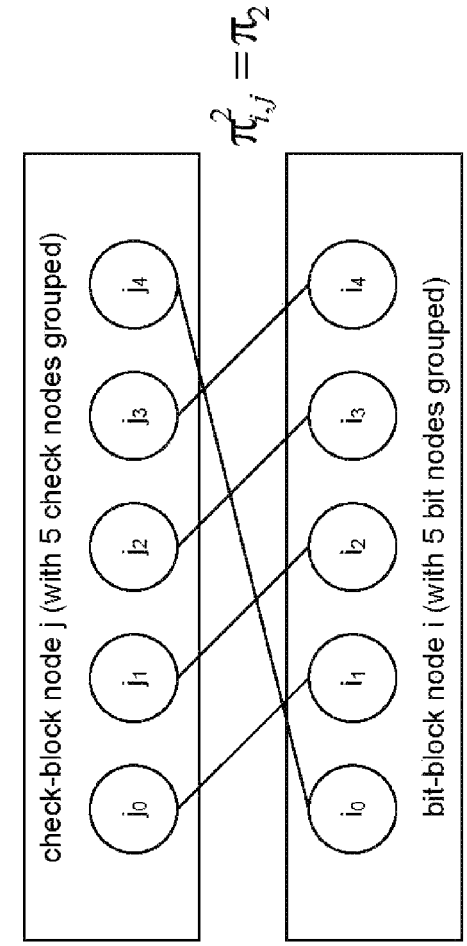
Fig. 31A  example of permutation, $\pi^1_{i,j}$, providing linkage between LDPC block bipartite graph and LDPC bipartite graph
Fig. 31B  example of permutation, $\pi^2_{i,j}$, providing linkage between LDPC block bipartite graph and LDPC bipartite graph

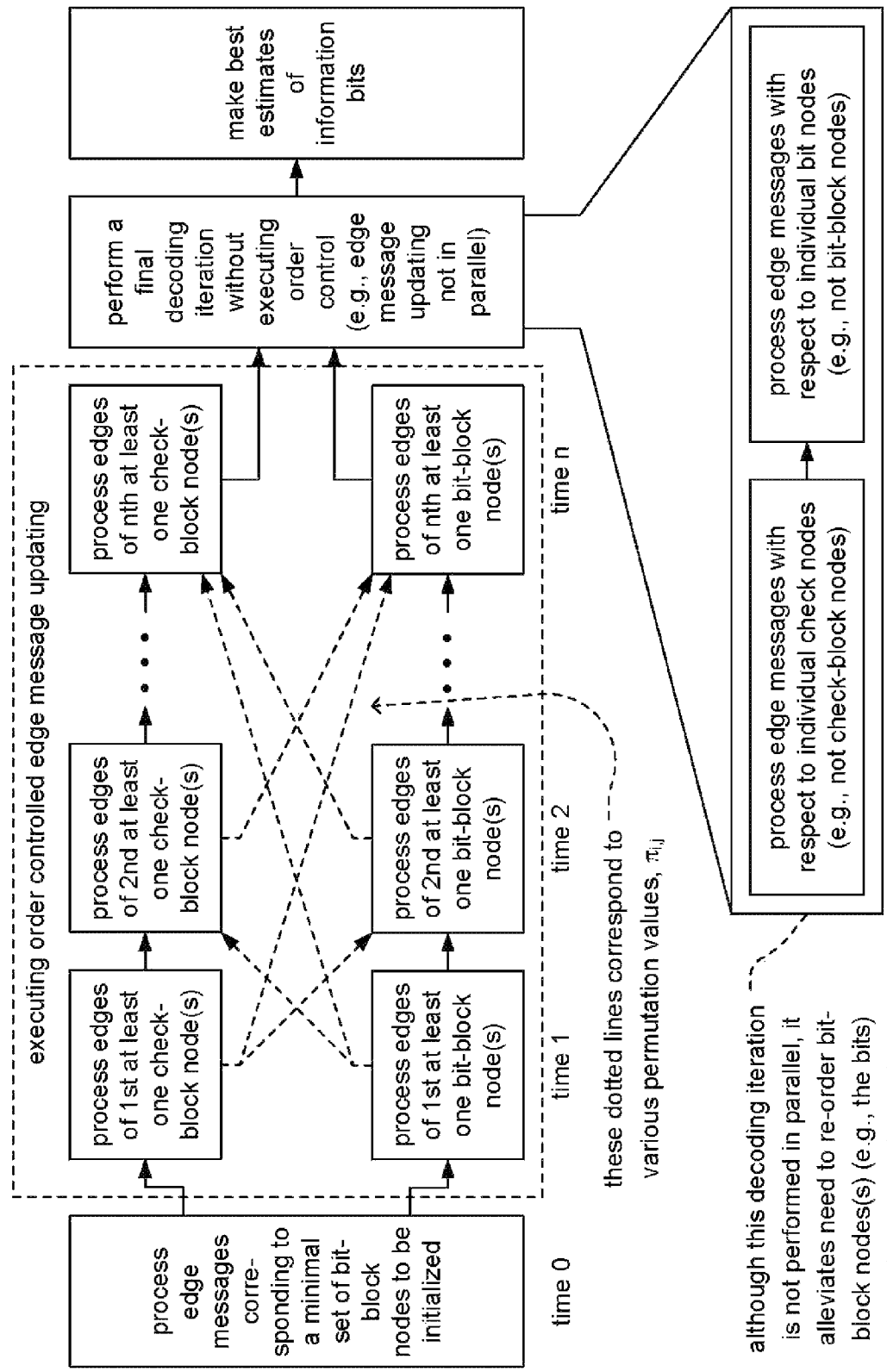

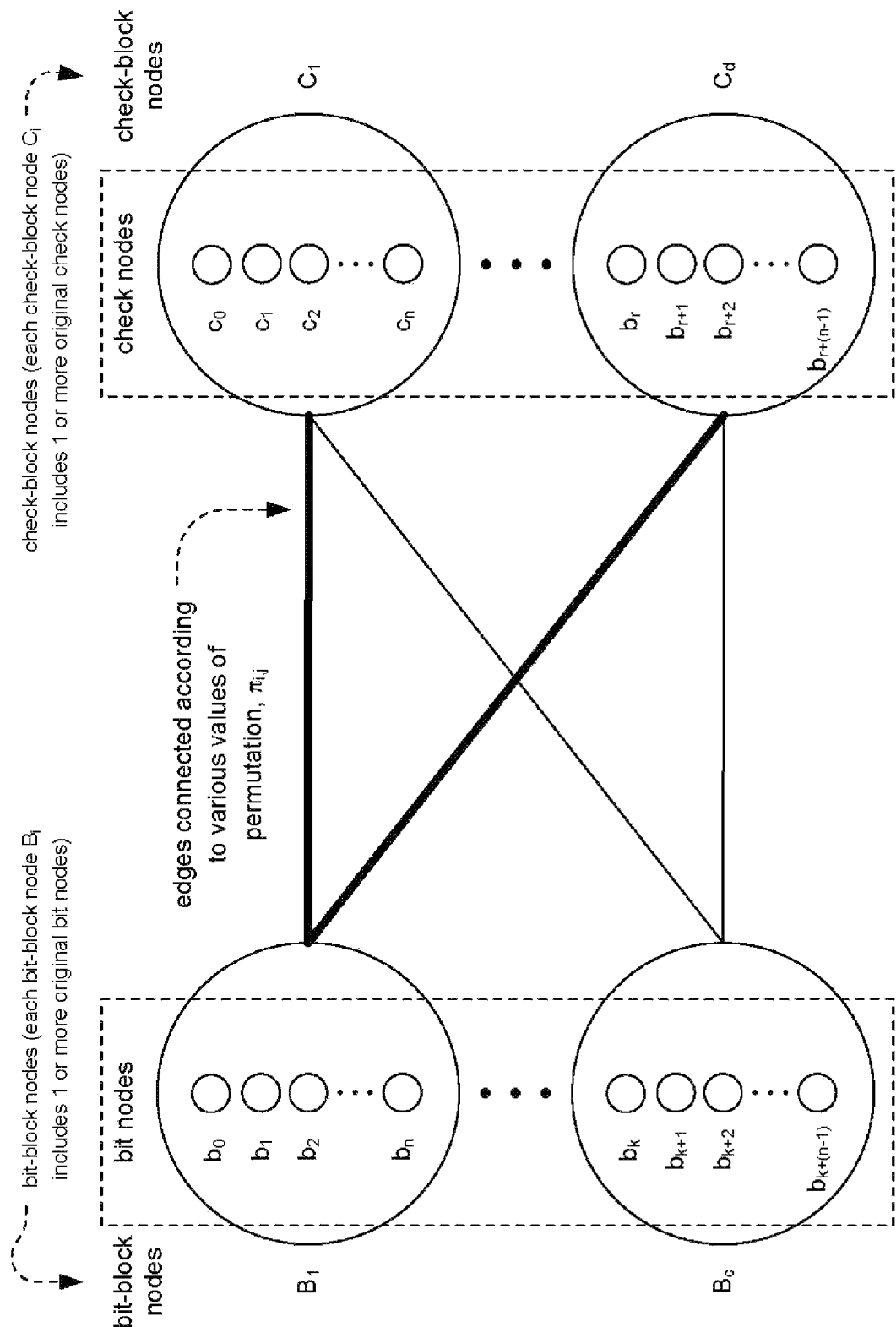
Fig. 33 LDPC block-bipartite graph

LDPC block-bipartite graph of a rate 1/2 parallel block LDPC code with block size of 1248 bits and 624 check equations

| bit\check | 0 | 1 | 2 | 3 | 4 | 5 | 6 | 7 | 8 | 9 | 10 | 11 |
|---|---|---|---|---|---|---|---|---|---|---|---|---|
| 0 | 0 | 36 | | 44 | | 21 | | | 38 | 28 | 13 | |
| 1 | 32 | 0 | 13 | 1 | 43 | 48 | | | 11 | | | 40,42 2,10 |
| 2 | | 34 | 0 | | | | 30 | 5 | | | | |
| 3 | | 16 | | 0 | | 2 | 24,13 | 48 | 44 | | | 22 |
| 4 | 42 | | 13 | 46 | 0 | | 41 | 18 | | 49 | | |
| 5 | | 37 | 43 | | 8,46 | 0 | 0 | | | 6 | | |
| 6 | 38 | | 25 | | | | | 0 | | | | |
| 7 | | | | 23 | 44 | | | | | 49 | 0 | 14 |
| 8 | 9 | | | | | 25 | | 4 | 0 | 0 | 49 | 0 |
| 9 | | | | | | | | 14 | | | | 12 |
| 10 | 0 | 0 | | 0 | | | 0 | | | | | |
| 11 | | 0 | 0 | 0 | 0 | 0 | 0 | 0 | 0 | | | |
| 12 | | | | | | 0 | | | | | | |
| 13 | | | | | | | | | | | | |
| 14 | | | | | | | | | | | | |
| 15 | | | | | | | | | | | | |
| 16 | | | | | | | | | | 0 | 0 | |
| 17 | | | | | | | | | 0 | 0 | | |
| 18 | | | | | | | | 0 | 0 | | | |
| 19 | | | | | | | 0 | 0 | | | | |
| 20 | | | | | | 0 | 0 | | | | | |
| 21 | | | | | 0 | 0 | | | | | | |
| 22 | | | | | | | | | | | 0 | 0 |
| 23 | 0 | | | | | | | | | | | 0 |

Table 1: permutations for all edges

Fig. 35

| check-block node | bit-block node | | | | |
|---|---|---|---|---|---|
| 0 | 0 | 1 | 4 | 7 | 9 | 12 | 23 |
| 1 | 0 | 1 | 2 | 3 | 5 | 13 | 12 |
| 2 | 1 | 2 | 4 | 5 | 6 | 14 | 13 |
| 3 | 0 | 1 | 3 | 4 | 9 | 15 | 14 |
| 4 | 1 | 4 | 5 | 5 | 7 | 16 | 15 |
| 5 | 0 | 1 | 3 | 5 | 10 | 17 | 16 |
| 6 | 2 | 3 | 3 | 5 | 6 | 18 | 17 |
| 7 | 3 | 4 | 7 | 10 | 11 | 19 | 18 |
| 8 | 0 | 1 | 3 | 4 | 8 | 20 | 19 |
| 9 | 0 | 5 | 6 | 8 | 9 | 21 | 20 |
| 0 | 0 | 1 | 4 | 7 | 9 | 12 | 23 |
| 10 | 0 | 2 | 2 | 10 | 11 | 22 | 21 |
| 11 | 2 | 2 | 4 | 8 | 11 | 23 | 22 |

Table 2: block-bipartite graph check-block node to bit-block node edges

Fig. 36

| bit-block node | check-block node | | | | | | |
|---|---|---|---|---|---|---|---|
| 0 | 0 | 1 | 3 | 5 | 8 | 9 | 10 |
| 1 | 0 | 1 | 2 | 3 | 4 | 5 | 8 |
| 2 | 1 | 2 | 6 | 10 | 10 | 11 | 11 |
| 3 | 1 | 3 | 5 | 6 | 6 | 7 | 8 |
| 4 | 0 | 2 | 3 | 4 | 7 | 8 | 11 |
| 5 | 1 | 2 | 4 | 4 | 5 | 6 | 9 |
| 6 | 2 | 6 | 9 | | | | |
| 7 | 0 | 4 | 7 | | | | |
| 8 | 8 | 9 | 11 | | | | |
| 9 | 0 | 3 | 9 | | | | |
| 10 | 5 | 7 | 10 | | | | |
| 11 | 7 | 10 | 11 | | | | |
| 12 | 0 | 1 | | | | | |
| 13 | 1 | 2 | | | | | |
| 14 | 2 | 3 | | | | | |
| 15 | 3 | 4 | | | | | |
| 16 | 4 | 5 | | | | | |
| 17 | 5 | 6 | | | | | |
| 18 | 6 | 7 | | | | | |
| 19 | 7 | 8 | | | | | |
| 20 | 8 | 9 | | | | | |
| 21 | 9 | 10 | | | | | |
| 22 | 10 | 11 | | | | | |
| 23 | 0 | 11 | | | | | |

Table 3: block-bipartite graph bit-block node to check-block node edges

Fig. 37

| Bit Iteration number | bit-block node | Check-block nodes | Check iteration number | Time (unit t) |
|---|---|---|---|---|
| 1 | 1,4,5,7,15,16,9,12,14,23 | | | 37 |
| 1 | 0 | 4 | 1 | 7 |
| 1 | 3 | 0 | 1 | 7 |
| 1 | 10,17,13 | 3 | 1 | 7 |
| 1 | 2 | 5 | 1 | 7 |
| 1 | 6,18,19 | 1 | 1 | 7 |
| 1 | 8,20,21 | 2 | 1 | 7 |
| 1 | 11,22 | 8 | 1 | 5 |
| 2 | 12 | 8 (continue) | 1 | 2 |
| 2 | 1 | 7 | 1 | 7 |
| 2 | 7,15,16 | 11 | 1 | 7 |
| 2 | 4 | 9 | 1 | 7 |
| 2 | 9,14,23 | 6 | 1 | 7 |
| 2 | 5 | 10 | 1 | 7 |
| 2 | 0 | 4 | 2 | 7 |
| 2 | 3 | 0 | 2 | 7 |
| 2 | 10,17,13 | 3 | 2 | 7 |
| 2 | 2 | 5 | 2 | 7 |
| 2 | 6,18,19 | 1 | 2 | 7 |
| 2 | 8,20,21 | 2 | 2 | 7 |
| 2 | 11,22 | 8 | 2 | 5 |
| 3 | 12 | 8 (continue) | 2 | 2 |
| 3 | 1 | 7 | 2 | 7 |
| 3 | 7,15,16 | 11 | 2 | 7 |
| 3 | 4 | 9 | 2 | 7 |
| 3 | 9,14,23 | 6 | 2 | 7 |
| 3 | 5 | 10 | 2 | 7 |
| | ... | | total | 37+84I |

Table 4: executing orders

Fig. 38

| Bit Iteration | Bit engine update | | Check engine update | | Check iteration |
|---|---|---|---|---|---|
| | edge | memory | edge | memory | |
| 1 | (12,0) | R | | | |
| 1 | (12,1) | R | | | |
| 1 | (1,0) | R | | | |
| 1 | (1,1) | R | | | |
| 1 | (1,2) | R | | | |
| 1 | (1,3) | R | | | |
| 1 | (1,4) | L | | | |
| 1 | (1,5) | L | | | |
| 1 | (1,8) | R | | | |
| 1 | (7,0) | R | | | |
| 1 | (7,4) | R | | | |
| 1 | (7,7) | L | | | |
| 1 | (15,3) | L | | | |
| 1 | (15,4) | L | | | |
| 1 | (16,4) | L | | | |
| 1 | (16,5) | R | | | |
| 1 | (4,0) | L | | | |
| 1 | (4,2) | L | | | |
| 1 | (4,3) | L | | | |
| 1 | (4,4) | R | | | |
| 1 | (4,7) | L | | | |
| 1 | (4,8) | R | | | |
| 1 | (4,11) | R | | | |
| 1 | (9,0) | R | | | |
| 1 | (9,3) | R | | | |
| 1 | (9,9) | R | | | |
| 1 | (14,2) | L | | | |
| 1 | (14,3) | R | | | |
| 1 | (23,0) | R | | | |
| 1 | (23,11) | L | | | |
| 1 | (5,1) | L | | | |
| 1 | (5,2) | R | | | |
| 1 | (5,5) | R | | | |
| 1 | (5,6) | R | | | |
| 1 | (5,4) | R | | | |
| 1 | (5,4)* | L | | | |
| 1 | (5,9) | R | | | |
| 1 | (0,0) | R | (1,4) | L | 1 |

Table 5: operation table (part 1/4)

Fig. 39

| Bit Iteration | Bit engine update | | Check engine update | | Check iteration |
|---|---|---|---|---|---|
| | edge | memory | edge | memory | |
| 1 | (0,1) | L | (4,4) | R | 1 |
| 1 | (0,3) | L | (5,4) | R | 1 |
| 1 | (0,5) | R | (5,4)* | L | 1 |
| 1 | (0,8) | L | (7,4) | R | 1 |
| 1 | (0,9) | R | (15,4) | L | 1 |
| 1 | (0,10) | R | (16,4) | L | 1 |
| 1 | (3,1) | L | (0,0) | R | 1 |
| 1 | (3,3) | L | (1,0) | R | 1 |
| 1 | (3,5) | R | (4,0) | L | 1 |
| 1 | (3,6) | L | (7,0) | R | 1 |
| 1 | (3,6)* | L | (9,0) | R | 1 |
| 1 | (3,7) | L | (12,0) | R | 1 |
| 1 | (3,8) | L | (23,0) | R | 1 |
| 1 | (10,5) | R | (0,3) | L | 1 |
| 1 | (10,7) | L | (1,3) | R | 1 |
| 1 | (10,10) | L | (3,3) | L | 1 |
| 1 | (17,5) | R | (4,3) | L | 1 |
| 1 | (17,6) | L | (9,3) | R | 1 |
| 1 | (13,1) | L | (14,3) | R | 1 |
| 1 | (13,2) | R | (15,3) | L | 1 |
| 1 | (2,1) | L | (0,5) | R | 1 |
| 1 | (2,2) | R | (1,5) | L | 1 |
| 1 | (2,6) | L | (3,5) | R | 1 |
| 1 | (2,10) | L | (5,5) | R | 1 |
| 1 | (2,10)* | L | (10,5) | R | 1 |
| 1 | (2,11) | L | (16,5) | R | 1 |
| 1 | (2,11)* | L | (17,5) | R | 1 |
| 1 | (6,2) | R | (0,1) | L | 1 |
| 1 | (6,6) | L | (1,1) | R | 1 |
| 1 | (6,9) | R | (2,1) | L | 1 |
| 1 | (18,6) | R | (3,1) | L | 1 |
| 1 | (18,7) | R | (5,1) | L | 1 |
| 1 | (19,7) | L | (12,1) | R | 1 |
| 1 | (19,8) | R | (13,1) | L | 1 |
| 1 | (8,8) | L | (1,2) | R | 1 |
| 1 | (8,9) | L | (2,2) | R | 1 |
| 1 | (8,11) | R | (4,2) | L | 1 |
| 1 | (20,8) | L | (5,2) | R | 1 |
| 1 | (20,9) | L | (6,2) | R | 1 |

Table 5: operation table (part 2/4)

Fig. 40

| Bit Iteration | Bit engine update | | Check engine update | | Check iteration |
|---|---|---|---|---|---|
| | edge | memory | edge | memory | |
| 1 | (21,9) | L | (13,2) | R | 1 |
| 1 | (21,10) | R | (14,2) | L | 1 |
| 1 | (11,7) | R | (0,8) | L | 1 |
| 1 | (11,10) | L | (1,8) | R | 1 |
| 1 | (11,11) | R | (3,8) | L | 1 |
| 1 | (22,10) | L | (4,8) | R | 1 |
| 1 | (22,11) | R | (8,8) | L | 1 |
| 2 | (12,0) | R | (19,8) | L | 1 |
| 2 | (12,1) | R | (20,8) | L | 1 |
| 2 | (1,0) | R | (3,7) | L | 1 |
| 2 | (1,1) | R | (4,7) | L | 1 |
| 2 | (1,2) | R | (7,7) | L | 1 |
| 2 | (1,3) | R | (10,7) | L | 1 |
| 2 | (1,4) | L | (11,7) | R | 1 |
| 2 | (1,5) | L | (18,7) | R | 1 |
| 2 | (1,8) | R | (19,7) | L | 1 |
| 2 | (7,0) | R | (2,11) | L | 1 |
| 2 | (7,4) | R | (2,11)* | L | 1 |
| 2 | (7,7) | L | (4,11) | R | 1 |
| 2 | (15,3) | L | (8,11) | R | 1 |
| 2 | (15,4) | L | (11,11) | R | 1 |
| 2 | (16,4) | L | (22,11) | R | 1 |
| 2 | (16,5) | R | (23,11) | L | 1 |
| 2 | (4,0) | L | (0,9) | R | 1 |
| 2 | (4,2) | L | (5,9) | R | 1 |
| 2 | (4,3) | L | (6,9) | R | 1 |
| 2 | (4,4) | R | (8,9) | L | 1 |
| 2 | (4,7) | L | (9,9) | R | 1 |
| 2 | (4,8) | R | (20,9) | L | 1 |
| 2 | (4,11) | R | (21,9) | L | 1 |
| 2 | (9,0) | R | (2,6) | L | 1 |
| 2 | (9,3) | R | (3,6) | L | 1 |
| 2 | (9,9) | R | (3,6)* | L | 1 |
| 2 | (14,2) | L | (5,6) | R | 1 |
| 2 | (14,3) | R | (6,6) | L | 1 |
| 2 | (23,0) | R | (17,6) | L | 1 |
| 2 | (23,11) | L | (18,6) | R | 1 |
| 2 | (5,1) | L | (0,10) | R | 1 |
| 2 | (5,2) | R | (2,10) | L | 1 |

Table 5: operation table (part 3/4)

Fig. 41

| Bit Iteration | Bit engine update | | Check engine update | | Check iteration |
|---|---|---|---|---|---|
| | edge | memory | edge | memory | |
| 2 | (5,5) | R | (2,10)* | L | 1 |
| 2 | (5,6) | R | (10,10) | L | 1 |
| 2 | (5,4) | R | (11,10) | L | 1 |
| 2 | (5,4)* | L | (21,10) | R | 1 |
| 2 | (5,9) | R | (11,10) | L | 1 |
| 2 | (0,0) | R | (1,4) | L | 2 |
| 2 | (0,1) | L | (4,4) | R | 2 |
| 2 | (0,3) | L | (5,4) | R | 2 |
| 2 | (0,5) | R | (5,4)* | L | 2 |
| 2 | (0,8) | L | (7,4) | R | 2 |
| 2 | (0,9) | R | (15,4) | L | 2 |
| 2 | (0,10) | R | (16,4) | L | 2 |
| … | … | … | … | … | … |
| I | (22,11) | R | (8,8) | L | I |
| | | | (19,8) | L | I |
| | | | (20,8) | L | I |
| | | | (3,7) | L | I |
| | | | (4,7) | L | I |
| | | | (7,7) | L | I |
| | | | (10,7) | L | I |
| | | | (11,7) | R | I |
| | | | (18,7) | R | I |
| | | | (19,7) | L | I |
| | | | (0,10) | R | I |
| | | | (2,10) | L | I |
| | | | (2,10)* | L | I |
| | | | (10,10) | L | I |
| | | | (11,10) | L | I |
| | | | (21,10) | R | I |
| | | | (11,10) | L | I |

Table 5: operation table (part 4/4)

Fig. 42

| Bit Iteration number | Bit-block nodes | Check-block nodes | Check iteration number | time (unit t) |
|---|---|---|---|---|
| 1 | 2,4,8,11,23,22 | | | 24 |
| 1 | 0,10,21,20 | 11 | 1 | 14 |
| 1 | 3,7,18,19 | 10 | 1 | 14 |
| 1 | 1,9,14,15 | 7 | 1 | 14 |
| 1 | 5,6,17,18 | 3 | 1 | 14 |
| 1 | 12,13,16 | 0 | 1 | 14 |
| 2 | 11,22,23 | 8 | 1 | 14 |
| 2 | | 9 | 1 | 14 |
| 2 | 8 | 2 | 1 | 14 |
| | | 4 | 1 | 14 |
| 2 | 4 | 1 | 1 | 14 |
| | | 6 | 1 | 14 |
| 2 | 2 | 5 | 1 | 14 |
| 2 | 0,10,21,20 | 11 | 2 | 14 |
| 2 | 3,7,18,19 | 10 | 2 | 14 |
| 2 | 1,9,14,15 | 7 | 2 | 14 |
| 2 | 5,6,17,18 | 3 | 2 | 14 |
| 2 | 12,13,16 | 0 | 2 | 14 |
| 3 | 11,22,23 | 8 | 2 | 14 |
| 3 | | 9 | 2 | 14 |
| 3 | 8 | 2 | 2 | 14 |
| | | 4 | 2 | 14 |
| 3 | 4 | 1 | 2 | 14 |
| | | 6 | 2 | 14 |
| 3 | 2 | 5 | 2 | 14 |
| | ⋮ | ⋮ | | |
| | | total | — | 14 |
| | | | | 24+14*12*I |

Table 6: executing orders (alternative to the executing orders of Table 4)

Fig. 43

LDPC block-bipartite graph of a rate 2/3 parallel block LDPC code with block size of 1200 bits and 400 check equations

| Check-block node | bit-block node | | | | | | | | | |
|---|---|---|---|---|---|---|---|---|---|---|
| 0 | 0 | 1 | 1 | 4 | 5 | 10 | 15 | 19 | 20 | 29 |
| 1 | 1 | 1 | 1 | 7 | 9 | 10 | 11 | 12 | 20 | 21 |
| 2 | 0 | 1 | 1 | 2 | 7 | 12 | 14 | 19 | 21 | 22 |
| 3 | 1 | 1 | 3 | 3 | 9 | 11 | 12 | 123 | 22 | 23 |
| 4 | 0 | 1 | 1 | 4 | 6 | 13 | 14 | 16 | 23 | 24 |
| 5 | 0 | 0 | 5 | 5 | 8 | 13 | 15 | 16 | 24 | 25 |
| 6 | 0 | 0 | 2 | 2 | 6 | 10 | 16 | 18 | 25 | 26 |
| 7 | 0 | 1 | 4 | 6 | 7 | 17 | 17 | 17 | 26 | 27 |
| 8 | 0 | 0 | 1 | 3 | 8 | 14 | 15 | 18 | 27 | 28 |
| 9 | 0 | 0 | 1 | 8 | 9 | 11 | 18 | 19 | 28 | 29 |

Table 7: block-bipartite graph check-block node to bit-block node edges (for block-bipartite graph: rate 2/3 parallel block LDPC code)

Fig. 45

| # | Bit Iteration number | Bit-block nodes | Check-block nodes | Check Iter-ation number | Time (unit t) |
|---|---|---|---|---|---|
| 1 | 1 | 1,3,7,9,11,12,13,14,1 9,20,21,22,23 | | | 45 |
| 2 | 1 | 10 | 3 | 1 | 3 |
| 3 | 1 | 0 | 3(continue) | 1 | 7 |
| 4 | 1 | 0(continue) | 1 | 1 | 6 |
| 5 | 1 | 2 | 1(continue) | 1 | 3 |
| 6 | 1 | 4 | 1(continue) | 1 | 1 |
| 7 | 1 | 4(continue),6,16,24 | 2 | 1 | 10 |
| 8 | 1 | 8,18,28,29 | 4 | 1 | 10 |
| 9 | 1 | 5,15,27,25 | 9 | 1 | 10 |
| 10 | 1 | 17,26 | 8 | 1 | 5 |
| 11 | 2 | 9,21 | 8(continue) | 1 | 5 |
| 12 | 2 | 3,11,22,23 | 0 | 1 | 10 |
| 13 | 2 | 12,14,19,20 | 7 | 1 | 10 |
| 14 | 2 | 20(continue),1 | 5 | 1 | 10 |
| 15 | 2 | 1(continue),7,13 | 6 | 1 | 10 |
| 16 | 2 | 10 | 3 | 2 | 3 |
| 17 | 2 | 0 | 3(continue) | 2 | 7 |
| 18 | 2 | 0(continue) | 1 | 2 | 6 |
| 19 | 2 | 2 | 1(continue) | 2 | 2 |
| 20 | 2 | 4 | 1(continue) | 2 | 1 |
| 21 | 2 | 4(continue),6,16,24 | 2 | 2 | 10 |
| 22 | 2 | 8,18,28,29 | 4 | 2 | 10 |
| 23 | 2 | 5,15,27,25 | 9 | 2 | 10 |
| 24 | 2 | 17,26 | 8 | 2 | 5 |
| 25 | 3 | 9,21... | 8(continue) | 2 | 5 |
| ... | | | | | ... |
| | | | 6 | 1 | 10 |
| | | | total | | 45+100I |

Table 8: executing orders (for block-bipartite graph: rate 2/3 parallel block LDPC code)

Fig. 46

LDPC bit-check parallel decoding functionality using bit metric method for performing LDPC bit-check parallel decoding LDPC bit-check parallel decoding functionality using bit metric (with bit metric updating)

LDPC symbol-check parallel decoding functionality using symbol metric

LDPC hybrid-check parallel decoding functionality using both symbol metric and bit metric

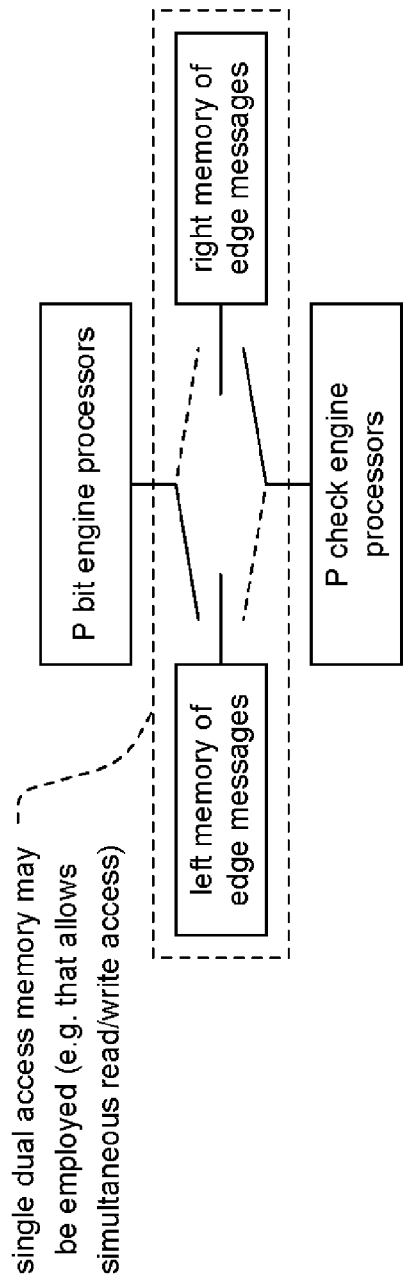
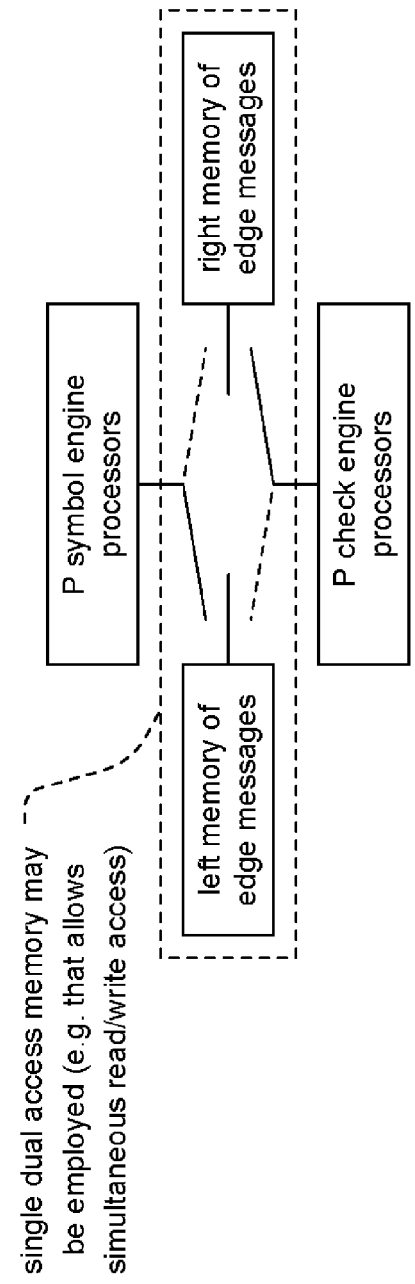

LDPC (LOW DENSITY PARITY CHECK) CODED SIGNAL DECODING USING PARALLEL AND SIMULTANEOUS BIT NODE AND CHECK NODE PROCESSING

CROSS REFERENCE TO RELATED PATENTS/PATENT APPLICATIONS

Continuation Priority Claim, 35 U.S.C. §120

The present U.S. Utility patent application claims priority pursuant to 35 U.S.C. §120, as a continuation, to the following U.S. Utility patent application which is hereby incorporated herein by reference in its entirety and made part of the present U.S. Utility patent application for all purposes:

1. U.S. Utility application Ser. No. 10/851,614, entitled "LDPC (Low Density Parity Check) coded signal decoding using parallel and simultaneous bit node and check node processing," filed May 21, 2004, pending, which claims priority pursuant to 35 U.S.C. §119(e) to the following U.S. Provisional Patent Application which is hereby incorporated herein by reference in its entirety and made part of the present U.S. Utility patent application for all purposes:

a. U.S. Provisional Application Ser. No. 60/559,701, "LDPC (Low Density Parity Check) coded signal decoding using parallel and simultaneous bit node and check node processing," filed Apr. 5, 2004.

BACKGROUND OF THE INVENTION

1. Technical Field of the Invention

The invention relates generally to communication systems; and, more particularly, it relates to decoding of signals within such communication systems.

2. Description of Related Art

Data communication systems have been under continual development for many years. One such type of communication system that has been of significant interest lately is a communication system that employs turbo codes. Another type of communication system that has also received interest is a communication system that employs LDPC (Low Density Parity Check) code. A primary directive in these areas of development has been to try continually to lower the error floor within a communication system. The ideal goal has been to try to reach Shannon's limit in a communication channel. Shannon's limit may be viewed as being the data rate to be used in a communication channel, having a particular SNR (Signal to Noise Ratio), that achieves error free transmission through the communication channel. In other words, the Shannon limit is the theoretical bound for channel capacity for a given modulation and code rate.

LDPC code has been shown to provide for excellent decoding performance that can approach the Shannon limit in some cases. For example, some LDPC decoders have been shown to come within 0.3 dB (decibels) from the theoretical Shannon limit. While this example was achieved using an irregular LDPC code of a length of one million, it nevertheless demonstrates the very promising application of LDPC codes within communication systems.

Typical encoding of LDPC coded modulation signals is performed by generating a signal that includes symbols each having a common code rate and being mapped to a singular modulation. That is to say, all of the symbols of such an LDPC coded modulation signal have the same code rate and the same modulation (the same constellation having a singular mapping). Oftentimes, such prior art encoding designs are implemented as to maximize the hardware and processing efficiencies of the particular design employed to generate the LDPC coded modulation signal having the single code rate and single modulation for all of the symbols generated therein.

With respect to decoding of such LDPC coded modulation signals, decoding is most commonly performed based on a bipartite graph of a given LDPC code such that the graph includes both bit nodes and check nodes. The I, Q (In-phase, Quadrature) values associated with received symbols are associated with a symbol node, and that symbol node is associated with corresponding bit nodes. Bit metrics are then calculated for the individual bits of the corresponding symbols, and those bit metrics are provided to the bit nodes of the bipartite graph of the given LDPC code. Edge information corresponding to the edges that interconnect the bit nodes and the check nodes is calculated, and appropriately updated, and communicated back and forth between the bit nodes and the check nodes during iterative decoding of the LDPC coded signal. Within such typical decoding systems, the bit metric values that are employed are fixed values and used repeatedly in the iterative decoding processing. As such, the performance of such prior art, bit only decoding approaches is inherently limited and may require more iterations to converge on a best estimate of information contained within an LDPC coded modulation signal.

Moreover, the manner by which decoding of these LDPC coded signals is performed typically involves updating the corresponding edge messages using an alternating processing approach by which all of the edge messages with respect to check nodes are updated and then all of the edge messages with respect to bit nodes are updated, and back and forth and so on. This iterative decoding processing (e.g., updating of the edge messages) is back and forth from the perspective of the bit nodes and the check nodes. A certain degree of latency can be introduced by the manner by which this decoding needs to be performed, in that, all of the edge messages with respect to the check node are updated, then all of the edge messages with respect to the bit node are updated, and continuing on alternatively and successively (as necessary) between the bit nodes and the check nodes. This can result in a certain degree of slow processing of the receiver end (e.g., decoder end) of a communication link. As such, there continues to be an ever-present need in the art for approaches by which the iterative decoding processing of LDPC coded signals may be performed in a faster and more efficient manner.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 24A is a diagram illustrating bit decoding using bit metric (shown with respect to an LDPC (Low Density Parity Check) code bipartite graph) according to the invention.

FIG. 24B is a diagram illustrating bit decoding using bit metric updating (shown with respect to an LDPC (Low Density Parity Check) code bipartite graph) according to the invention.

FIG. 25A is a diagram illustrating an LDPC (Low Density Parity Check) coded modulation tripartite graph with symbol nodes connected to bit nodes according to the invention.

FIG. 25B is a diagram illustrating an LDPC (Low Density Parity Check) coded modulation bipartite graph (or symbol bipartite graph) with symbol nodes connected directly to check nodes according to the invention (this bipartite graph is generated from the tripartite graph shown in FIG. 25A).

FIG. 30 is a diagram illustrating an embodiment of LDPC bit-check parallel decoding functionality that operates according to the invention.

FIG. 31A is a diagram illustrating an embodiment of an example permutation, $\pi_{i,j}^1$, providing linkage between LDPC block bipartite graph and LDPC bipartite graph according to the invention.

FIG. 31B is a diagram illustrating another embodiment of an example permutation, $\pi_{i,j}^2$, providing linkage between LDPC block bipartite graph and LDPC bipartite graph according to the invention.

FIG. 32 is a diagram illustrating an alternative embodiment of LDPC bit-check parallel decoding functionality that operates according to the invention.

FIG. 33 is a diagram illustrating an embodiment of an LDPC block-bipartite graph that is arranged according to the invention.

FIG. 35 is a diagram illustrating a table showing permutations for all edges of the LDPC block-bipartite graph of the FIG. 34 according to the invention.

FIG. 36 is a diagram illustrating a table showing the mapping of check-block node to bit-block node edges of the LDPC block-bipartite graph of the FIG. 34 according to the invention.

FIG. 37 is a diagram illustrating a table showing the mapping of bit-block node to check-block node edges of the LDPC block-bipartite graph of the FIG. 34 according to the invention.

FIG. 38 is a diagram illustrating a table showing executing orders that correspond to the LDPC block-bipartite graph of the FIG. 34 according to the invention.

FIG. 39, FIG. 40, FIG. 41, and FIG. 42 are diagrams illustrating tables showing various portions an operation table indicating memory accesses that correspond to the LDPC block-bipartite graph of the FIG. 34 according to the invention.

FIG. 43 is a diagram illustrating a table showing alternative executing orders (alternative to the FIG. 38) that correspond to the LDPC block-bipartite graph of the FIG. 34 according to the invention.

FIG. 45 is a diagram illustrating a table showing the mapping of check-block node to bit-block node edges of the LDPC block-bipartite graph of the FIG. 44 according to the invention.

FIG. 46 is a diagram illustrating a table showing executing orders that correspond to the LDPC block-bipartite graph of the FIG. 44 according to the invention.

FIG. 53A is a diagram illustrating an embodiment of a $1^{st}$ step of LDPC bit-check parallel decoding processing according to the invention.

FIG. 53B is a diagram illustrating an embodiment of a $1^{st}$ step of LDPC symbol-check parallel decoding processing according to the invention.

DETAILED DESCRIPTION OF THE INVENTION

Figure 1:
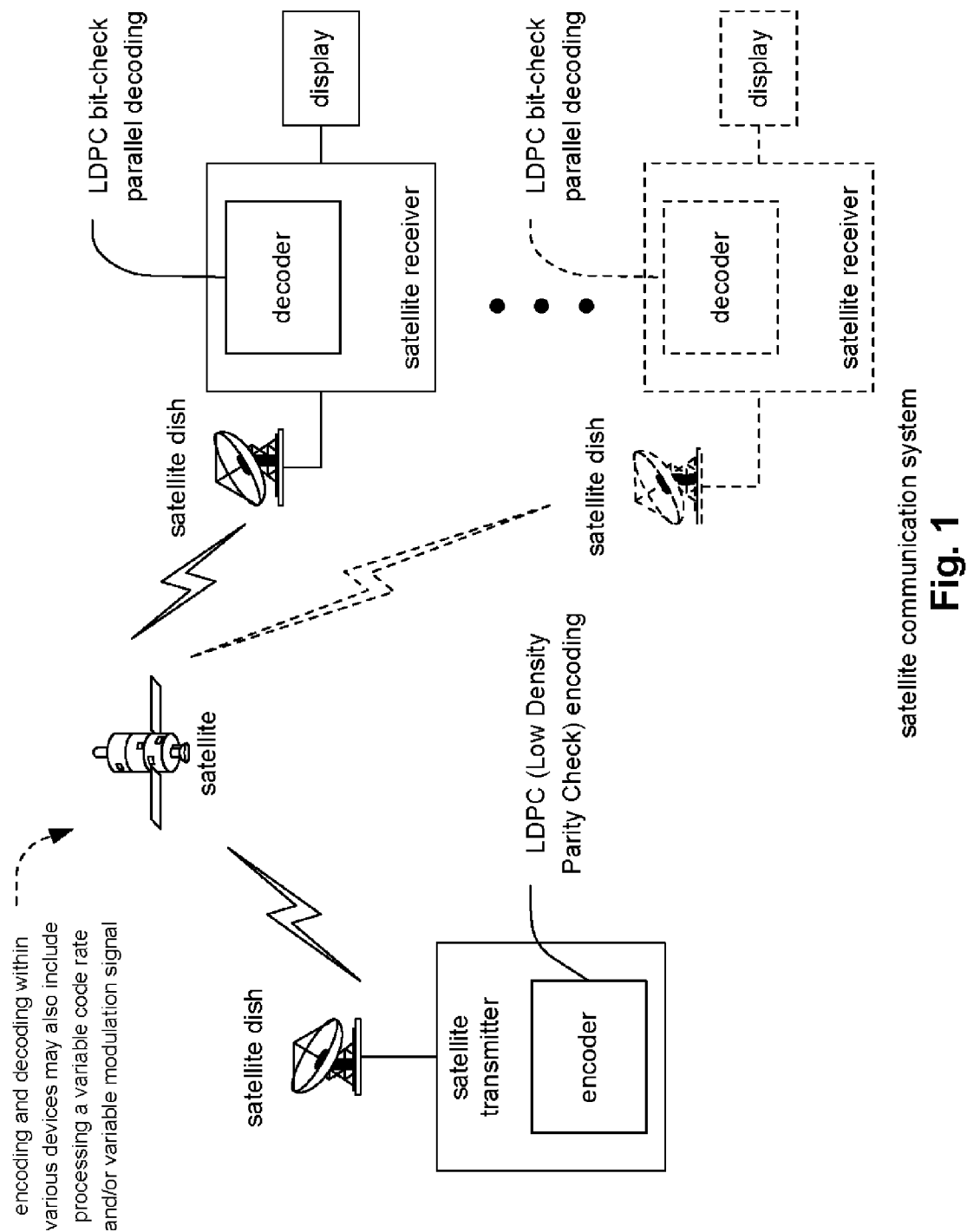
FIG. 1 is a system diagram illustrating an embodiment of a satellite communication system that is built according to the invention.

Various decoding aspects of the invention may be found in devices that perform decoding of LDPC (Low Density Parity Check) coded signals such that the updating of edge messages (in the context of the iterative decoding processing) can be performed simultaneously and in parallel with respect to the check nodes and the bit nodes. In the context of decoding LDPC coded signals using bit metric only, a bit engine processor and a check engine processor can run simultaneously and in parallel in the iterative decoding processing. This can provide for a significant savings in operational speed and latency in the iterative decoding processing when compared to prior art approaches. For example, when considering the instance when a check engine processor can operate as fast as a bit engine processor, then the overall latency of decoding processing, when performed according to the invention, can be reduced by a factor of approximately 49% (e.g., decoding that is performed almost twice as fast) as is described in further detail in one embodiment below.

In addition, this simultaneous and parallel approach to updating edge messages when decoding LDPC coded signals may be extended to LDPC coded signal decoding approaches beyond those of simply LDPC bit-check parallel decoding. For example, LDPC decoding approaches that operate on a symbol basis or using a hybrid approach may also benefit from this approach of simultaneous and parallel updating of the edge messages that communicatively couple between variable-block nodes and check-block nodes. For example, this approach may be extended to LDPC symbol-check parallel decoding or LDPC hybrid-check parallel decoding. That is to say, the parallel nature of the decoding processing presented herein can be extended not only to bit only decoding approaches to LDPC coded signals, but also to symbol and hybrid decoding approaches that operate to decode such LDPC coded signals.

Generally speaking, various aspects of the invention may be found in any number of devices that perform decoding of LDPC coded signals. Sometimes, these devices support bi-directional communication and are implemented to perform both encoding and decoding of LDPC coded signals. Moreover, in some embodiments, the encoding and decoding may be performed by combining LDPC encoding and modulation encoding to generate an LDPC coded signal. In some instances of the invention, the LDPC encoding is combined with modulation encoding to generate a variable modulation signal whose modulation may vary as frequently as on a symbol by symbol basis. That is to say, the constellation and/or mapping of the symbols of an LDPC coded variable modulation signal may vary as frequently as on a symbol by symbol basis. In addition, the code rate of the symbols of the coded signal may also vary as frequently as on a symbol by symbol basis. In general, an LDPC signal generated according to the encoding aspects of the invention may be characterized as a variable code rate and/or modulation signal.

The novel approaches to decoding of LDPC coded signals that is presented herein, can be applied to any of these various types of LDPC coded signals (e.g., straight-forward LDPC coded signals, LDPC coded modulation signals, LDPC variable modulation signal, LDPC variable code rate signals, and so on).

In the following description, a general construction of parallel-block LDPC codes is initially presented. This construction provides for a practical and feasible hardware implementation of longer length LDPC code decoder. This general construction also presents some known LDPC code constructions as illustrative of some special cases. Later on, various approaches to decoding of LDPC coded signals are presented, including: bit only decoding, bit only decoding (with bit metric updating), symbol decoding, and hybrid decoding. Thereafter, each of these various approaches to decoding of LDPC coded signals is described in the manner by which they can be adapted to perform the simultaneous and parallel iterative decoding processing of updating the edge messages corresponding to each of these decoding approaches. For example, an LDPC decoder that employs LDPC bit-check parallel decoding functionality using bit metric is introduced. Such a decoder may be characterized as being an LDPC bit-check parallel decoder. With a decoder that employs such functionality, the bit engine processor and the check engine processor run simultaneously and in parallel during in the iterative decoding processing. In one particular example, when assuming that the check engine processor runs as fast as the bit engine processor, then this newly introduced approach to decoding LDPC coded signals gives a 49% saving of the latency over conventional and prior art approaches to decoding LDPC coded signals.

Various system embodiments are described below where any of the various aspects of the invention may be implemented. In general, any device that performs encoding and/or decoding of LDPC coded signals (using the parallel and simultaneous approach to updating edge messages presented therein) may benefit from the invention. Again, this also includes those LDPC coded signals that have variable code rate and/or modulation as well as those that include combined LDPC coding and modulation coding.

FIG. 1 is a system diagram illustrating an embodiment of a satellite communication system that is built according to the invention. A satellite transmitter is communicatively coupled to a satellite dish that is operable to communicate with a satellite. The satellite transmitter may also be communicatively coupled to a wired network. This wired network may include any number of networks including the Internet, proprietary networks, other wired networks and/or WANs (Wide Area Networks). The satellite transmitter employs the satellite dish to communicate to the satellite via a wireless communication channel. The satellite is able to communicate with one or more satellite receivers (each having a satellite dish). Each of the satellite receivers may also be communicatively coupled to a display.

Here, the communication to and from the satellite may cooperatively be viewed as being a wireless communication channel, or each of the communication links to and from the satellite may be viewed as being two distinct wireless communication channels.

For example, the wireless communication "channel" may be viewed as not including multiple wireless hops in one embodiment. In other multi-hop embodiments, the satellite receives a signal received from the satellite transmitter (via its satellite dish), amplifies it, and relays it to satellite receiver (via its satellite dish); the satellite receiver may also be implemented using terrestrial receivers such as satellite receivers, satellite based telephones, and/or satellite based Internet receivers, among other receiver types. In the case where the satellite receives a signal received from the satellite transmitter (via its satellite dish), amplifies it, and relays it, the satellite may be viewed as being a "transponder;" this is a multi-hop embodiment. In addition, other satellites may exist that perform both receiver and transmitter operations in cooperation with the satellite. In this case, each leg of an up-down transmission via the wireless communication channel would be considered separately.

In whichever embodiment, the satellite communicates with the satellite receiver. The satellite receiver may be viewed as being a mobile unit in certain embodiments (employing a local antenna); alternatively, the satellite receiver may be viewed as being a satellite earth station that may be communicatively coupled to a wired network in a similar manner in which the satellite transmitter may also be communicatively coupled to a wired network.

The satellite transmitter is operable to encode information (using an encoder) in a manner in accordance with the functionality and/or processing of at least some of the various aspects of the invention to assist in generating a signal that is to be launched into the communication channel coupling the satellite transmitter and the satellite receiver. The satellite receiver is operable to decode a signal (using a decoder) received from the communication channel in a manner in accordance with the functionality and/or processing of at least some of the various aspects of the invention. This diagram shows one embodiment where one or more of the various aspects of the invention may be found.

Figure 2:
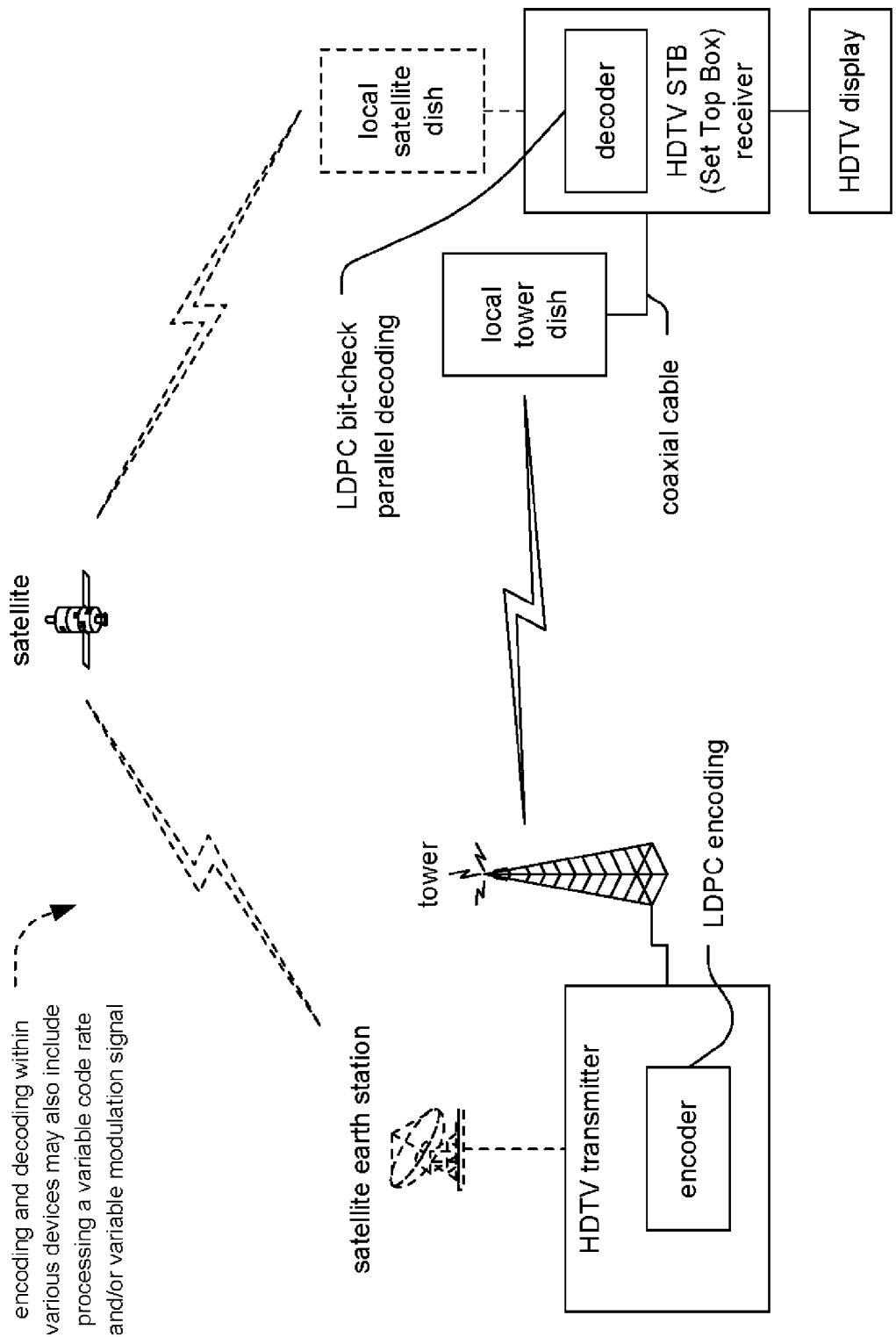
FIG. 2 is a system diagram illustrating an embodiment of an HDTV (High Definition Television) communication system that is built according to the invention.

FIG. 2 is a system diagram illustrating an embodiment of an HDTV (High Definition Television) communication system that is built according to the invention. An HDTV transmitter is communicatively coupled to a tower. The HDTV transmitter, using its tower, transmits a signal to a local tower dish via a wireless communication channel. The local tower dish may communicatively couple to an HDTV STB (Set Top Box) receiver via a coaxial cable. The HDTV STB receiver includes the functionality to receive the wireless transmitted signal that has been received by the local tower dish. This functionality may include any transformation and/or down-converting that may be needed to accommodate for any up-converting that may have been performed before and during transmission of the signal from the HDTV transmitter and its corresponding tower to transform the signal into a format that is compatible with the communication channel across which it is transmitted. For example, certain communication systems step a signal that is to be transmitted from a baseband signal to an IF (Intermediate Frequency) signal, and then to a carrier frequency signal before launching the signal into a communication channel. Alternatively, some communication systems perform a conversion directly from baseband to carrier frequency before launching the signal into a communication channel. In whichever case is employed within the particular embodiment, the HDTV STB receiver is operable to perform any down-converting that may be necessary to transform the received signal to a baseband signal that is appropriate for demodulating and decoding to extract the information there from.

The HDTV STB receiver is also communicatively coupled to an HDTV display that is able to display the demodulated and decoded wireless transmitted signals received by the HDTV STB receiver and its local tower dish. The HDTV transmitter (via its tower) transmits a signal directly to the local tower dish via the wireless communication channel in this embodiment. In alternative embodiments, the HDTV transmitter may first receive a signal from a satellite, using a satellite earth station that is communicatively coupled to the HDTV transmitter, and then transmit this received signal to the local tower dish via the wireless communication channel. In this situation, the HDTV transmitter operates as a relaying element to transfer a signal originally provided by the satellite that is ultimately destined for the HDTV STB receiver. For example, another satellite earth station may first transmit a signal to the satellite from another location, and the satellite may relay this signal to the satellite earth station that is communicatively coupled to the HDTV transmitter. In such a case the HDTV transmitter include transceiver functionality such that it may first perform receiver functionality and then perform transmitter functionality to transmit this received signal to the local tower dish.

In even other embodiments, the HDTV transmitter employs its satellite earth station to communicate to the satellite via a wireless communication channel. The satellite is able to communicate with a local satellite dish; the local satellite dish communicatively couples to the HDTV STB receiver via a coaxial cable. This path of transmission shows yet another communication path where the HDTV STB receiver may communicate with the HDTV transmitter.

In whichever embodiment and by whichever signal path the HDTV transmitter employs to communicate with the HDTV STB receiver, the HDTV STB receiver is operable to receive communication transmissions from the HDTV transmitter and to demodulate and decode them appropriately.

The HDTV transmitter is operable to encode information (using an encoder) in a manner in accordance with the functionality and/or processing of at least some of the various aspects of the invention to assist in generating a signal that is to be launched into the communication channel coupling the HDTV transmitter and the HDTV STB receiver. The HDTV STB receiver is operable to decode a signal (using a decoder) received from the communication channel in a manner in accordance with the functionality and/or processing of at least some of the various aspects of the invention. This diagram shows yet another embodiment where one or more of the various aspects of the invention may be found.

Figure 3A:
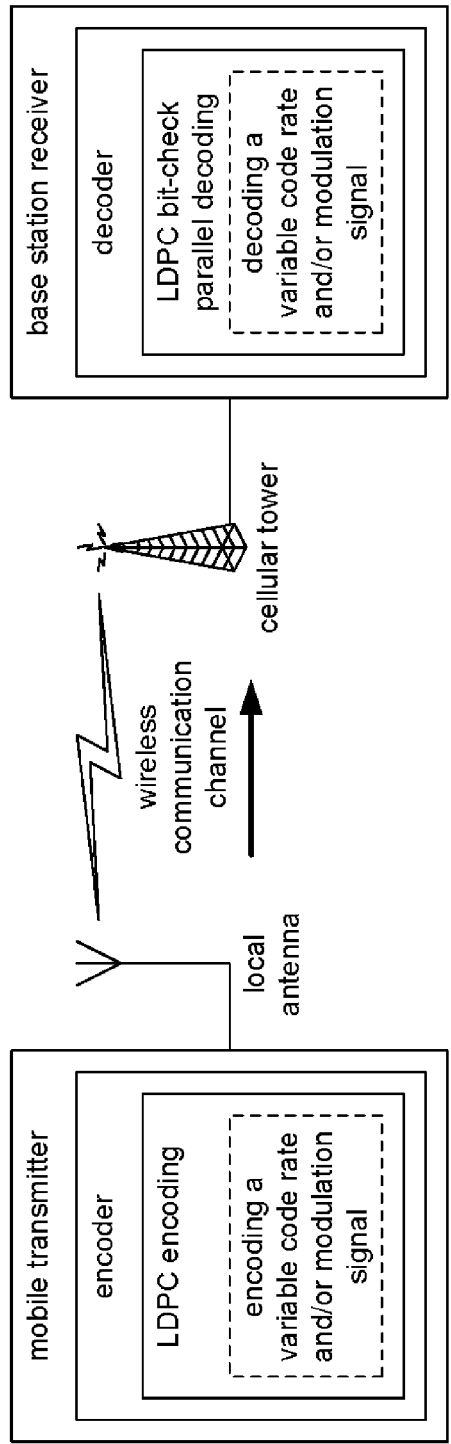
FIG. 3A and FIG. 3B are system diagrams illustrating embodiment of uni-directional cellular communication systems that are built according to the invention.
Figure 3B:
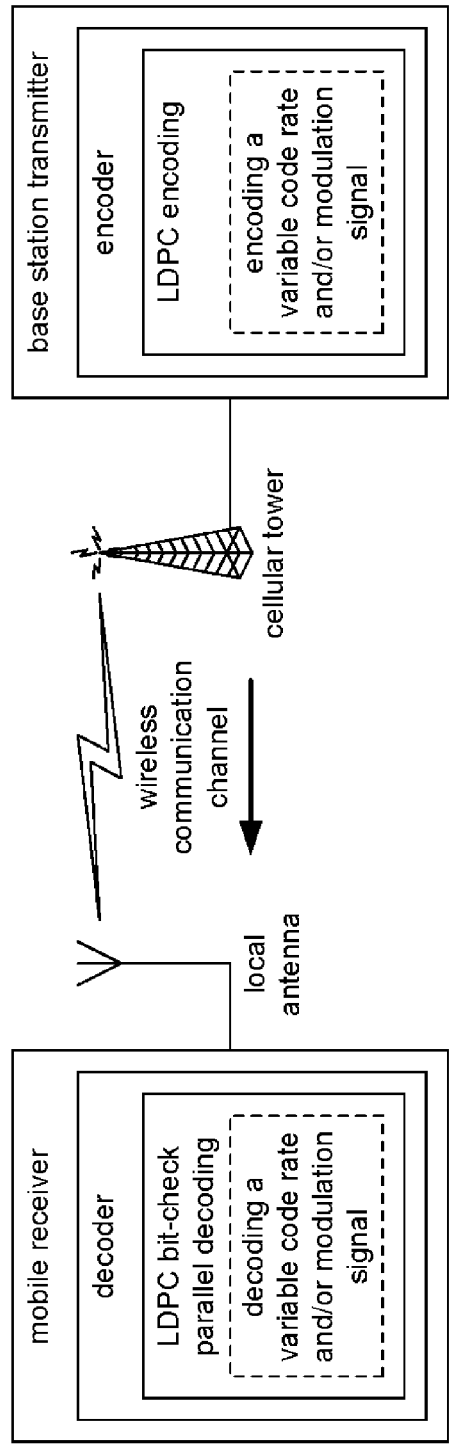

FIG. 3A and FIG. 3B are system diagrams illustrating embodiments of uni-directional cellular communication systems that are built according to the invention.

Referring to the FIG. 3A, a mobile transmitter includes a local antenna communicatively coupled thereto. The mobile transmitter may be any number of types of transmitters including a one way cellular telephone, a wireless pager unit, a mobile computer having transmission functionality, or any other type of mobile transmitter. The mobile transmitter transmits a signal, using its local antenna, to a cellular tower via a wireless communication channel. The cellular tower is communicatively coupled to a base station receiver; the receiving tower is operable to receive data transmission from the local antenna of the mobile transmitter that has been communicated via the wireless communication channel. The cellular tower communicatively couples the received signal to the base station receiver.

The mobile transmitter is operable to encode information (using an encoder) in a manner in accordance with the functionality and/or processing of at least some of the various aspects of the invention to assist in generating a signal that is to be launched into the communication channel coupling the mobile transmitter and the base station receiver. The base station receiver is operable to decode a signal (using a decoder) received from the communication channel in a manner in accordance with the functionality and/or processing of at least some of the various aspects of the invention. This diagram shows yet another embodiment where one or more of the various aspects of the invention may be found.

Referring to the FIG. 3B, a base station transmitter includes a cellular tower communicatively coupled thereto. The base station transmitter, using its cellular tower, transmits a signal to a mobile receiver via a communication channel. The mobile receiver may be any number of types of receivers including a one-way cellular telephone, a wireless pager unit, a mobile computer having receiver functionality, or any other type of mobile receiver. The mobile receiver is communicatively coupled to a local antenna; the local antenna is operable to receive data transmission from the cellular tower of the base station transmitter that has been communicated via the wireless communication channel. The local antenna communicatively couples the received signal to the mobile receiver.

The base station transmitter is operable to encode information (using an encoder) in a manner in accordance with the functionality and/or processing of at least some of the various aspects of the invention to assist in generating a signal that is to be launched into the communication channel coupling the base station transmitter and the mobile receiver. The mobile receiver is operable to decode a signal (using a decoder) received from the communication channel in a manner in accordance with the functionality and/or processing of at least some of the various aspects of the invention. This diagram shows yet another embodiment where one or more of the various aspects of the invention may be found.

Figure 4:
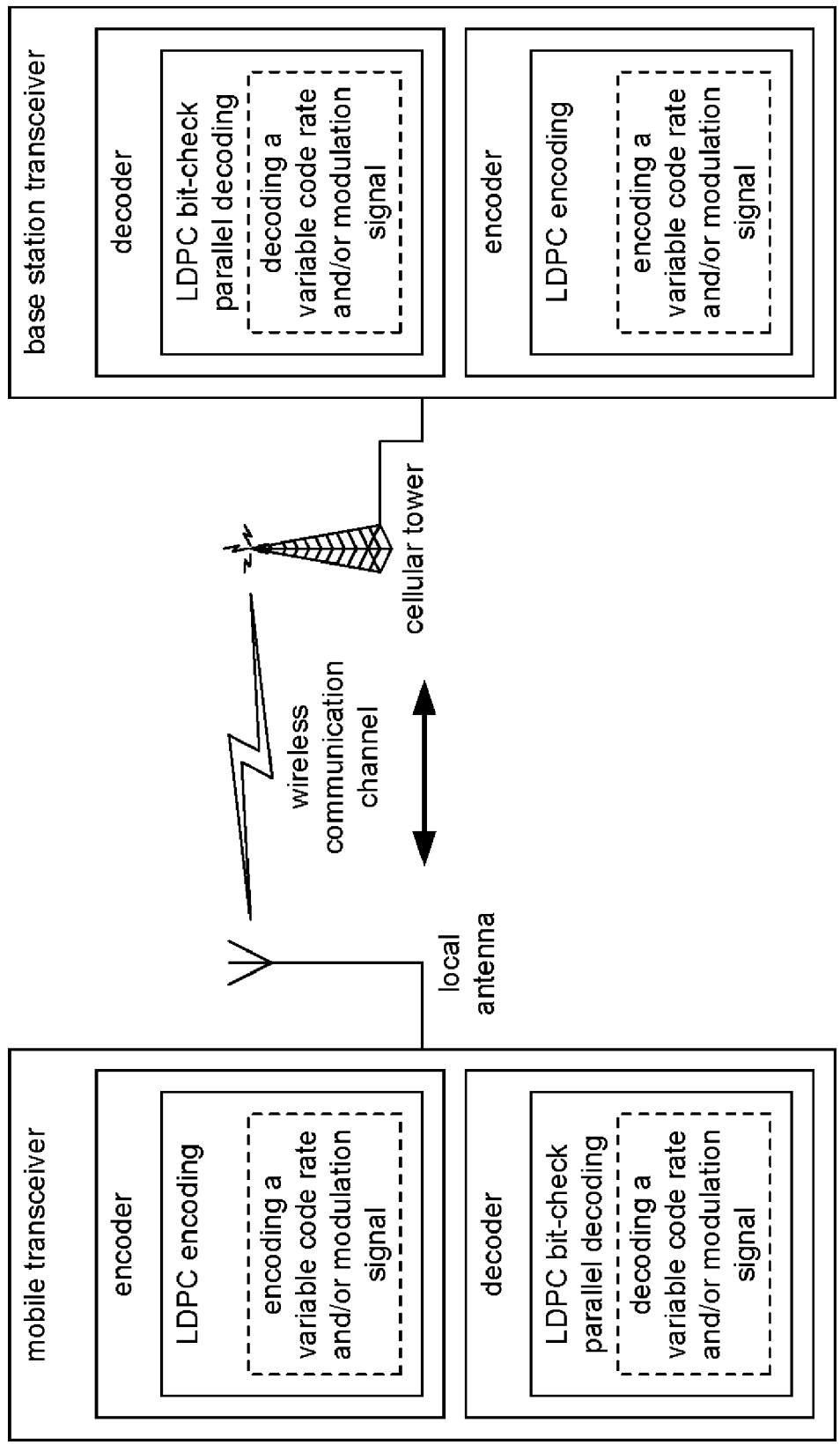
FIG. 4 is a system diagram illustrating an embodiment of a bi-directional cellular communication system that is built according to the invention.

FIG. 4 is a system diagram illustrating an embodiment of a bi-directional cellular communication system, built according to the invention, where the communication can go to and from the base station transceiver and to and from the mobile transceiver via the wireless communication channel.

Referring to the FIG. 4, a base station transceiver includes a cellular tower communicatively coupled thereto. The base station transceiver, using its cellular tower, transmits a signal to a mobile transceiver via a communication channel. The reverse communication operation may also be performed. The mobile transceiver is able to transmit a signal to the base station transceiver as well. The mobile transceiver may be any number of types of transceivers including a cellular telephone, a wireless pager unit, a mobile computer having transceiver functionality, or any other type of mobile transceiver. The mobile transceiver is communicatively coupled to a local antenna; the local antenna is operable to receive data transmission from the cellular tower of the base station transceiver that has been communicated via the wireless communication channel. The local antenna communicatively couples the received signal to the mobile transceiver.

The base station transceiver is operable to encode information (using its corresponding encoder) that is to be transmitted to the mobile transceiver. The mobile transceiver is operable to decode the transmitted signal (using its corresponding decoder). Similarly, mobile transceiver is operable to encode information (using its corresponding encoder) that is to be transmitted to the base station transceiver; the base station transceiver is operable to decode the transmitted signal (using its corresponding decoder).

As within other embodiments that employ an encoder and a decoder, the encoder of either of the base station transceiver or the mobile transceiver may be implemented to encode information (using its corresponding encoder) in a manner in accordance with the functionality and/or processing of at least some of the various aspects of the invention to assist in generating a signal that is to be launched into the communication channel coupling the base station transceiver and the mobile transceiver. The decoder of either of the base station transceiver or the mobile transceiver may be implemented to decode the transmitted signal (using its corresponding decoder) in a manner in accordance with the functionality and/or processing of at least some of the various aspects of the invention. This diagram shows yet another embodiment where one or more of the various aspects of the invention may be found.

Figure 5:
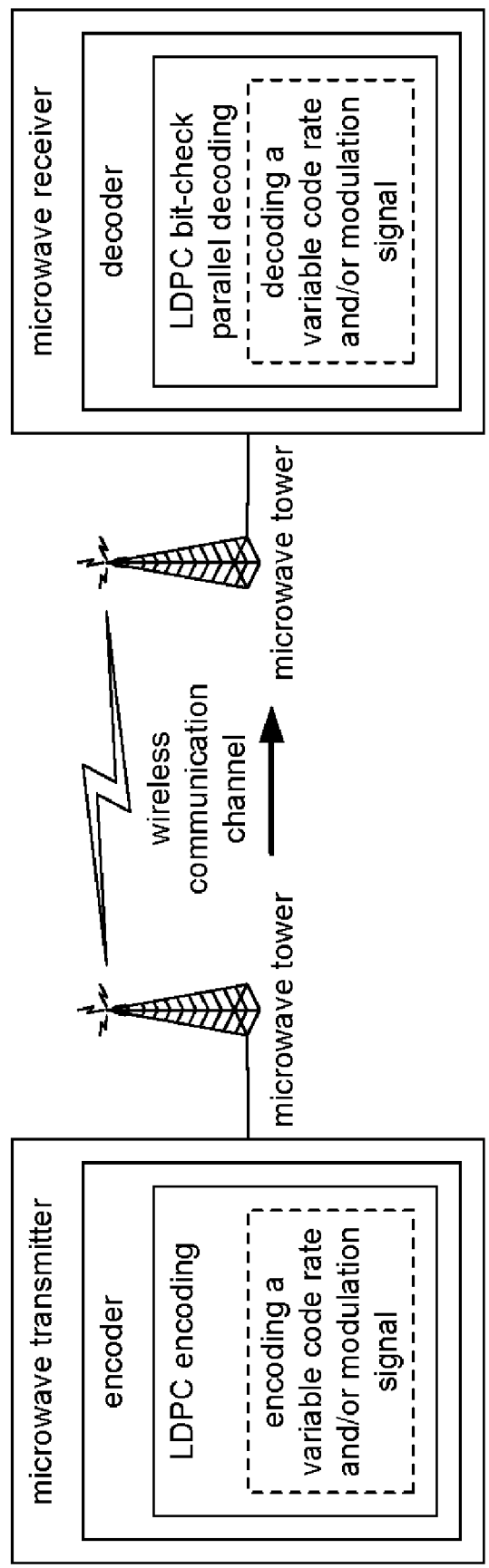
FIG. 5 is a system diagram illustrating an embodiment of a uni-directional microwave communication system that is built according to the invention.

FIG. 5 is a system diagram illustrating an embodiment of a uni-directional microwave communication system that is built according to the invention. A microwave transmitter is communicatively coupled to a microwave tower. The microwave transmitter, using its microwave tower, transmits a signal to a microwave tower via a wireless communication channel. A microwave receiver is communicatively coupled to the microwave tower. The microwave tower is able to receive transmissions from the microwave tower that have been communicated via the wireless communication channel.

The microwave transmitter is operable to encode information (using an encoder) in a manner in accordance with the functionality and/or processing of at least some of the various aspects of the invention to assist in generating a signal that is to be launched into the communication channel coupling the microwave transmitter and the microwave receiver. The microwave receiver is operable to decode a signal (using a decoder) received from the communication channel in a manner in accordance with the functionality and/or processing of at least some of the various aspects of the invention. This diagram shows yet another embodiment where one or more of the various aspects of the invention may be found.

Figure 6:
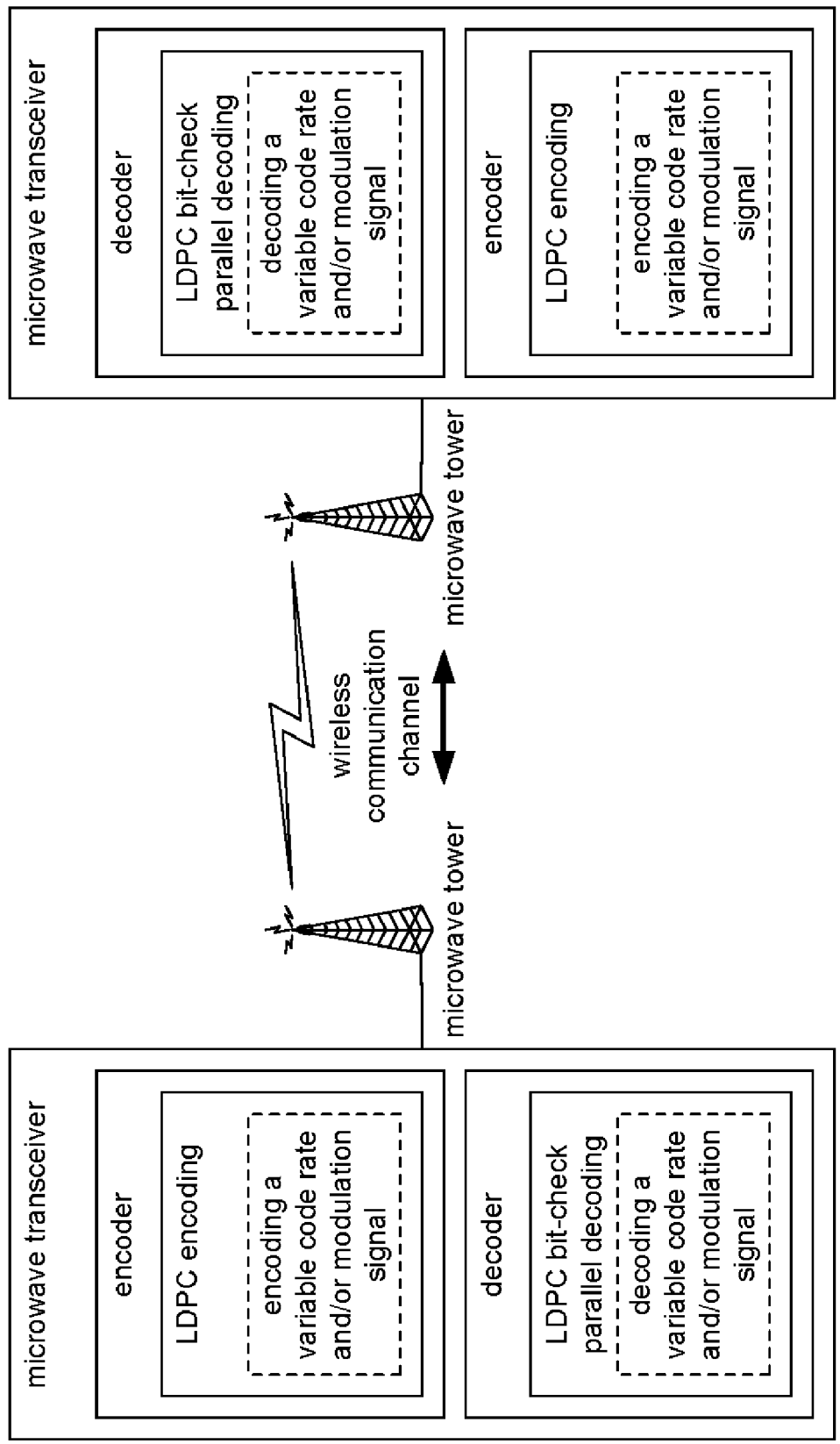
FIG. 6 is a system diagram illustrating an embodiment of a bi-directional microwave communication system that is built according to the invention.

FIG. 6 is a system diagram illustrating an embodiment of a bi-directional microwave communication system that is built according to the invention. Within the FIG. 6, a first microwave transceiver is communicatively coupled to a first microwave tower. The first microwave transceiver, using the first microwave tower (the first microwave transceiver's microwave tower), transmits a signal to a second microwave tower of a second microwave transceiver via a wireless communication channel. The second microwave transceiver is communicatively coupled to the second microwave tower (the second microwave transceiver's microwave tower). The second microwave tower is able to receive transmissions from the first microwave tower that have been communicated via the wireless communication channel. The reverse communication operation may also be performed using the first and second microwave transceivers.

Each of the microwave transceivers is operable to encode information (using its corresponding encoder) that is to be transmitted the other microwave transceiver. Each microwave transceiver is operable to decode the transmitted signal (using its corresponding decoder) that it receives. Each of the microwave transceivers includes an encoder and a decoder.

As within other embodiments that employ an encoder and a decoder, the encoder of either of the microwave transceivers may be implemented to encode information (using its corresponding encoder) in a manner in accordance with the functionality and/or processing of at least some of the various aspects of the invention to assist in generating a signal that is to be launched into the communication channel coupling the microwave transceivers. The decoder of either of the microwave transceivers may be implemented to decode the transmitted signal (using its corresponding decoder) in a manner in accordance with the functionality and/or processing of at least some of the various aspects of the invention. This diagram shows yet another embodiment where one or more of the various aspects of the invention may be found.

Figure 7:
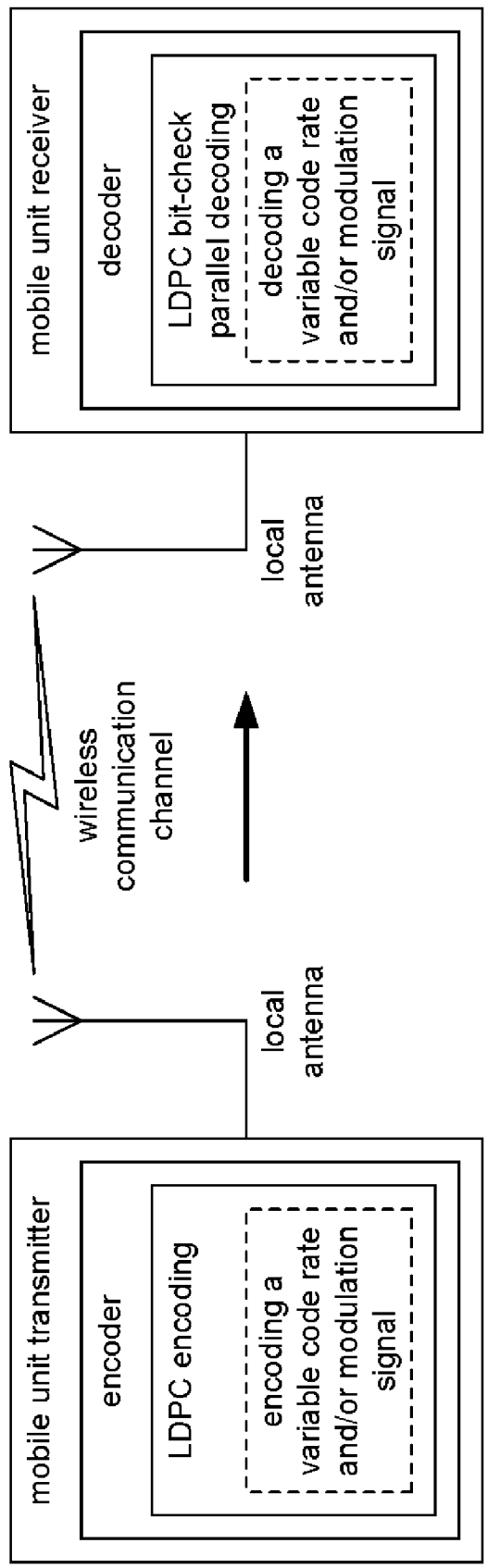
FIG. 7 is a system diagram illustrating an embodiment of a uni-directional point-to-point radio communication system that is built according to the invention.

FIG. 7 is a system diagram illustrating an embodiment of a uni-directional point-to-point radio communication system, built according to the invention, where the communication goes from a mobile unit transmitter to a mobile unit receiver via the wireless communication channel.

A mobile unit transmitter includes a local antenna communicatively coupled thereto. The mobile unit transmitter, using its local antenna, transmits a signal to a local antenna of a mobile unit receiver via a wireless communication channel.

The mobile unit transmitter is operable to encode information (using an encoder) in a manner in accordance with the functionality and/or processing of at least some of the various aspects of the invention to assist in generating a signal that is to be launched into the communication channel coupling the mobile unit transmitter and the mobile unit receiver. The mobile unit receiver is operable to decode a signal (using a decoder) received from the communication channel in a manner in accordance with the functionality and/or processing of at least some of the various aspects of the invention. This diagram shows yet another embodiment where one or more of the various aspects of the invention may be found.

Figure 8:
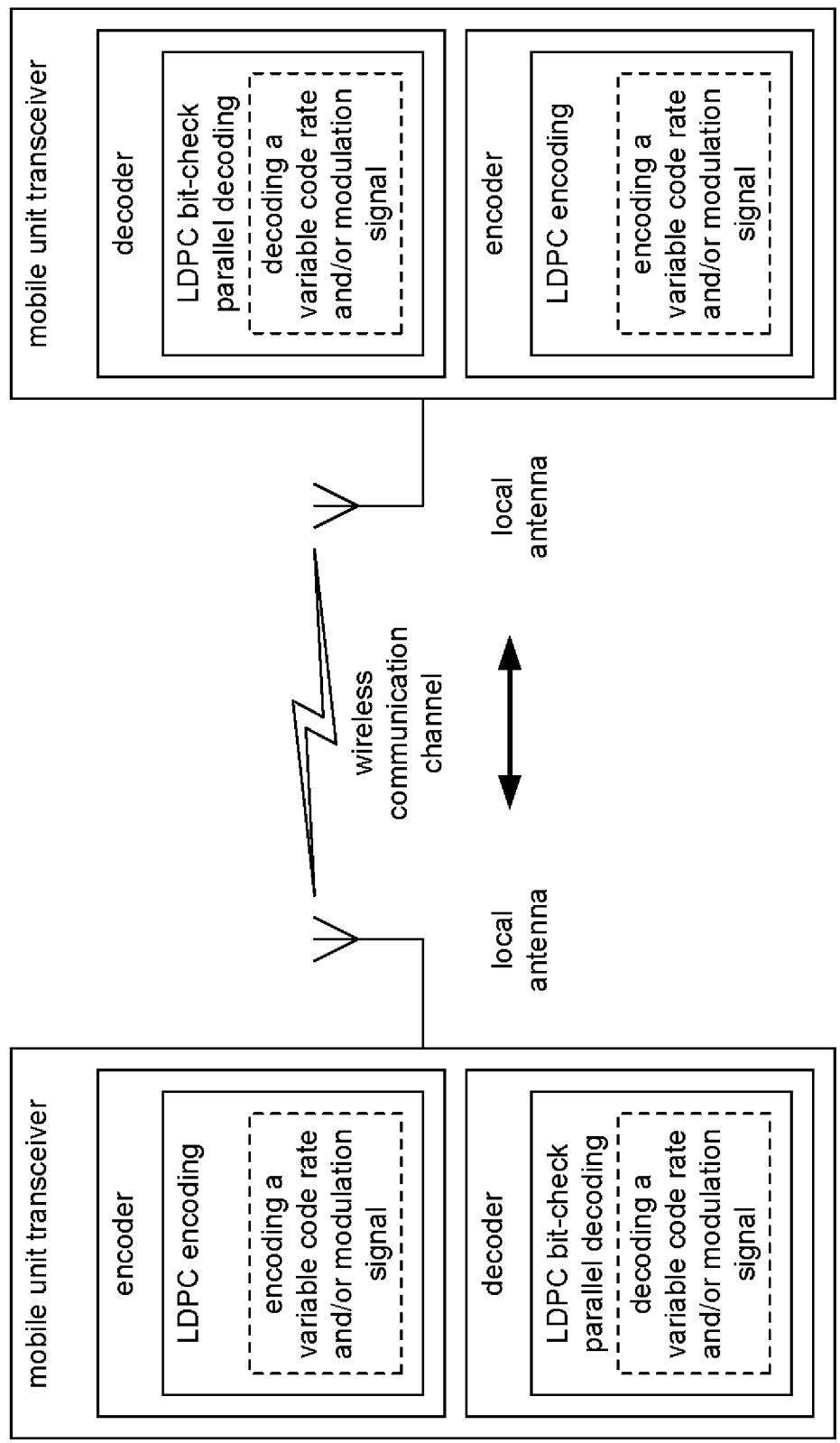
FIG. 8 is a system diagram illustrating an embodiment of a bi-directional point-to-point radio communication system that is built according to the invention.

FIG. 8 is a system diagram illustrating an embodiment of a bi-directional point-to-point radio communication system that is built according to the invention. A first mobile unit transceiver is communicatively coupled to a first local antenna. The first mobile unit transceiver, using the first local antenna (the first mobile unit transceiver's local antenna), transmits a signal to a second local antenna of a second mobile unit transceiver via a wireless communication channel. The second mobile unit transceiver is communicatively coupled to the second local antenna (the second mobile unit transceiver's local antenna). The second local antenna is able to receive transmissions from the first local antenna that have been communicated via the communication channel. The reverse communication operation may also be performed using the first and second mobile unit transceivers.

Each of the mobile unit transceivers is operable to encode information (using its corresponding encoder) that is to be transmitted the other mobile unit transceiver. Each mobile unit transceiver is operable to decode the transmitted signal (using its corresponding decoder) that it receives. Each of the mobile unit transceivers includes an encoder and a decoder.

As within other embodiments that employ an encoder and a decoder, the encoder of either of the mobile unit transceivers may be implemented to encode information (using its corresponding encoder) in a manner in accordance with the functionality and/or processing of at least some of the various aspects of the invention to assist in generating a signal that is to be launched into the communication channel coupling the mobile unit transceivers. The decoder of either of the mobile unit transceivers may be implemented to decode the transmitted signal (using its corresponding decoder) in a manner in accordance with the functionality and/or processing of at least some of the various aspects of the invention. This diagram shows yet another embodiment where one or more of the various aspects of the invention may be found.

Figure 9:
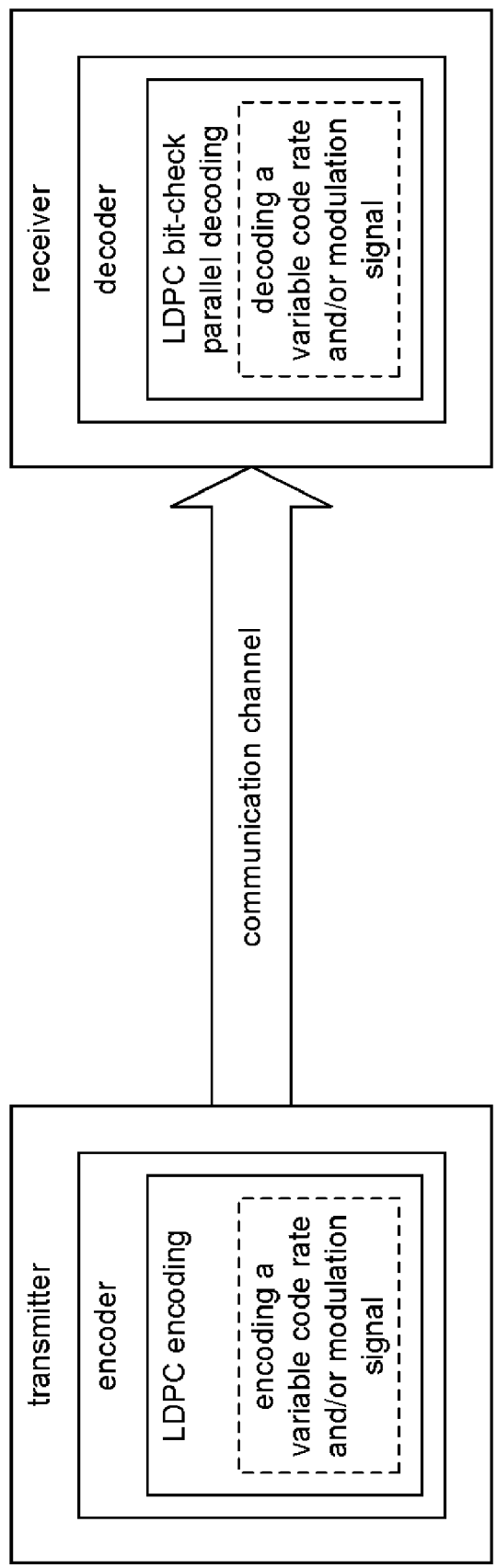
FIG. 9 is a system diagram illustrating an embodiment of a uni-directional communication system that is built according to the invention.

FIG. 9 is a system diagram illustrating an embodiment of a uni-directional communication system that is built according to the invention. A transmitter communicates to a receiver via a unidirectional communication channel. The uni-directional communication channel may be a wireline (or wired) communication channel or a wireless communication channel without departing from the scope and spirit of the invention. The wired media by which the uni-directional communication channel may be implemented are varied, including coaxial cable, fiber-optic cabling, and copper cabling, among other types of "wiring." Similarly, the wireless manners in which the uni-directional communication channel may be implemented are varied, including satellite communication, cellular communication, microwave communication, and radio communication, among other types of wireless communication.

The transmitter is operable to encode information (using an encoder) in a manner in accordance with the functionality and/or processing of at least some of the various aspects of the invention to assist in generating a signal that is to be launched into the communication channel coupling the transmitter and the receiver. The receiver is operable to decode a signal (using a decoder) received from the communication channel in a manner in accordance with the functionality and/or processing of at least some of the various aspects of the invention. This diagram shows yet another embodiment where one or more of the various aspects of the invention may be found.

Figure 10:
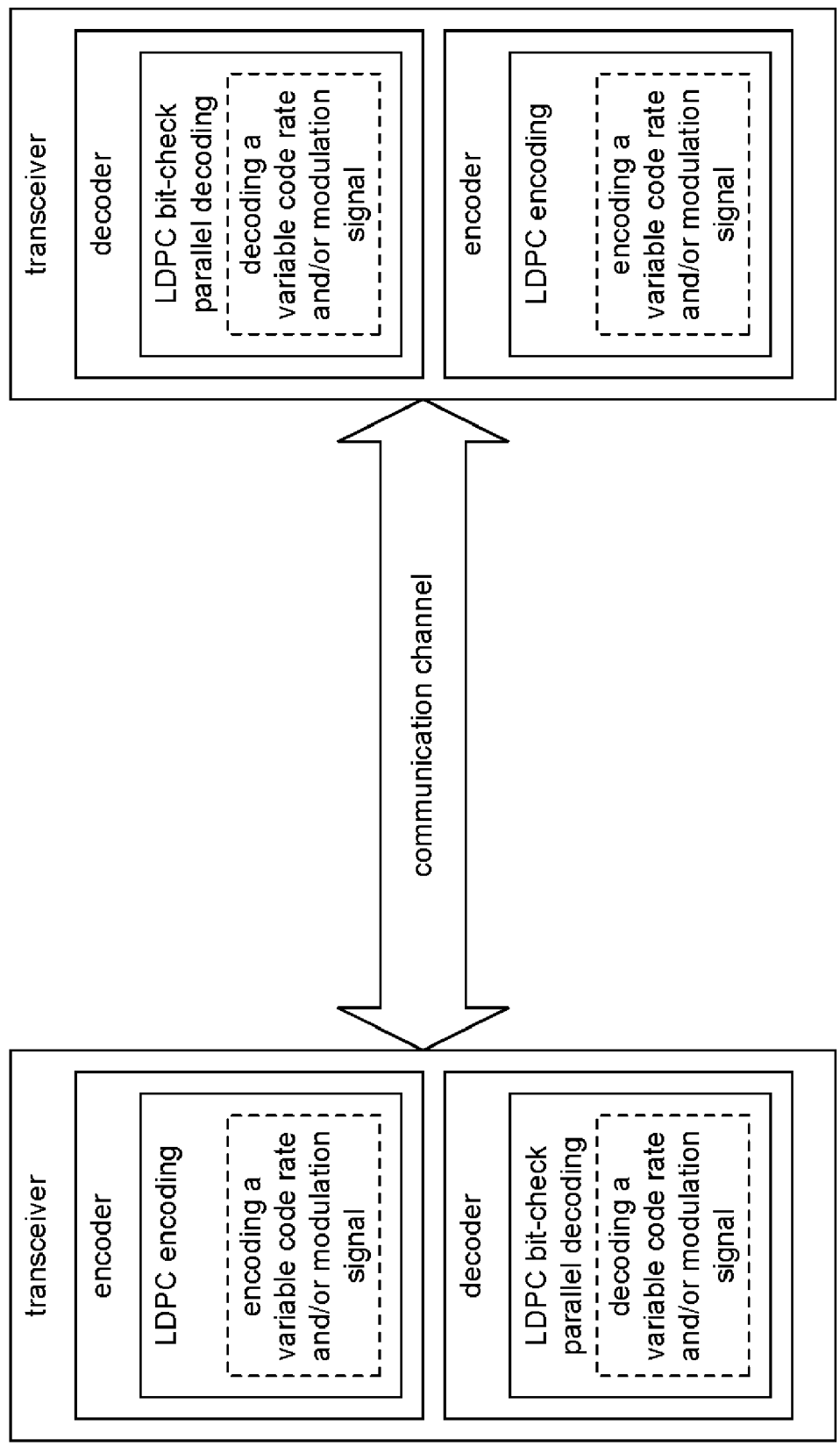
FIG. 10 is a system diagram illustrating an embodiment of a bi-directional communication system that is built according to the invention.

FIG. 10 is a system diagram illustrating an embodiment of a bi-directional communication system that is built according to the invention. A first transceiver is communicatively coupled to a second transceiver via a bi-directional communication channel. The bi-directional communication channel may be a wireline (or wired) communication channel or a wireless communication channel without departing from the scope and spirit of the invention. The wired media by which the bi-directional communication channel may be implemented are varied, including coaxial cable, fiber-optic cabling, and copper cabling, among other types of "wiring." Similarly, the wireless manners in which the bi-directional communication channel may be implemented are varied, including satellite communication, cellular communication, microwave communication, and radio communication, among other types of wireless communication.

Each of the transceivers is operable to encode information (using its corresponding encoder) that is to be transmitted the other transceiver. Each transceiver is operable to decode the transmitted signal (using its corresponding decoder) that it receives. Each of the transceivers includes an encoder and a decoder.

As within other embodiments that employ an encoder and a decoder, the encoder of either of the transceivers may be implemented to encode information (using its corresponding encoder) in a manner in accordance with the functionality and/or processing of at least some of the various aspects of the invention to assist in generating a signal that is to be launched into the communication channel coupling the transceivers. The decoder of either of the transceivers may be implemented to decode the transmitted signal (using its corresponding decoder) in a manner in accordance with the functionality and/or processing of at least some of the various aspects of the invention. This diagram shows yet another embodiment where one or more of the various aspects of the invention may be found.

Figure 11:
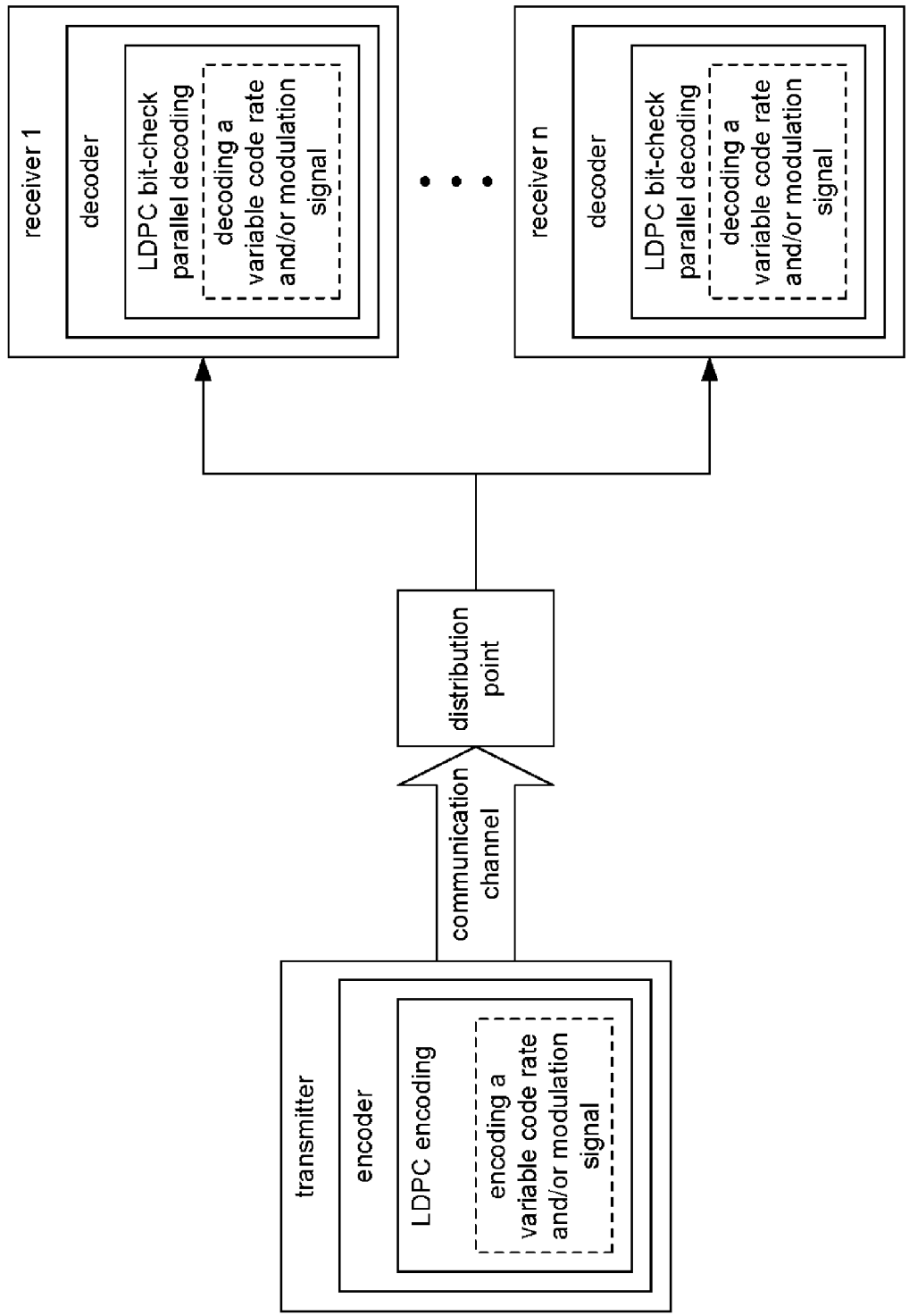
FIG. 11 is a system diagram illustrating an embodiment of a one to many communication system that is built according to the invention.

FIG. 11 is a system diagram illustrating an embodiment of a one to many communication system that is built according to the invention. A transmitter is able to communicate, via broadcast in certain embodiments, with a number of receivers, shown as receivers 1, . . . , n via a uni-directional communication channel. The uni-directional communication channel may be a wireline (or wired) communication channel or a wireless communication channel without departing from the scope and spirit of the invention. The wired media by which the communication channel may be implemented are varied, including coaxial cable, fiber-optic cabling, and copper cabling, among other types of "wiring." Similarly, the wireless manners in which the communication channel may be implemented are varied, including satellite communication, cellular communication, microwave communication, and radio communication, among other types of wireless communication.

A distribution point is employed within the one to many communication system to provide the appropriate communication to the receivers 1, . . . , and n. In certain embodiments, the receivers 1, . . . , and n each receive the same communication and individually discern which portion of the total communication is intended for them.

The transmitter is operable to encode information (using an encoder) in a manner in accordance with the functionality and/or processing of at least some of the various aspects of the invention to assist in generating a signal that is to be launched into the communication channel coupling the transmitter and the receivers 1, . . . , and n. Each of the receivers 1, . . . , and n is operable to decode a signal (using a corresponding decoder) received from the communication channel in a manner in accordance with the functionality and/or processing of at least some of the various aspects of the invention. This diagram shows yet another embodiment where one or more of the various aspects of the invention may be found.

Figure 12:
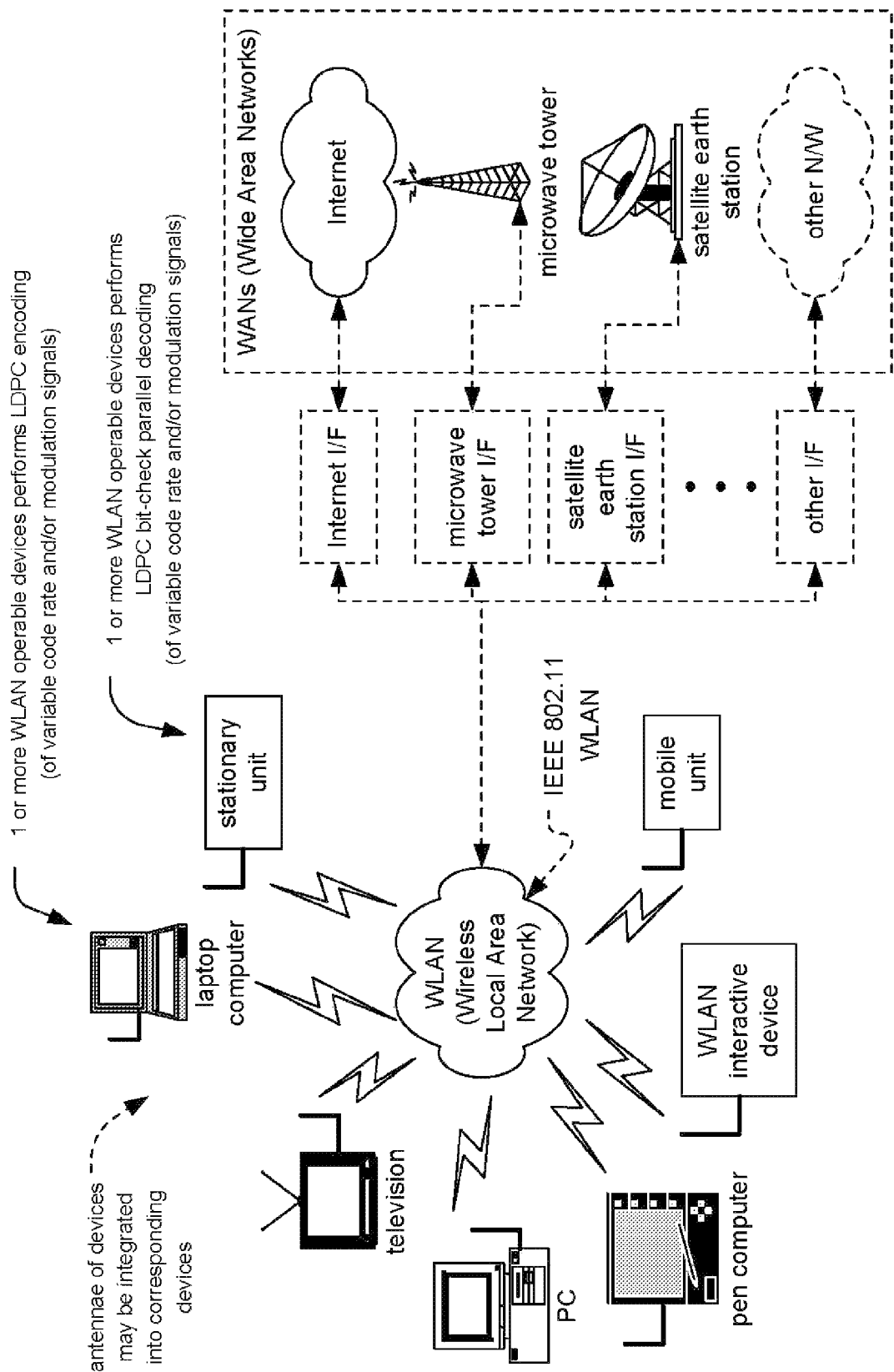
FIG. 12 is a diagram illustrating an embodiment of a WLAN (Wireless Local Area Network) that may be implemented according to the invention.

FIG. 12 is a diagram illustrating an embodiment of a WLAN (Wireless Local Area Network) communication system that may be implemented according to the invention. The WLAN communication system may be implemented to include a number of devices that are all operable to communicate with one another via the WLAN. For example, the various devices that each include the functionality to interface with the WLAN may include any 1 or more of a laptop computer, a television, a PC (Personal Computer), a pen computer (that may be viewed as being a PDA (Personal Digital Assistant) in some instances, a personal electronic planner, or similar device), a mobile unit (that may be viewed as being a telephone, a pager, or some other mobile WLAN operable device), and/or a stationary unit (that may be viewed as a device that typically resides in a single location within the WLAN). The antennae of any of the various WLAN interactive devices may be integrated into the corresponding devices without departing from the scope and spirit of the invention as well.

This illustrated group of devices that may interact with the WLAN is not intended to be an exhaustive list of devices that may interact with a WLAN, and a generic device shown as a WLAN interactive device represents any communication device that includes the functionality in order to interactive with the WLAN itself and/or the other devices that are associated with the WLAN. Any one of these devices that associate with the WLAN may be viewed generically as being a WLAN interactive device without departing from the scope and spirit of the invention. Each of the devices and the WLAN interactive device may be viewed as being located at nodes of the WLAN.

It is also noted that the WLAN itself may also include functionality to allow interfacing with other networks as well. These external networks may generically be referred to as WANs (Wide Area Networks). For example, the WLAN may include an Internet I/F (interface) that allows for interfacing to the Internet itself. This Internet I/F may be viewed as being a base station device for the WLAN that allows any one of the WLAN interactive devices to access the Internet.

It is also noted that the WLAN may also include functionality to allow interfacing with other networks (e.g., other WANs) besides simply the Internet. For example, the WLAN may include a microwave tower I/F that allows for interfacing to a microwave tower thereby allowing communication with one or more microwave networks. Similar to the Internet I/F described above, the microwave tower I/F may be viewed as being a base station device for the WLAN that allows any one of the WLAN interactive devices to access the one or more microwave networks via the microwave tower.

Moreover, the WLAN may include a satellite earth station I/F that allows for interfacing to a satellite earth station thereby allowing communication with one or more satellite networks. The satellite earth station I/F may be viewed as being a base station device for the WLAN that allows any one of the WLAN interactive devices to access the one or more satellite networks via the satellite earth station I/F.

This finite listing of various network types that may interface to the WLAN is also not intended to be exhaustive. For example, any other network may communicatively couple to the WLAN via an appropriate I/F that includes the functionality for any one of the WLAN interactive devices to access the other network.

Any of the various WLAN interactive devices described within this embodiment may include an encoder and a decoder to allow bi-directional communication with the other WLAN interactive device and/or the WANs. Again, as within other embodiments that includes bi-directional communication devices having an encoder and a decoder, the encoder of any of these various WLAN interactive devices may be implemented to encode information (using its corresponding encoder) in a manner in accordance with the functionality and/or processing of at least some of the various aspects of the invention to assist in generating a signal that is to be launched into the communication channel that couples to another WLAN interactive device. The decoder of any of the various WLAN interactive devices may be implemented to decode the transmitted signal (using its corresponding decoder) in a manner in accordance with the functionality and/or processing of at least some of the various aspects of the invention. This diagram shows yet another embodiment where one or more of the various aspects of the invention may be found.

In general, any one of the WLAN interactive devices may be characterized as being an IEEE (Institute of Electrical & Electronics Engineers) 802.11 operable device. For example, such an 802.11 operable device may be an 802.11a operable device, an 802.11b operable device, or an 802.11g operable device. Sometimes, an IEEE 802.11 operable device is operable to communicate according to more than one of the standards (e.g., both 802.11a and 802.11g in one instance). The IEEE 802.11g specification extends the rates for packet transmission in the 2.4 GHz (Giga-Hertz) frequency band. This is achieved by allowing packets, also known as frames, of two distinct types to coexist in this band. Frames utilizing DSSS/CCK (Direct Sequence Spread Spectrum with Complementary Code Keying) have been specified for transmission in the 2.4 GHz band at rates up to 11 Mbps (Mega-bits per second) as part of the 802.11b standard. The 802.11a standard uses a different frame format with OFDM (Orthogonal Frequency Division Multiplexing) to transmit at rates up to 54 Mbps with carrier frequencies in the 5 GHz range. The 802.11g specification allows for such OFDM frames to coexist with DSSS/CCK frames at 2.4 GHz.

Figure 13:
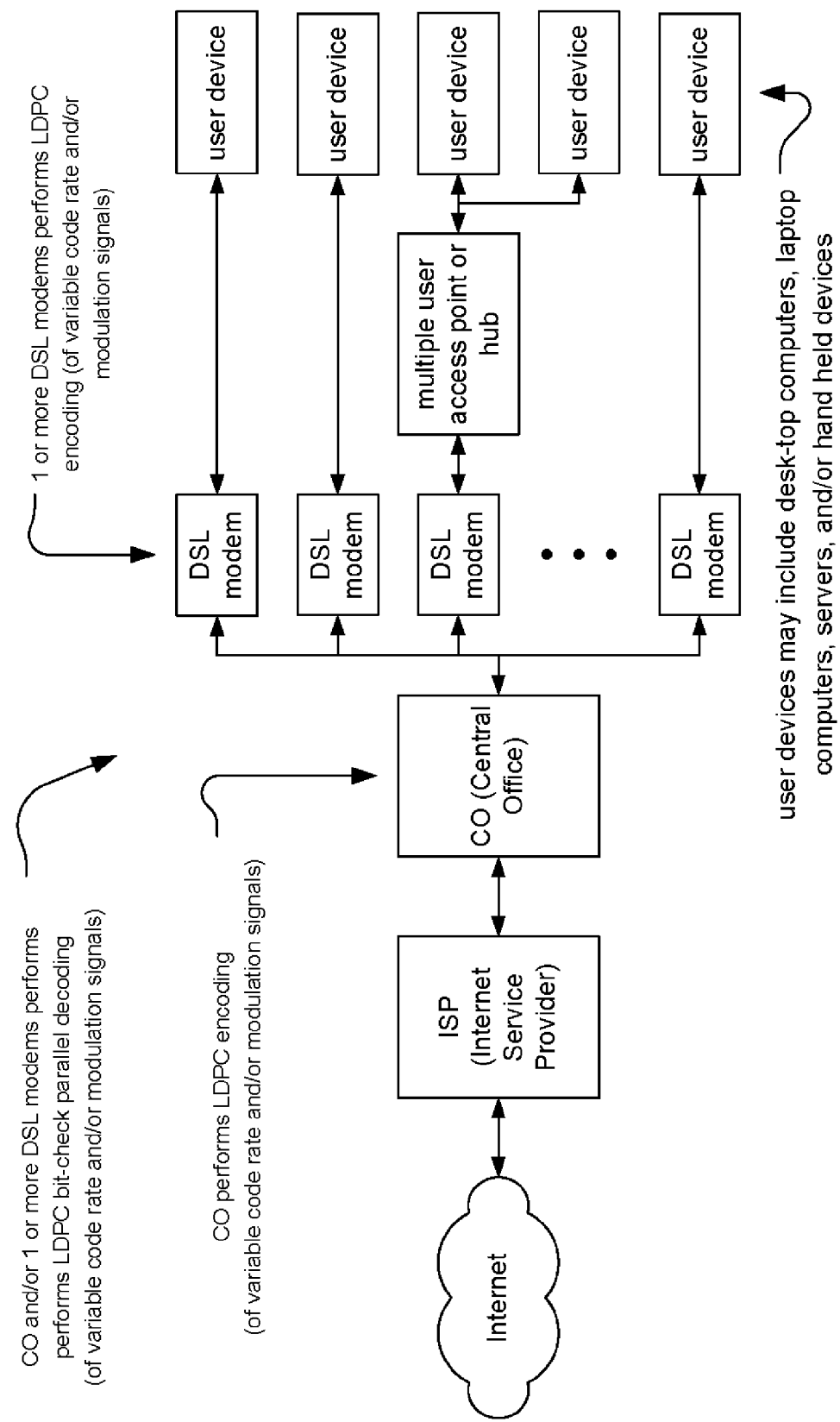
FIG. 13 is a diagram illustrating an embodiment of a DSL (Digital Subscriber Line) communication system that may be implemented according to the invention.

FIG. 13 is a diagram illustrating an embodiment of a DSL (Digital Subscriber Line) communication system that may be implemented according to the invention. The DSL communication system includes an interfacing to the Internet (or some other WAN). In this diagram, the Internet itself is shown, but other WANs may also be employed without departing from the scope and spirit of the invention. An ISP (Internet Service Provider) is operable to communicate data to and from the Internet. The ISP communicatively couples to a CO (Central Office) that is typically operated by a telephone services company. The CO may also allow for the providing of telephone services to one or more subscribers. However, the CO may also be implemented to allow interfacing of Internet traffic to and from one or more users (whose interactive devices are shown as user devices). These user devices may be any device within a wide variety of devices including desk-top computers, laptop computers, servers, and/or hand held devices without departing from the scope and spirit of the invention. Any of these user devices may be wired or wireless type devices as well. Each of the user devices is operably coupled to the CO via a DSL modem. The DSL modem may also be communicatively coupled to a multiple user access point or hub to allow more than one user device to access the Internet.

The CO and the various DSL modems may also be implemented to include an encoder and a decoder to allow bi-directional communication therein. For example, the CO is operable to encode and decode data when communicating to and from the various DSL modems and the ISP. Similarly, each of the various DSL modems is operable to encode and decode data when communicating to and from the CO and its respective one or more user devices.

As within other embodiments that employ an encoder and a decoder, the encoder of any of the CO and the various DSL modems may be implemented to encode information (using its corresponding encoder) in a manner in accordance with the functionality and/or processing of at least some of the various aspects of the invention to assist in generating a signal that is to be launched into the communication channel coupling the CO and the various DSL modems. The decoder of any of the CO and the various DSL modems may be implemented to decode the transmitted signal (using its corresponding decoder) in a manner in accordance with the functionality and/or processing of at least some of the various aspects of the invention. This diagram shows yet another embodiment where one or more of the various aspects of the invention may be found.

Figure 14:
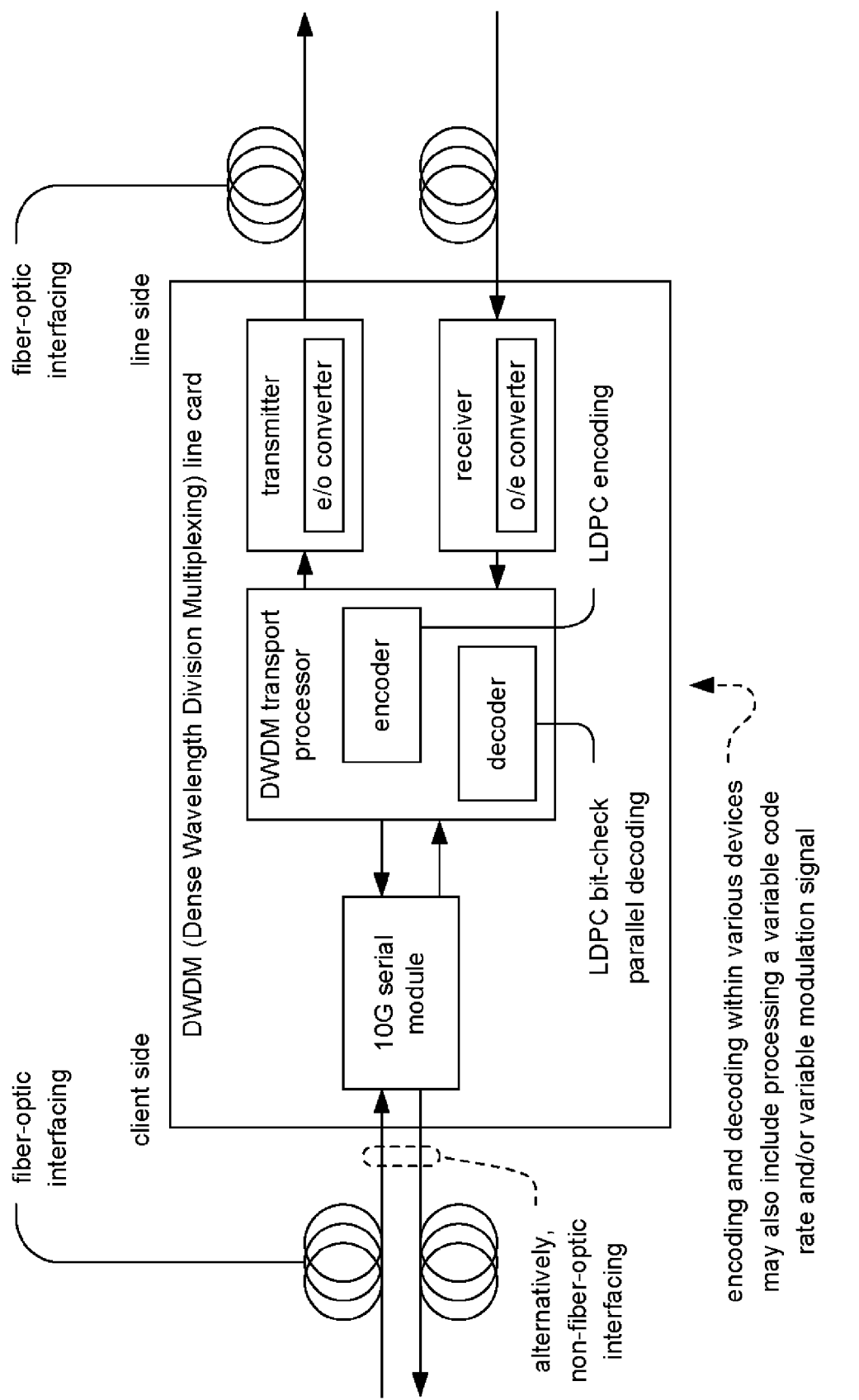
FIG. 14 is a system diagram illustrating an embodiment of a fiber-optic communication system that is built according to the invention.

FIG. 14 is a system diagram illustrating an embodiment of a fiber-optic communication system that is built according to the invention. The fiber-optic communication system includes a DWDM (Dense Wavelength Division Multiplexing, within the context of fiber optic communications) line card that is interposed between a line side and a client side. DWDM is a technology that has gained increasing interest recently. From both technical and economic perspectives, the ability to provide potentially unlimited transmission capacity is the most obvious advantage of DWDM technology. The current investment already made within fiber-optic infrastructure can not only be preserved when using DWDM, but it may even be optimized by a factor of at least 32. As demands change, more capacity can be added, either by simple equipment upgrades or by increasing the number of wavelengths (lambdas) on the fiber-optic cabling itself, without expensive upgrades. Capacity can be obtained for the cost of the equipment, and existing fiber plant investment is retained. From the bandwidth perspective, some of the most compelling technical advantages of DWDM can be summarized as follows:

1. The transparency of DWDM: Because DWDM is a PHY (physical layer) architecture, it can transparently support both TDM (Time Division Multiplexing) and data formats such as ATM (Asynchronous Transfer Mode), Gigabit Ethernet, ESCON (Enterprise System CONnection), and Fibre Channel with open interfaces over a common physical layer.

2. The scalability of DWDM: DWDM can leverage the abundance of dark fiber in many metropolitan area and enterprise networks to quickly meet demand for capacity on point-to-point links and on spans of existing SONET/SDH (Synchronous Optical NETwork)/(Synchronous Digital Hierarchy) rings.

3. The dynamic provisioning capabilities of DWDM: the fast, simple, and dynamic provisioning of network connections give providers the ability to provide high-bandwidth services in days rather than months.

Fiber-optic interfacing is employed at each of the client and line sides of the DWDM line card. The DWDM line card includes a transport processor that includes functionality to support DWDM long haul transport, DWDM metro transport, next-generation SONET/SDH multiplexers, digital cross-connects, and fiber-optic terminators and test equipment. On the line side, the DWDM line card includes a transmitter, that is operable to perform electrical to optical conversion for interfacing to an optical medium, and a receiver, that is operable to perform optical to electrical conversion for interfacing from the optical medium. On the client side, the DWDM line card includes a 10 G serial module that is operable to communicate with any other devices on the client side of the fiber-optic communication system using a fiber-optic interface. Alternatively, the interface may be implemented using non-fiber-optic media, including copper cabling and/or some other type of interface medium.

The DWDM transport processor of the DWDM line card includes a decoder that is used to decode received signals from either one or both of the line and client sides and an encoder that is used to encode signals to be transmitted to either one or both of the line and client sides.

As within other embodiments that employ an encoder and a decoder, the encoder is operable to encode information in a manner in accordance with the functionality and/or processing of at least some of the various aspects of the invention to assist in generating a signal that is to be launched into the communication channel to which the DWDM line card is coupled. The decoder is operable to decode a signal received from the communication channel in a manner in accordance with the functionality and/or processing of at least some of the various aspects of the invention. This diagram shows yet another embodiment where one or more of the various aspects of the invention may be found.

Figure 15:
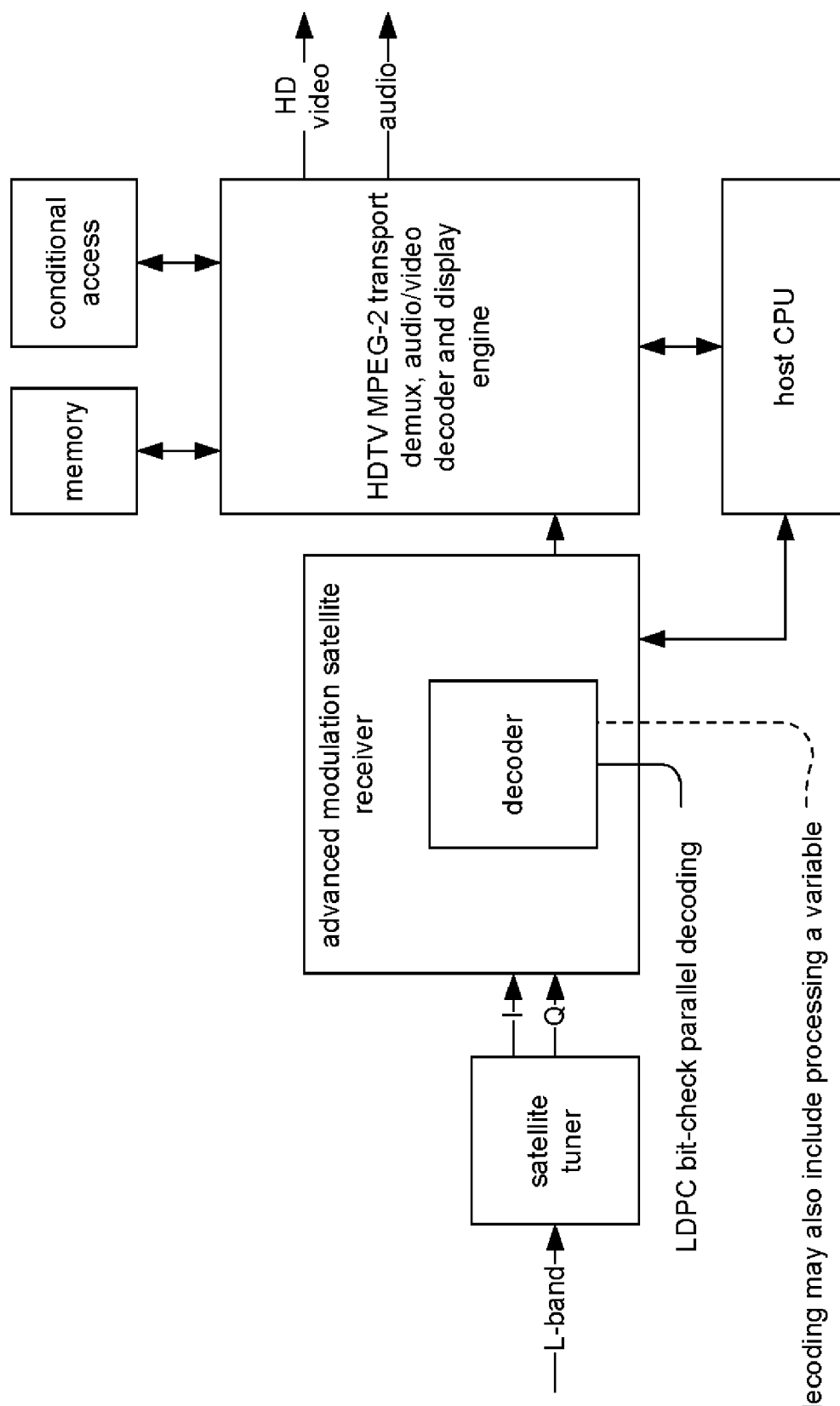
FIG. 15 is a system diagram illustrating an embodiment of a satellite receiver STB (Set Top Box) system that is built according to the invention.

FIG. 15 is a system diagram illustrating an embodiment of a satellite receiver STB (Set Top Box) system that is built according to the invention. The satellite receiver STB system includes an advanced modulation satellite receiver that is implemented in an all digital architecture. Moreover, the advanced modulation satellite receiver may be implemented within a single integrated circuit in some embodiments. The satellite receiver STB system includes a satellite tuner that receives a signal via the L-band (e.g., within the frequency range between 390-1550 MHz (Mega-Hertz) in the ultrahigh radio frequency range). The satellite tuner extracts I, Q (In-phase, Quadrature) components from a signal received from the L-band and provides them to the advanced modulation satellite receiver. The advanced modulation satellite receiver includes a decoder.

As within other embodiments that employ a decoder, the decoder is operable to decode a signal received from a communication channel to which the advanced modulation satellite receiver is coupled in a manner in accordance with the functionality and/or processing of at least some of the various aspects of the invention. This diagram shows yet another embodiment where one or more of the various aspects of the invention may be found.

The advanced modulation satellite receiver may be implemented to communicatively couple to an HDTV MPEG-2 (Motion Picture Expert Group, level 2) transport de-mux, audio/video decoder and display engine. The advanced modulation satellite receiver and the HDTV MPEG-2 transport de-mux, audio/video decoder and display engine communicatively couple to a host CPU (Central Processing Unit). The HDTV MPEG-2 transport de-mux, audio/video decoder and display engine also communicatively couples to a memory module and a conditional access functional block. The HDTV MPEG-2 transport de-mux, audio/video decoder and display engine provides HD (High Definition) video and audio output that may be provided to an HDTV display.

The advanced modulation satellite receiver may be implemented as a single-chip digital satellite receiver supporting the decoder that operates in a manner in accordance with the functionality and/or processing of at least some of the various aspects of the invention. The advanced modulation satellite receiver is operable to receive communication provided to it from a transmitter device that includes an encoder as well.

Figure 16:
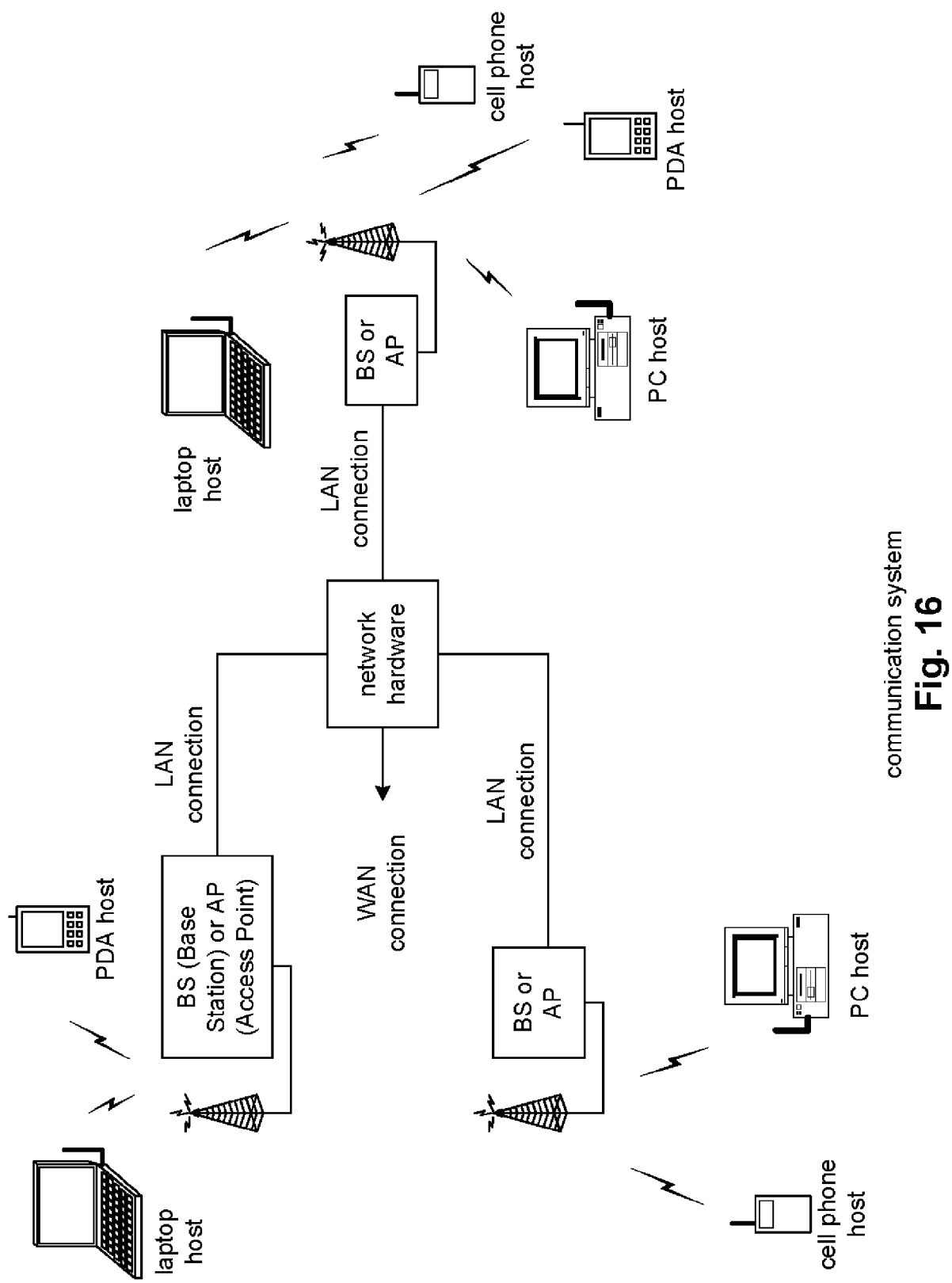
FIG. 16 is a schematic block diagram illustrating a communication system that includes a plurality of base stations and/or access points, a plurality of wireless communication devices and a network hardware component in accordance with certain aspects of the invention.

FIG. 16 is a schematic block diagram illustrating a communication system that includes a plurality of base stations and/or access points, a plurality of wireless communication devices and a network hardware component in accordance with certain aspects of the invention. The wireless communication devices may be laptop host computers, PDA (Personal Digital Assistant) hosts, PC (Personal Computer) hosts and/or cellular telephone hosts. The details of any one of these wireless communication devices is described in greater detail with reference to FIG. 17 below.

The BSs (Base Stations) or APs (Access Points) are operably coupled to the network hardware via the respective LAN (Local Area Network) connections. The network hardware, which may be a router, switch, bridge, modem, system controller, et cetera, provides a WAN (Wide Area Network) connection for the communication system. Each of the BSs or APs has an associated antenna or antenna array to communicate with the wireless communication devices in its area. Typically, the wireless communication devices register with a particular BS or AP to receive services from the communication system. For direct connections (i.e., point-to-point communications), wireless communication devices communicate directly via an allocated channel.

Typically, BSs are used for cellular telephone systems and like-type systems, while APs are used for in-home or in-building wireless networks. Regardless of the particular type of communication system, each wireless communication device includes a built-in radio and/or is coupled to a radio. The radio includes a highly linear amplifier and/or programmable multi-stage amplifier to enhance performance, reduce costs, reduce size, and/or enhance broadband applications.

Figure 17:
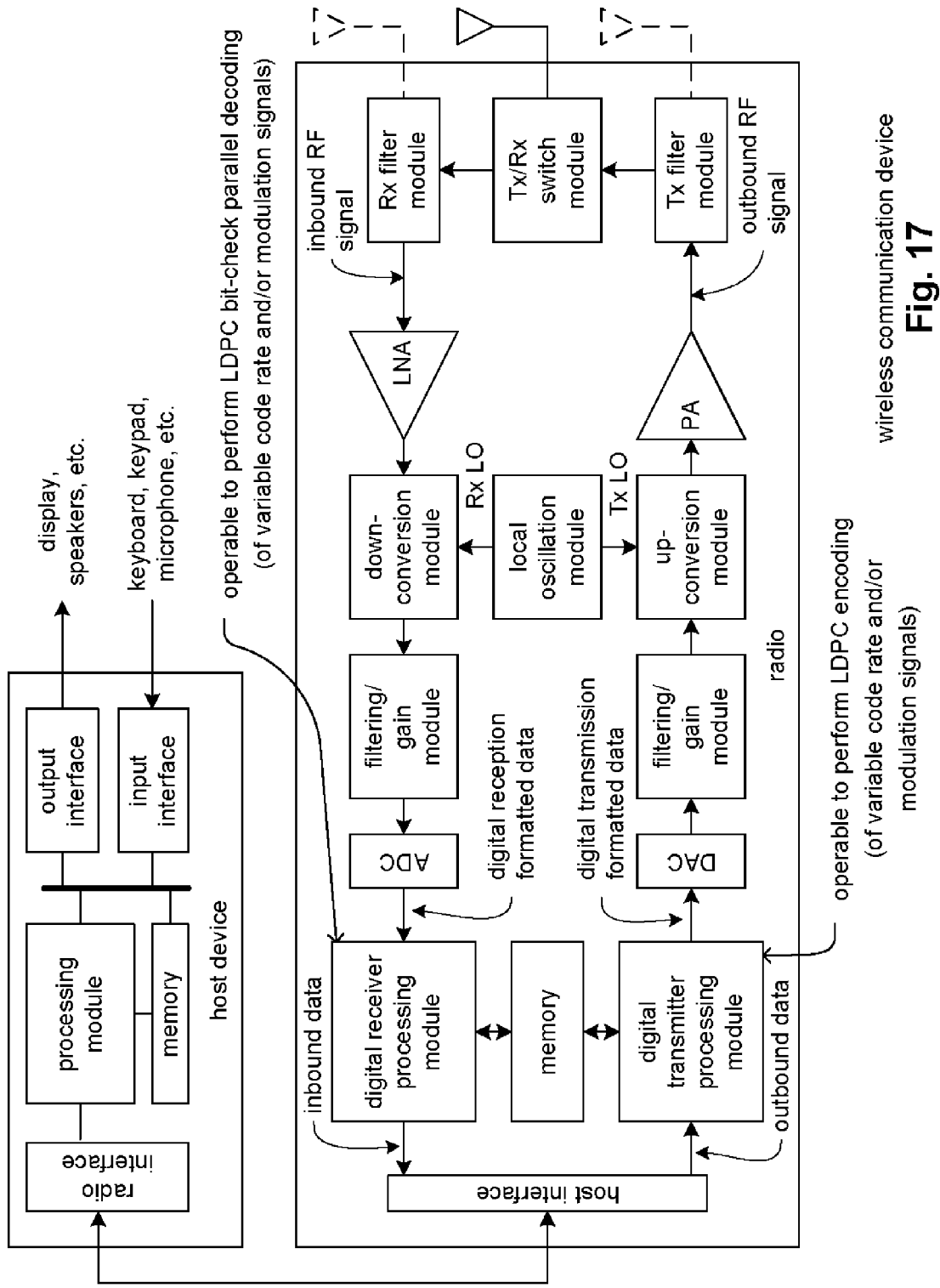
FIG. 17 is a schematic block diagram illustrating a wireless communication device that includes the host device and an associated radio in accordance with certain aspects of the invention.

FIG. 17 is a schematic block diagram illustrating a wireless communication device that includes the host device and an associated radio in accordance with certain aspects of the invention. For cellular telephone hosts, the radio is a built-in component. For PDA (Personal Digital Assistant) hosts, laptop hosts, and/or personal computer hosts, the radio may be built-in or an externally coupled component.

As illustrated, the host device includes a processing module, memory, radio interface, input interface and output interface. The processing module and memory execute the corresponding instructions that are typically done by the host device. For example, for a cellular telephone host device, the processing module performs the corresponding communication functions in accordance with a particular cellular telephone standard or protocol.

The radio interface allows data to be received from and sent to the radio. For data received from the radio (e.g., inbound data), the radio interface provides the data to the processing module for further processing and/or routing to the output interface. The output interface provides connectivity to an output display device such as a display, monitor, speakers, et cetera, such that the received data may be displayed or appropriately used. The radio interface also provides data from the processing module to the radio. The processing module may receive the outbound data from an input device such as a keyboard, keypad, microphone, et cetera, via the input interface or generate the data itself. For data received via the input interface, the processing module may perform a corresponding host function on the data and/or route it to the radio via the radio interface.

The radio includes a host interface, a digital receiver processing module, an ADC (Analog to Digital Converter), a filtering gain module, an IF (Intermediate Frequency) mixing down conversion stage, a receiver filter, an LNA (Low Noise Amplifier), a transmitter/receiver switch, a local oscillation module, memory, a digital transmitter processing module, a DAC (Digital to Analog Converter), a filtering gain module, an IF mixing up conversion stage, a PA (Power Amplifier), a transmitter filter module, and an antenna. The antenna may be a single antenna that is shared by the transmit and the receive paths as regulated by the Tx/Rx (Transmit/Receive) switch, or may include separate antennas for the transmit path and receive path. The antenna implementation will depend on the particular standard to which the wireless communication device is compliant.

The digital receiver processing module and the digital transmitter processing module, in combination with operational instructions stored in memory, execute digital receiver functions and digital transmitter functions, respectively. The digital receiver functions include, but are not limited to, digital IF (Intermediate Frequency) to baseband conversion, demodulation, constellation de-mapping, decoding, and/or descrambling. The digital transmitter functions include, but are not limited to, scrambling, encoding, constellation mapping, modulation, and/or digital baseband to IF conversion.

Similarly to other embodiments that employ an encoder and a decoder (or perform encoding and decoding), the encoding operations that may be performed by the digital transmitter processing module may be implemented in a manner in accordance with the functionality and/or processing of at least some of the various aspects of the invention to assist in generating a signal that is to be launched into the communication channel coupling to the wireless communication device. Analogously, the decoding operations of the operations that may be performed by the digital transmitter processing module may be implemented in a manner in accordance with the functionality and/or processing of at least some of the various aspects of the invention. For example, the encoding operations performed by the digital transmitter processing module may be performed using LDPC coding as described and presented herein, and the decoding operations that may be performed by the digital receiver processing module may be performed using the simultaneous and parallel approach to updating of edge messages.

The digital receiver and transmitter processing modules may be implemented using a shared processing device, individual processing devices, or a plurality of processing devices. Such a processing device may be a microprocessor, micro-controller, DSP (Digital Signal Processor), microcomputer, CPU (Central Processing Unit), FPGA (Field Programmable Gate Array), programmable logic device, state machine, logic circuitry, analog circuitry, digital circuitry, and/or any device that manipulates signals (analog and/or digital) based on operational instructions. The memory may be a single memory device or a plurality of memory devices. Such a memory device may be a ROM (Read Only Memory), RAM (Random Access Memory), volatile memory, non-volatile memory, static memory, dynamic memory, flash memory, and/or any device that stores digital information. It is noted that when either of the digital receiver processing module or the digital transmitter processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio receives outbound data from the host device via the host interface. The host interface routes the outbound data to the digital transmitter processing module, which processes the outbound data in accordance with a particular wireless communication standard (e.g., IEEE 802.11, Bluetooth®, et cetera) to produce digital transmission formatted data. The digital transmission formatted data is a digital baseband signal or a digital low IF signal, where the low IF typically will be in the frequency range of one hundred kHz (kilo-Hertz) to a few MHz (Mega-Hertz).

The DAC converts the digital transmission formatted data from the digital domain to the analog domain. The filtering gain module filters and/or adjusts the gain of the analog signal prior to providing it to the IF mixing stage. The IF mixing stage converts the analog baseband or low IF signal into an RF signal based on a transmitter local oscillation provided by local oscillation module. The PA amplifies the RF signal to produce outbound RF signal, which is filtered by the transmitter filter module. The antenna transmits the outbound RF signal to a targeted device such as a base station, an access point and/or another wireless communication device.

The radio also receives an inbound RF signal via the antenna, which was transmitted by a BS, an AP, or another wireless communication device. The antenna provides the inbound RF signal to the receiver filter module via the Tx/Rx switch, where the Rx filter bandpass filters the inbound RF signal. The Rx filter provides the filtered RF signal to the LNA, which amplifies the signal to produce an amplified inbound RF signal. The LNA provides the amplified inbound RF signal to the IF mixing module, which directly converts the amplified inbound RF signal into an inbound low IF signal or baseband signal based on a receiver local oscillation provided by local oscillation module. The down conversion module provides the inbound low IF signal or baseband signal to the filtering gain module. The filtering gain module filters and/or gains the inbound low IF signal or the inbound baseband signal to produce a filtered inbound signal.

The ADC converts the filtered inbound signal from the analog domain to the digital domain to produce digital reception formatted data. In other words, the ADC samples the incoming continuous time signal thereby generating a discrete time signal (e.g., the digital reception formatted data). The digital receiver processing module decodes, descrambles, demaps, and/or demodulates the digital reception formatted data to recapture inbound data in accordance with the particular wireless communication standard being implemented by radio. The host interface provides the recaptured inbound data to the host device via the radio interface.

As one of average skill in the art will appreciate, the wireless communication device of FIG. 17 may be implemented using one or more integrated circuits. For example, the host device may be implemented on one integrated circuit, the digital receiver processing module, the digital transmitter processing module and memory may be implemented on a second integrated circuit, and the remaining components of the radio, less the antenna, may be implemented on a third integrated circuit. As an alternate example, the radio may be implemented on a single integrated circuit. As yet another example, the processing module of the host device and the digital receiver and transmitter processing modules may be a common processing device implemented on a single integrated circuit. Further, the memories of the host device and the radio may also be implemented on a single integrated circuit and/or on the same integrated circuit as the common processing modules of processing module of the host device and the digital receiver and transmitter processing module of the radio.

Figure 18:
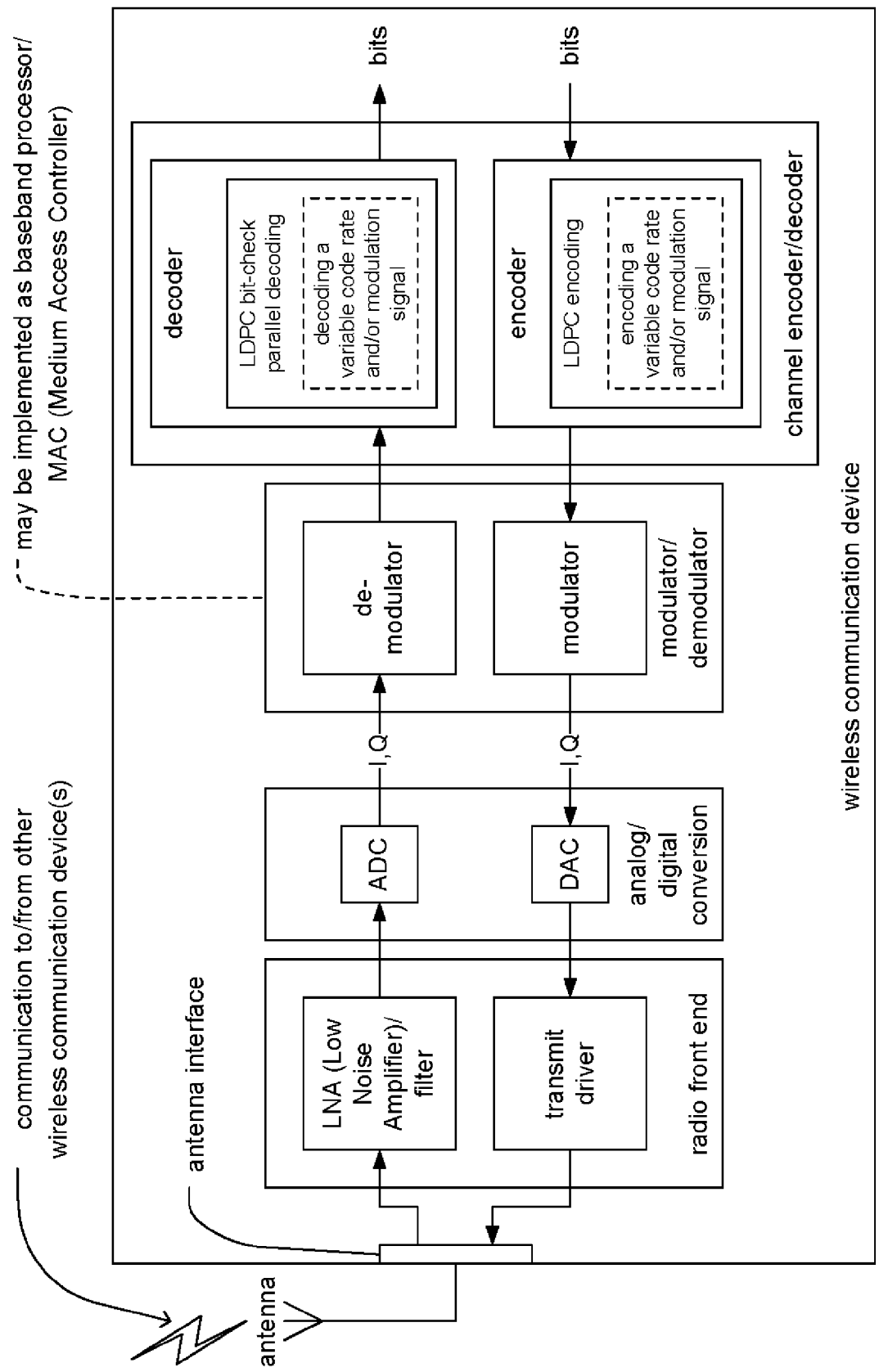
FIG. 18 is a diagram illustrating an alternative embodiment of a wireless communication device that is constructed according to the invention.

FIG. 18 is a diagram illustrating an alternative embodiment of a wireless communication device that is constructed according to the invention. This embodiment of a wireless communication device includes an antenna that is operable to communicate with any 1 or more other wireless communication devices. An antenna interface communicatively couples a signal to be transmitted from the wireless communication device or a signal received by the wireless communication device to the appropriate path (be it the transmit path or the receive path).

A radio front end includes receiver functionality and transmitter functionality. The radio front end communicatively couples to an analog/digital conversion functional block. The radio front end communicatively couples to a modulator/demodulator, and the radio front end communicatively couples to a channel encoder/decoder.

Along the Receive Path:

The receiver functionality of the front end includes a LNA (Low Noise Amplifier)/filter. The filtering performed in this receiver functionality may be viewed as the filtering that is limiting to the performance of the device, as also described above. The receiver functionality of the front end performs any down-converting that may be requiring (which may alternatively include down-converting directly from the received signal frequency to a baseband signal frequency). The general operation of the front end may be viewed as receiving a continuous time signal, and performing appropriate filtering and any down conversion necessary to generate the baseband signal. Whichever manner of down conversion is employed, a baseband signal is output from the receiver functionality of the front end and provided to an ADC (Analog to Digital Converter) that samples the baseband signal (which is also a continuous time signal, though at the baseband frequency) and generates a discrete time signal baseband signal (e.g., a digital format of the baseband signal); the ADC also extracts and outputs the digital I, Q (In-phase, Quadrature) components of the discrete time signal baseband signal.

These I, Q components are provided to a demodulator portion of the modulator/demodulator where any modulation decoding/symbol mapping is performed where the I, Q components of the discrete time signal baseband signal. The appropriate I, Q components are then mapped to an appropriate modulation (that includes a constellation and corresponding mapping). Examples of such modulations may include BPSK (Binary Phase Shift Key), QPSK (Quadrature Phase Shift Key), 8 PSK (S Phase Shift Key), 16 QAM (16 Quadrature Amplitude Modulation), and even higher order modulation types. These demodulated symbols are then provided to a decoder portion of the channel encoder/decoder where best estimates of the information bits contained within the originally received continuous time signal are made.

Along the Transmit Path:

Somewhat analogous and opposite processing is performed in the transmit path when compared to the receive path. Information bits that are to be transmitted are encoded using an encoder of the channel encoder/decoder. These encoded bits are provided to a modulator of the modulator/demodulator where modulation encoding/symbol mapping may be performed according to the modulation of interest. These now I, Q components of the symbols are then passed to a DAC (Digital to Analog Converter) of the analog/digital conversion functional block to transform the I, Q components into a continuous time transmit signal (e.g., an analog signal). The now continuous time transmit signal to be transmitted is then passed to a transmit driver that performs any necessary up-converting/modification to the continuous time transmit signal (e.g., amplification and/or filtering) to comport it to the communication channel over which the signal is to be transmitted to another piconet operable device via the antenna.

As within other embodiments that employ an encoder and a decoder, the encoder of this wireless communication device may be implemented to encode information in a manner in accordance with the functionality and/or processing of at least some of the various aspects of the invention to assist in generating a signal that is to be launched into the communication channel coupling to the wireless communication device. The decoder of the wireless communication device may be implemented to decode a received signal in a manner in accordance with the functionality and/or processing of at least some of the various aspects of the invention. This diagram shows yet another embodiment where one or more of the various aspects of the invention may be found.

In addition, several of the following Figures describe particular embodiments that may be used to implement some of the various aspects of invention that include decoding of LDPC (Low Density Parity Check) coded modulation signals in a manner that performs simultaneous and in parallel updating of edge messages with respect to bit-block nodes and updating of edge messages with respect to check-block nodes. Several details of these various aspects are provided below. Initially, a general description of LDPC codes is provided.

Figure 19:
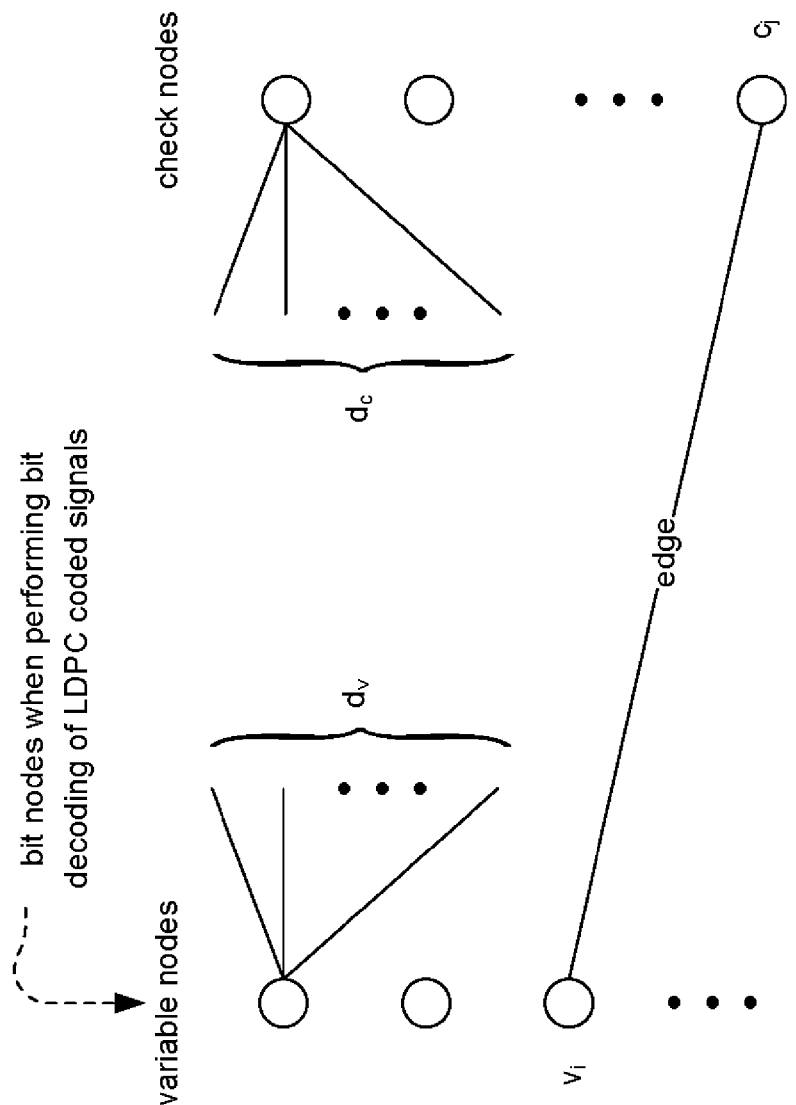
FIG. 19 is a diagram illustrating an embodiment of an LDPC (Low Density Parity Check) code bipartite graph.

FIG. 19 is a diagram illustrating an embodiment of an LDPC (Low Density Parity Check) code bipartite graph. An LDPC code may be viewed as being a code having a binary parity check matrix such that nearly all of the elements of the matrix have values of zeros (e.g., the binary parity check matrix is sparse). For example, $H=(h_{i,j})_{M \times N}$ may be viewed as being a parity check matrix of an LDPC code with block length N. If every column of the matrix has $d_v$ 1's, and every row of the matrix has $d_c$ 1's then this code is referred to as a $(d_v, d_c)$ regular LDPC code. For example, a regular (4,72) LDPC code would be viewed as being a code whose binary parity check matrix would have 4 1's in every column and 72 1's in every row. These regular LDPC codes were introduced in R. Gallager, *Low-Density Parity-Check Codes*, Cambridge, Mass.: MIT Press, 1963.

A regular LDPC code can be represented as a bipartite graph by its parity check matrix with left side nodes representing variable of the code bits, and the right side nodes representing check equations. The bipartite graph of the code defined by H may be defined by N variable nodes and M check nodes. Every variable node of the N variable nodes has exactly $d_v$ edges connecting this node to one or more of the check nodes (within the M check nodes). This number of $d_v$ edges may be referred to as the degree of a variable node. Analogously, every check node of the M check nodes has exactly $d_c$ edges connecting this node to one or more of the variable nodes. This number of $d_c$ edges may be referred to as the degree of a check node.

An edge between a variable node $v_i$ and check node $c_j$ may be defined by $e=(i,j)$. However, on the other hand, given an edge $e=(i,j)$, the nodes of the edge may alternatively be denoted as by $e=(v(e),c(e))$. Given a variable node $v_i$, one may define the set of edges emitting from the node $v_i$ by $E_v(i)=\{e|v(e)=i\}$. Given a check node $c_j$, one may define the set of edges emitting from the node $c_j$ by $E_c(j)=\{e|c(e)=j\}$. Continuing on, the derivative result will be $|E_v(i)|=d_v$ and $|E_c(j)|=d_c$.

An irregular LDPC code may also be described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not equal to $|E_v(i_2)|$. This relationship may also hold true for two check nodes. The concept of irregular LDPC codes was originally introduced within M. Luby, M. Mitzenmacher, M. A. Shokrollahi, D. A. Spielman, and V. Stemann, "Practical Loss-Resilient Codes," *Proc. 29th Symp. on Theory of Computing*, 1997, pp. 150-159.

In general, with a graph of an LDPC code, the parameters of an LDPC code can be defined by a degree of distribution, as described within M. Lugy, et al. (referenced above) and also within T. J. Richardson and R. L. Urbanke, "The capacity of low-density parity-check code under message-passing decoding," *IEEE Trans. Inform. Theory*, Vol. 47, pp. 599-618, February 2001. This distribution may be described as follows:

Let $\lambda_i$ represent the fraction of edges emanating from variable nodes of degree i and let $\rho_i$ represent the fraction of edges emanating from check nodes of degree i. Then, a degree distribution pair $(\lambda, \rho)$ is defined as follows:

$$\lambda(x) = \sum_{i=2}^{M_v} \lambda_i x^{i-1}$$

and $$\rho(x) = \sum_{i=2}^{M_c} \rho_i x^{i-1},$$

where $M_v$ and $M_c$ represent the maximal degrees for variable nodes and check nodes, respectively.

While many of the illustrative embodiments described herein utilize regular LDPC code examples, it is noted that the invention is also operable to accommodate both regular LDPC codes and irregular LDPC codes.

The LLR (Log-Likelihood Ratio) decoding of LDPC codes may be described as follows: the probability that a bit within a received vector in fact has a value of 1 when a 1 was actually transmitted is calculated. Similarly, the probability that a bit within a received vector in fact has a value of 0 when a 0 was actually transmitted is calculated. These probabilities are calculated using the LDPC code that is use to check the parity of the received vector. The LLR is the logarithm of the ratio of these two calculated probabilities. This LLR will give a measure of the degree to which the communication channel over which a signal is transmitted may undesirably affect the bits within the vector.

The LLR decoding of LDPC codes may be described mathematically as follows:

Beginning with $C=\{v|v=(v_0, \ldots, v_{N-1}), vH^T=0\}$ being an LDPC code and viewing a received vector, $y=(y_0, \ldots, y_{N-1})$, with the sent signal having the form of $((-1)^{v_0}, \ldots, (-1)^{v_{N-1}})$, then the metrics of the channel may be defined as $p(y_i|v_i=0)$, $p(y_i|v_i=1)$, $i=0, \ldots, N-1$. The LLR of a metric will then be defined as follows:

$$L_{metric}(i) = \ln \frac{p(y_i | v_i = 0)}{p(y_i | v_i = 1)}$$

For every variable node $v_i$, its LLR information value will then be defined as follows:

$$\ln \frac{p(v_i = 0 | y_i)}{p(v_i = 1 | y_i)} = L_{metric}(i) + \ln \frac{p(v_i = 0)}{p(v_i = 1)}$$

Since the variable node, $v_i$, is in a codeword, then the value of the ratio of these, $$\ln \frac{p(v_i = 0)}{p(v_i = 1)},$$

may be replaced by the following $$\ln \frac{p(v_i = 0, vH^T = 0 | y)}{p(v_i = 1, vH^T = 0 | y)} = \sum_{(i,j) \in E_v(i)} \ln \frac{p(v_i = 0, vh_j^T = 0 | y)}{p(v_i = 1, vh_j^T = 0 | y)}$$

where $E_v(i)$ is a set of edges starting with $v_i$ as defined above.

When performing the BP (Belief Propagation) decoding approach in this context, then the value of $$\ln \frac{p(v_i = 0, vh_j^T = 0 | y)}{p(v_i = 1, vh_j^T = 0 | y)}$$

may be replaced by the following relationship $$L_{check}(i, j) = \ln \frac{p\left(\sum_{e \in E_c(j) \setminus \{(i,j)\}} v_{v(e)} = 0 | y\right)}{p\left(\sum_{e \in E_c(j) \setminus \{(i,j)\}} v_{v(e)} = 1 | y\right)}$$

$L_{check}(i,j)$ is called the EXT (extrinsic) information of the check node $c_j$ with respect to the edge (i,j). In addition, it is noted that $e \in E_c(j) \setminus \{(i,j)\}$ indicates all of the edges emitting from check node $c_j$ except for the edge that emits from the check node $c_j$ to the variable node $v_i$. Extrinsic information values may be viewed as those values that are calculated to assist in the generation of best estimates of actual bit values within a received vector. Also in a BP approach, then the extrinsic information of the variable node $v_i$ with respect to the edge (i,j) may be defined as follows:

$$L_{var}(i, j) = L_{metric}(i) + \sum_{(i,k) \in E_v(i) \setminus \{(i,j)\}} L_{check}(i, k).$$

From certain perspectives, the invention may be implemented within communication systems that involve combining modulation coding with LDPC coding to generate LDPC coded modulation signals. These LDPC coded modulation signals may be such that they have a code rate and/or modulation (constellation and mapping) that varies as frequently as on a symbol by symbol basis. Up to now, there have been some attempts to combine modulation encoding with LDPC coding, yet they are all limited to employing only a single code rate or modulation (constellation and mapping) symbols generated thereby. Nevertheless, some of the possible approaches to combine modulation coding and LDPC coding are described below. In addition, various approaches by which symbol decoding of LDPC coded modulation signals that have been encoded using non-Gray code maps are also presented.

Figure 20:
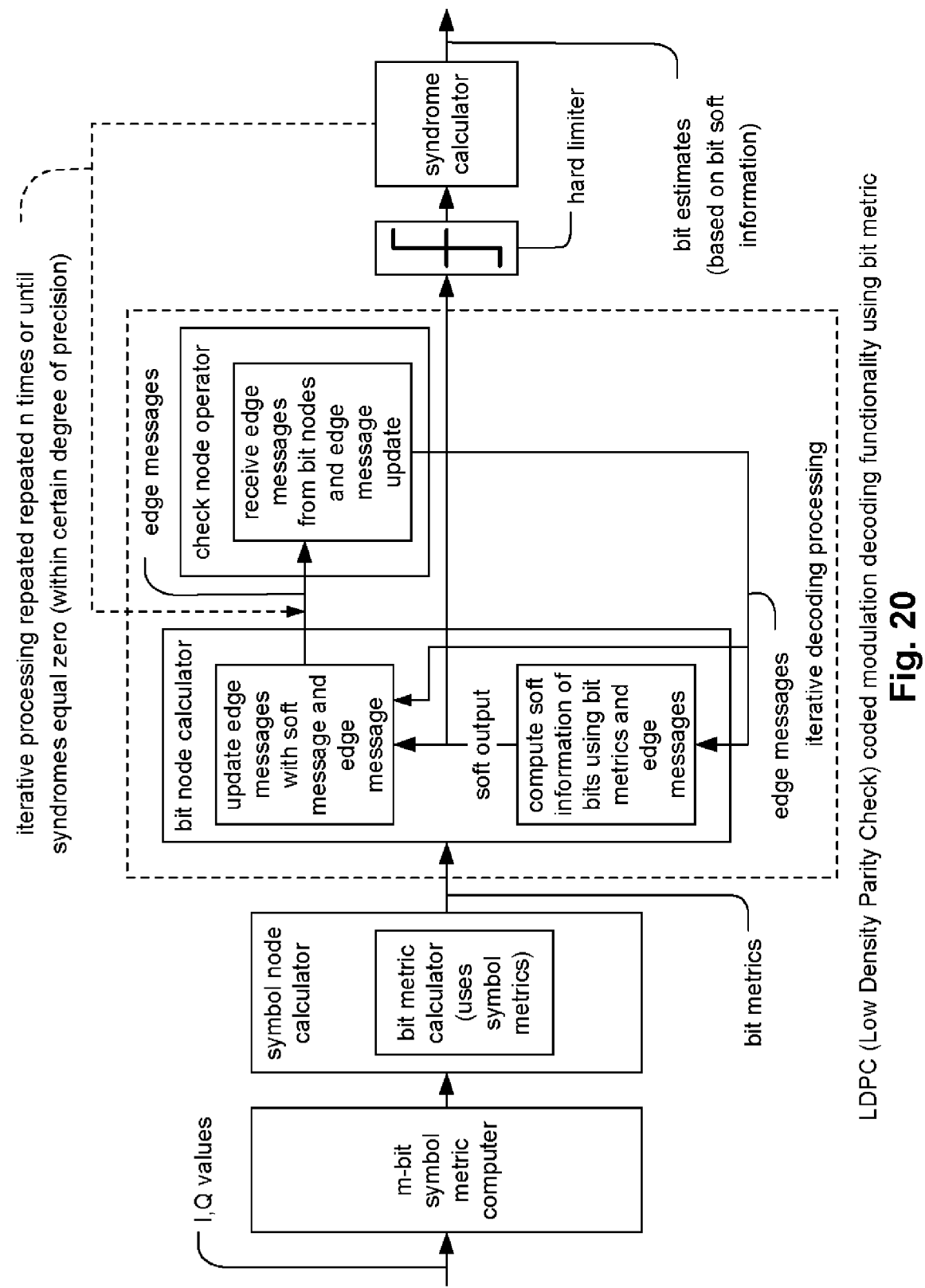
FIG. 20 is a diagram illustrating an embodiment of LDPC (Low Density Parity Check) coded modulation decoding functionality using bit metric according to the invention.

FIG. 20 is a diagram illustrating an embodiment of LDPC (Low Density Parity Check) coded modulation decoding functionality using bit metric according to the invention. To perform decoding of an LDPC coded modulation signal having an m-bit signal sequence, the functionality of this diagram may be employed. After receiving the I, Q (In-phase, Quadrature) values of a signal at the symbol nodes, an m-bit symbol metric computer functional block calculates the corresponding symbol metrics. At the symbol nodes, these symbol metrics are then passed to a symbol node calculator functional block that uses these received symbol metrics to calculate the bit metrics corresponding to those symbols. These bit metrics are then passed to the bit nodes connected to the symbol nodes.

Thereafter, at the bit nodes, a bit node calculator functional block operates to compute the corresponding soft messages of the bits. Then, in accordance with iterative decoding processing, the bit node calculator functional block receives the edge messages from a check node operator functional block and updates the edge messages with the bit metrics received from the symbol node calculator functional block. These edge messages, after being updated, are then passed to the check node operator functional block.

At the check nodes, the check node operator functional block then receives these edge messages sent from the bit nodes (from the bit node calculator functional block) and updates them accordingly. These updated edge messages are then passed back to the bit nodes (e.g., to the bit node calculator functional block) where the soft information of the bits is calculated using the bit metrics and the current iteration values of the edge messages. Thereafter, using this just calculated soft information of the bits (shown as the soft message), the bit node calculator functional block updates the edge messages using the previous values of the edge messages (from the just previous iteration) and the just calculated soft message. The iterative processing continues between the bit nodes and the check nodes according to the LDPC code bipartite graph that was employed to encode the signal that is being decoded.

These iterative decoding processing steps, performed by the bit node calculator functional block and the check node operator functional block, are repeated a predetermined number of iterations (e.g., repeated n times, where n is selectable). Alternatively, these iterative decoding processing steps are repeated until the syndromes of the LDPC code are all equal to zero (within a certain degree of precision).

Soft output information is generated within the bit node calculator functional block during each of the decoding iterations. In this embodiment, this soft output may be provided to a hard limiter where hard decisions may be made, and that hard information may be provided to a syndrome calculator to determined whether the syndromes of the LDPC code are all equal to zero (within a certain degree of precision). That is to say, the syndrome calculator determines whether each syndrome associated with the LDPC code is substantially equal to zero as defined by some predetermined degree of precision. For example, when a syndrome has a mathematically non-zero value that is less than some threshold as defined by the predetermined degree of precision, then that syndrome is deemed to be substantially equal to zero. When a syndrome has a mathematically non-zero value that is greater than the threshold as defined by the predetermined degree of precision, then that syndrome is deemed to be substantially not equal to zero.

When the syndromes are not substantially equal to zero, the iterative decoding processing continues again by appropriately updating and passing the edge messages between the bit node calculator functional block and the check node operator functional block.

After all of these iterative decoding processing steps have been performed, then the best estimates of the bits are output based on the bit soft information. In the approach of this embodiment, the bit metric values that are calculated by the symbol node calculator functional block are fixed values and used repeatedly in updating the bit node values.

Figure 21:
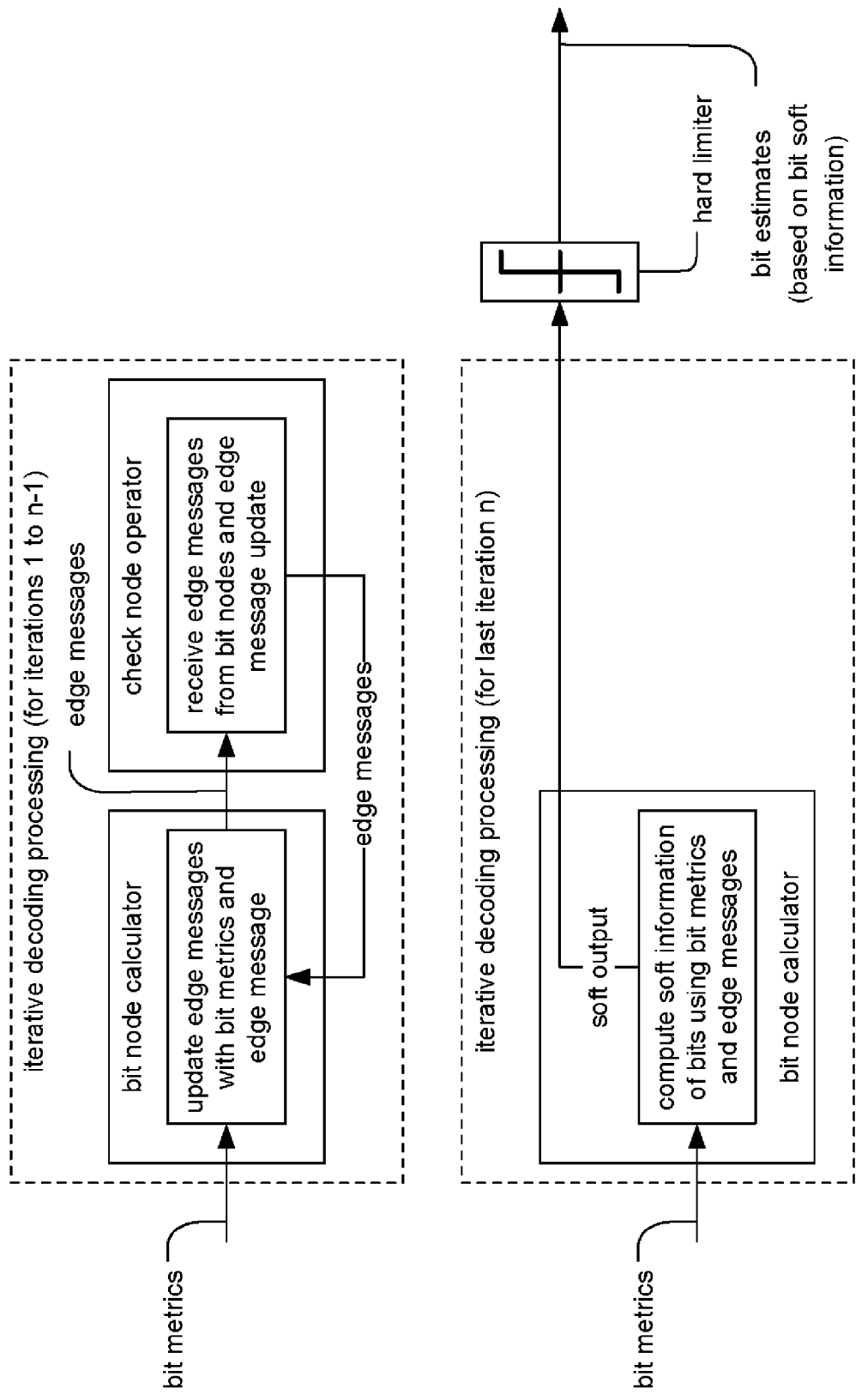
FIG. 21 is a diagram illustrating an alternative embodiment of LDPC coded modulation decoding functionality using bit metric according to the invention (when performing n number of iterations).

FIG. 21 is a diagram illustrating an alternative embodiment of LDPC coded modulation decoding functionality using bit metric according to the invention (when performing n number of iterations). This embodiment shows how the iterative decoding processing may be performed when a predetermined number of decoding iterations, shown as n, is performed. If the number of decoding iterations is known beforehand, as in a predetermined number of decoding iterations embodiment, then the bit node calculator functional block may perform the updating of its corresponding edge messages using the bit metrics themselves (and not the soft information of the bits as shown in the previous embodiment and described above). This processing may be performed in all but the last decoding iteration (e.g., for iterations 1 through n−1). However, during the last iteration, the bit node calculator functional block calculated the soft information of the bits (shown as soft output). The soft output is then provided to a hard limiter where hard decisions may be made of the bits. The syndromes need not be calculated in this embodiment since only a predetermined number of decoding iterations are being performed.

Figure 22:
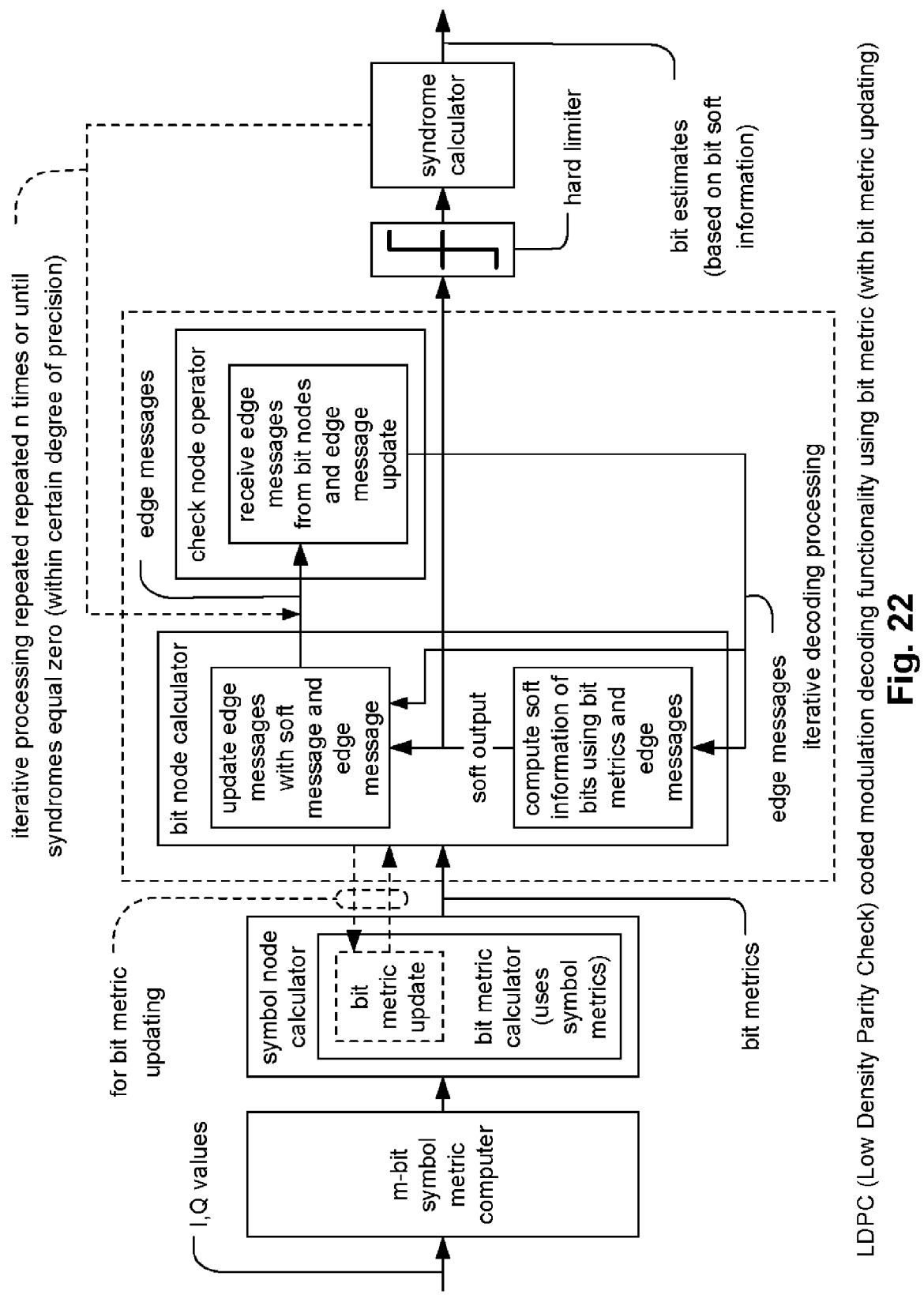
FIG. 22 is a diagram illustrating an alternative embodiment of LDPC (Low Density Parity Check) coded modulation decoding functionality using bit metric (with bit metric updating) according to the invention.

FIG. 22 is a diagram illustrating an alternative embodiment of LDPC (Low Density Parity Check) coded modulation decoding functionality using bit metric (with bit metric updating) according to the invention. To perform decoding of an LDPC coded modulation signal having an m-bit signal sequence, the functionality of this diagram may be employed. After receiving the I, Q (In-phase, Quadrature) values of a signal at the symbol nodes, an m-bit symbol metric computer functional block calculates the corresponding symbol metrics. At the symbol nodes, these symbol metrics are then passed to a symbol node calculator functional block that uses these received symbol metrics to calculate the bit metrics corresponding to those symbols. These bit metrics are then passed to the bit nodes connected to the symbol nodes. The symbol node calculator functional block is also operable to perform bit metric updating during subsequent decoding iterations.

Thereafter, at the bit nodes, a bit node calculator functional block operates to compute the corresponding soft messages of the bits. Then, in accordance with iterative decoding processing, the bit node calculator functional block receives the edge messages from a check node operator functional block and updates the edge messages with the bit metrics received from the symbol node calculator functional block. This updating of the edge messages may be performed using the updated bit metrics during subsequent iterations. These edge messages, after being updated, are then passed to the check node operator functional block.

At the check nodes, the check node operator functional block then receives these edge messages sent from the bit nodes (from the bit node calculator functional block) and updates them accordingly. These updated edge messages are then passed back to the bit nodes (e.g., to the bit node calculator functional block) where the soft information of the bits is calculated using the bit metrics and the current iteration values of the edge messages. Thereafter, using this just calculated soft information of the bits (shown as the soft message), the bit node calculator functional block updates the edge messages using the previous values of the edge messages (from the just previous iteration) and the just calculated soft message. At the same time, as the just calculated soft information of the bits (shown as the soft message) has been calculated, this information may be passed back to the symbol nodes (e.g., to the symbol node calculator functional block) for updating of the bit metrics employed within subsequent decoding iterations. The iterative processing continues between the bit nodes and the check nodes according to the LDPC code bipartite graph that was employed to encode the signal that is being decoded (by also employing the updated bit metrics during subsequent decoding iterations).

These iterative decoding processing steps, performed by the bit node calculator functional block and the check node operator functional block, are repeated a predetermined number of iterations (e.g., repeated n times, where n is selectable). Alternatively, these iterative decoding processing steps are repeated until the syndromes of the LDPC code are all equal to zero (within a certain degree of precision).

Soft output information is generated within the bit node calculator functional block during each of the decoding iterations. In this embodiment, this soft output may be provided to a hard limiter where hard decisions may be made, and that hard information may be provided to a syndrome calculator to determined whether the syndromes of the LDPC code are all equal to zero (within a certain degree of precision). When they are not, the iterative decoding processing continues again by appropriately updating and passing the edge messages between the bit node calculator functional block and the check node operator functional block.

After all of these iterative decoding processing steps have been performed, then the best estimates of the bits are output based on the bit soft information. In the approach of this embodiment, the bit metric values that are calculated by the symbol node calculator functional block are fixed values and used repeatedly in updating the bit node values.

Figure 23:
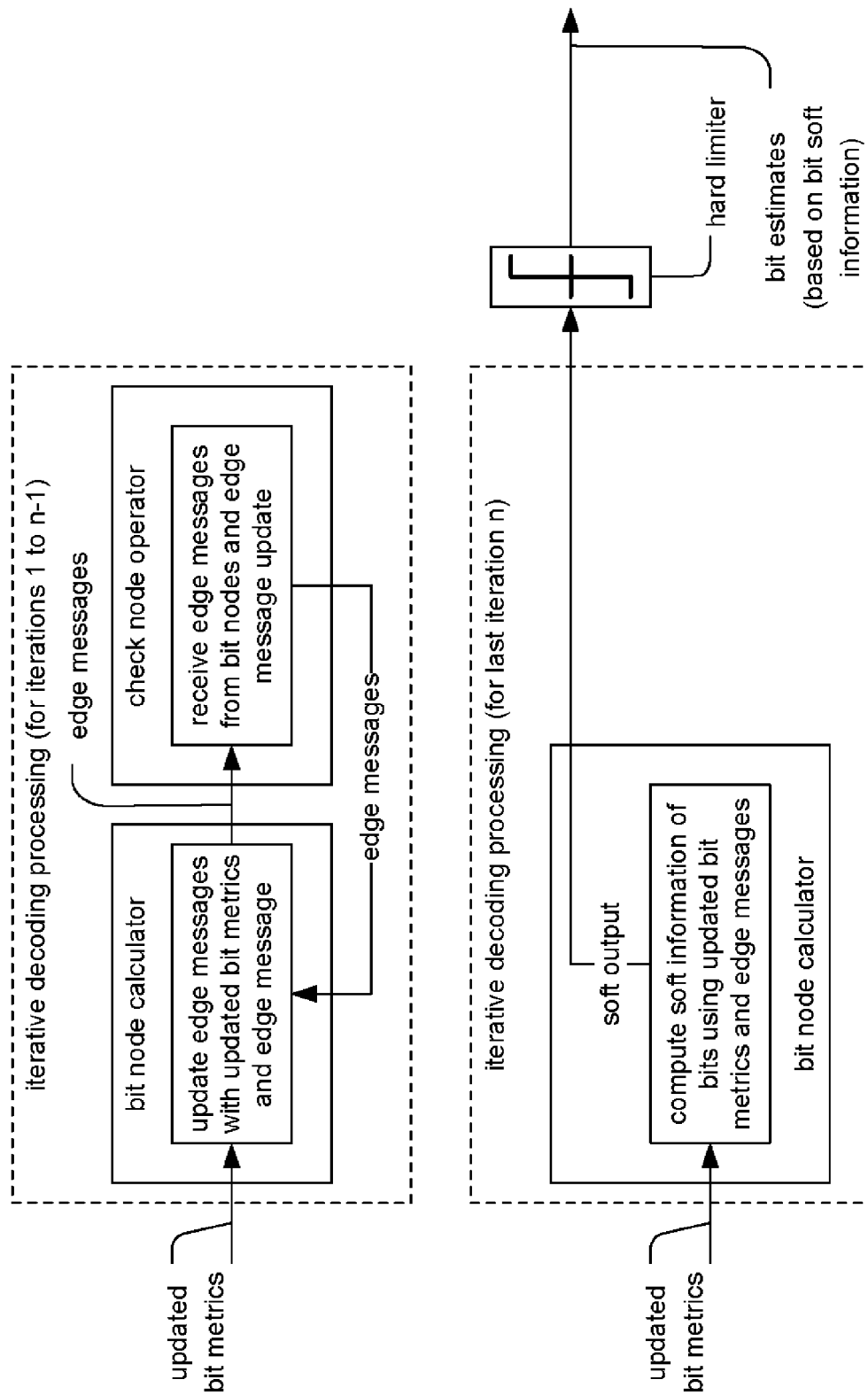
FIG. 23 is a diagram illustrating an alternative embodiment of LDPC coded modulation decoding functionality using bit metric (with bit metric updating) according to the invention (when performing n number of iterations).

FIG. 23 is a diagram illustrating an alternative embodiment of LDPC coded modulation decoding functionality using bit metric (with bit metric updating) according to the invention (when performing n number of iterations). This embodiment shows how the iterative decoding processing may be performed when a predetermined number of decoding iterations, shown as n, is performed (again, when employing bit metric updating). If the number of decoding iterations is known beforehand, as in a predetermined number of decoding iterations embodiment, then the bit node calculator functional block may perform the updating of its corresponding edge messages using the bit metrics/updated bit metrics themselves (and not the soft information of the bits as shown in the previous embodiment and described above). This processing may be performed in all but the last decoding iteration (e.g., for iterations 1 through n−1). However, during the last iteration, the bit node calculator functional block calculated the soft information of the bits (shown as soft output). The soft output is then provided to a hard limiter where hard decisions may be made of the bits. The syndromes need not be calculated in this embodiment since only a predetermined number of decoding iterations are being performed.

FIG. 24A is a diagram illustrating bit decoding using bit metric (shown with respect to an LDPC (Low Density Parity Check) code bipartite graph) according to the invention. Generally speaking, after receiving I, Q values of a signal at a symbol nodes, the m-bit symbol metrics are computed. Then, at the symbol nodes, the symbol metric is used to calculate the bit metric. The bit metric is then passed to the bit nodes connected to the symbol nodes. At the bit nodes, the soft messages of the bits are computed, and they are used to update the edge message sent from the check nodes with the bit metric. These edge messages are then passed to the check nodes. At the check nodes, updating of the edge messages sent from the bit nodes is performed, and these values are pass back the bit nodes.

As also described above with respect to the corresponding functionality embodiment, after all of these iterative decoding processing steps have been performed, then the best estimates of the bits are output based on the bit soft information. In the approach of this embodiment, the bit metric values that are calculated by the symbol node calculator functional block are fixed values and used repeatedly in updating the bit node values.

FIG. 24B is a diagram illustrating bit decoding using bit metric updating (shown with respect to an LDPC (Low Density Parity Check) code bipartite graph) according to the invention. With respect to this LDPC code bipartite graph that performs bit metric updating, the decoding processing may be performed as follows:

After receiving the I, Q value of the signal at the symbol nodes, the m-bit symbol metrics are computed. Then, at the symbol nodes, the symbol metrics are used to calculate the bit metrics. These values are then passed to the bit nodes connected to the symbol nodes. At the bit nodes, the edge message sent from the check nodes are updated with the bit metrics, and these edge messages are passed to the check nodes. In addition, at the same time the soft bit information is updated and passed back to the symbol nodes. At the symbol nodes, the bit metrics are updated with the soft bit information sent from the bit nodes, and these values are passed back to the variable nodes. At the check nodes, the edge information sent from the bit nodes is updated, and this information is passed back to the bit nodes.

As also described above with respect to the corresponding functionality embodiment, after all of these iterative decoding processing steps have been performed, then the best estimates of the bits are output based on the bit soft information. Again, it is shown in this embodiment that the bit metric values are not fixed; they are updated for use within subsequent decoding iterations. This is again in contradistinction to the embodiment described above where the bit metric values that are calculated only once and remain fixed values for all of the decoding iterations.

FIG. 25A is a diagram illustrating an LDPC (Low Density Parity Check) coded modulation tripartite graph with symbol nodes connected to bit nodes according to the invention. In this embodiment, it can be seen that the bit nodes are connected to the symbol nodes. The appropriately corresponding bit nodes are also connected to the check nodes according to the LDPC code being employed. However, it is noted that the symbols to be decoded are solely determined by the bits connected to the corresponding symbol. This property is capitalized upon such that the bit nodes may be removed from the LDPC tripartite graph, so that the symbol nodes may be directly connected to the check nodes thereby generating an LDPC coded modulation bipartite graph.

As one example, 3 symbol nodes, $s_0$, $s_1$, $s_2$, are connected to the 9 bit nodes, $b_0$, $b_1$, $b_2$, ..., $b_8$, according to the following mapping:

$$s_0 \leftrightarrow (b_0, b_3, b_6)$$
$$s_1 \leftrightarrow (b_1, b_4, b_7)$$
$$s_2 \leftrightarrow (b_2, b_5, b_8) \qquad (EQ\ 1)$$

The connections between the 9 bit nodes, $b_0$, $b_1$, $b_2$, ..., $b_8$, and the 3 check nodes, $c_0$, $c_1$, $c_2$, are made according to the following mapping:

$$b_0 \leftrightarrow (c_0, c_2)$$
$$b_1 \leftrightarrow (c_0, c_1)$$
$$b_2 \leftrightarrow (c_1, c_2)$$
$$b_3 \leftrightarrow (c_0, c_1)$$
$$b_4 \leftrightarrow (c_1, c_2)$$
$$b_5 \leftrightarrow (c_0, c_2)$$
$$b_6 \leftrightarrow (c_0, c_1)$$
$$b_7 \leftrightarrow (c_1, c_1)$$
$$b_8 \leftrightarrow (c_0, c_1)$$

FIG. 25B is a diagram illustrating an LDPC (Low Density Parity Check) coded modulation bipartite graph (or symbol bipartite graph) with symbol nodes connected directly to check nodes according to the invention (this bipartite graph is generated from the tripartite graph shown in FIG. 25A). One aspect of the invention is the ability to reduce the number of nodes within an LDPC bipartite graph by directly connecting the symbols nodes to the check nodes (e.g., by modifying an LDPC coded modulation tripartite graph to generate an LDPC coded modulation bipartite graph). However, this must be performed very carefully to ensure proper decoding of such LDPC coded signals. As is described herein, the labeling of the edges connected the symbols nodes to the check nodes needs to be done carefully to ensure proper decoding of symbols.

Within this LDPC code bipartite graph, the edges are only connected between the symbol nodes and the check nodes. In doing so, every edge connecting the symbol nodes and the check nodes is labeled by a value according to EQ 1 shown above. In some embodiments, these edges are labeled using octal values.

For example, using an octal labeling approach, the edge connecting the symbol node $s_0$ to the check node $c_0$, depicted as $(s_0,c_0)$, is labeled as 7 since all three bits $b_0$, $b_3$, $b_6$ are connected to $c_0$ (e.g., labeled as 7 because $b_0$, $b_3$, $b_6$=111). Similarly, the edge connecting the symbol node $s_0$ to the check node $c_1$, depicted as $(s_0,c_1)$, is labeled as 6 since only the two bits $b_0$, $b_3$ are connected to $c_1$ (e.g., labeled as 6 because $b_0$, $b_3$, $b_6$=110). As another example, the edge connecting the symbol node $s_0$ to the check node $c_2$ depicted as $(s_0,c_2)$, is labeled as 1 since only the one bit $b_0$ is connected to $c_2$ (e.g., labeled as 1 because $b_0$, $b_3$, $b_6$=100). The additional edges that communicatively couple the symbols nodes to the check nodes may also be labeled according to this convention.

One of the advantages of the symbol node to check node LDPC code bipartite graph is that a decoder may use symbol metrics when performing the decoding processing of the LDPC coded symbols instead of bit metrics. In this way of performing the decoding processing, there is therefore no need to perform metric updating; the metric updating within the decoding processing may have the undesirable effect of requiring an increased amount of memory to be used. Moreover, the decoding based on the LDPC code bipartite graph (sometimes referred to as a symbol LDPC code bipartite graph) actually out-performs decoding processing that is based on an LDPC code tripartite graph (whose bit nodes are connected to check nodes). In addition, the LDPC symbol decoding provides comparable or better performance of LDPC bit decoding that involves updating of the bit metrics.

Figure 26A:
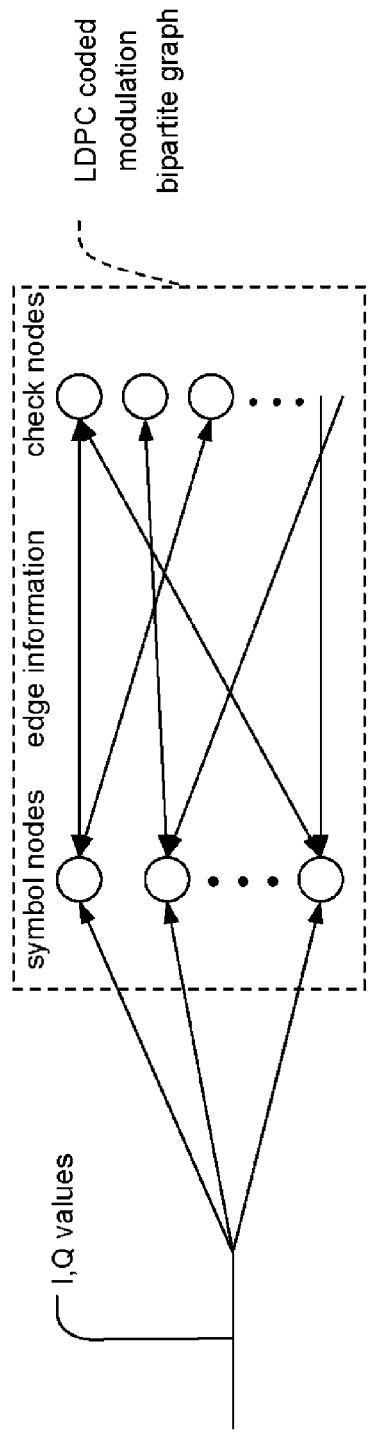
FIG. 26A is a diagram illustrating symbol decoding (shown with respect to an LDPC (Low Density Parity Check) coded modulation bipartite graph) according to the invention.

FIG. 26A is a diagram illustrating symbol decoding (shown with respect to an LDPC (Low Density Parity Check) coded modulation bipartite graph) according to the invention. The symbol decoding processing performed according to the invention may be performed using an LDPC coded modulation bipartite graph in which the symbol nodes are connected directly to the check nodes. In general, the I, Q values of a symbol are provided to the symbol nodes, and the iterative decoding processing is performed according to the manner in which the labeled edges communicatively couple the symbol nodes to the check nodes.

As an example of how the decoding processing may be performed using such an LDPC coded modulation bipartite graph, a rate ⅔ LDPC code with an 8 PSK (8 Phase Shift Key) modulation signal is decoded and explained in detail. This LDPC code may be a regular LDPC code or an irregular LDPC code without departing from the scope and spirit of the invention. The block length of the LDPC code is 3N and a 3 bit symbol $s_i$ is mapped (e.g., using a symbol mapper) according to the following notation:

$$s_i=(b_i,b_{N+i},b_{2N+i})$$

The parity check matrix of the LDPC code may be represented as $[h_{ij}]_{N\times 3N}$. The estimated symbols $r_i$ corresponding to the 3 bit symbol $s_i$ may be represented as $r_i=(r_{0i}, r_{1i}, r_{2i})$. The partial syndromes $S^m(i)$ and $S_m(i)$ (which may generally be referred to as syndromes, as they are up above in other embodiments) that are calculated using the estimated symbols and the parity check matrix of the LDPC code may be represented as follows:

$$S^m(i) = \sum_{j=0}^{m-1} (r_{0j}h_{ij} + r_{1j}h_{i(N+j)} + r_{2j}h_{i(2N+j)}) \quad \text{(EQ 2)}$$

$$S_m(i) = \sum_{j=m}^{N-1} (r_{0j}h_{ij} + r_{1j}h_{i(N+j)} + r_{2j}h_{i(2N+j)})$$

The following decoding processing description is described as being performed on a signal sequence Y. The probability of the signal sequence Y satisfying the partial syndrome, $p(S^j(i)=m|Y)$, to be equal to $A_{i,j}(m)$ is calculated (e.g., the probability of $p(S^j(i)=m|Y)=A_{i,j}(m)$). In addition, other probabilities are calculated; namely, the probability of the signal sequence Y satisfying the partial syndrome, $p(S_j(i)=m|Y)$, to be equal to $B_{i,j}(m)$ is calculated (e.g., the probability of $p(S_j(i)=m|Y)=B_{i,j}(m)$). These probabilities are all calculated based on the following conditions:

$$A_{i,0}(0)=1$$

$$B_{i,deg(c_i)-1}(0)=1, \text{ and}$$

$$A_{i,0}(m)=0$$

$$B_{i,deg(c_i)-1}(m)=0, \text{ where } m\neq 0.$$

Since the decoding may be performed in the logarithmic domain thereby enabling multiplication operations to be performed using addition and division operations to be performed using subtraction, these variables may be redefined within the logarithmic domain as follows:

$$\alpha_{i,j}(m)=\log(A_{i,j}(m))$$

$$\beta_{i,j}(m)=\log(B_{i,j}(m))$$

These values may be referred to as the alphas, or forward metrics, $(\alpha_{i,j}(m))$ and betas, or backward metrics, $(\beta_{i,j}(m))$ to be employed within the decoding processing.

The edge messages being passed from the check nodes to the symbol nodes may be represented as Medge[i][j][k], where i runs according to the appropriately labeled edges within the LDPC coded modulation bipartite graph.

As some examples:
1. if the label is 7, then k runs from 0 to 7,
2. if the label is 3, 5, or 6, then k runs from 0 to 3, and
3. if the label is 1, 2, or 6, then k runs between 0 to 1.

In addition, a new function x(v) that varies from $\{0, \ldots, 7\}$ to $\{0,1\}$ may be employed. The value v may be viewed as being an integer represented in octal. Then, the value of v may be represented as $v=(v_0, v_1, v_2)$. This new function x(v) may be represented as follows:

$$x(v)=v_0 \oplus v_1 \oplus v_2 \quad \text{(EQ 3)}$$

where $\oplus$ is an exclusive-or function (e.g., binary addition).

The notation and definitions provided above are also employed to describe the symbol decoding processing in other embodiments whose decoding processing and/or functionality are described in more detail below. More specifically, the embodiments described in more detail below show how the check node updating and symbol sequence estimation, as well as symbol node updating, is performed using these various values.

Figure 26B:
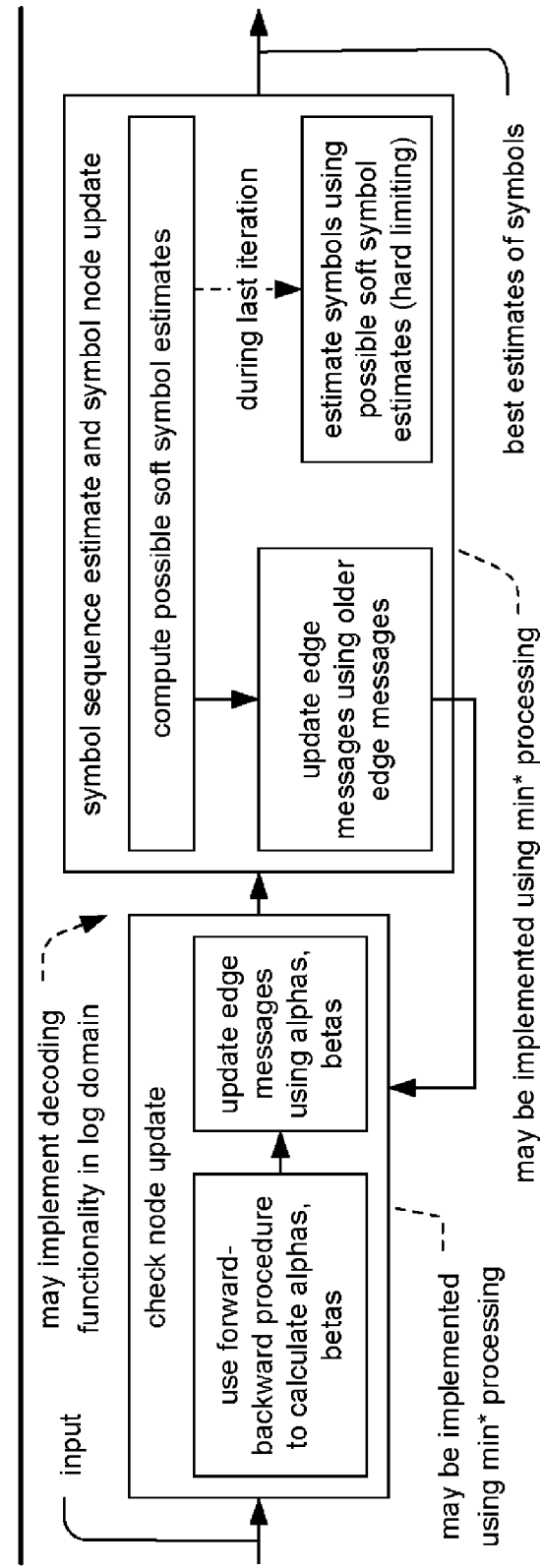
FIG. 26B is a diagram illustrating an embodiment of symbol decoding functionality (supported with an LDPC (Low Density Parity Check) coded modulation bipartite graph) according to the invention.

FIG. 26B is a diagram illustrating an embodiment of symbol decoding functionality (supported with an LDPC (Low Density Parity Check) coded modulation bipartite graph) according to the invention. This embodiment shows in more detail how the check node updating and symbol sequence estimation, as well as symbol node updating, is performed.

The decoding processing described in this embodiment may be better understood in the context of the check node updating and symbol sequence estimation, including the symbol node updating, that may be performed within in at least 2 different embodiments that are described herein in accordance with the invention: (1) symbol decoding and (2) hybrid decoding (that performs a combination of bit level and symbol level decoding). One possible embodiment of symbol decoding is described in this diagram (FIG. 26B), and various possible embodiments by which hybrid decoding may be implemented are described below with respect to the remaining diagrams of this disclosure.

Beginning from the left hand side of the diagram, input information corresponding to the calculated partial syndromes, that also includes the initial values of the alphas ($\alpha_{i,j}(m)$) and the betas ($\beta_{i,j}(m)$) (e.g., forward and backward metrics), are provided to a check node update functional block. Iterative decoding processing is performed within the check node update functional block over the total number of check nodes. For example, M iterations are performs over i (where i varies from 0 to M−1, and where M is the total number of check nodes of the LDPC bipartite graph).

In doing this iterative decoding processing, the check node updating initially involves calculating the values of the alphas ($\alpha_{i,j}(m)$) and the betas ($\beta_{i,j}(m)$) (beyond merely the initial values that are provided during the initial iteration) for each of the symbols of a received symbol block. This iterative decoding processing in calculating the alphas and betas may be performed using a forward-backward procedure through the received symbol block.

The calculation of the alphas and betas is described below.

For j=0 to deg($c_i$)−1 and m=0, 1, the forward-backward processing procedure may be employed to calculate the alphas ($\alpha_{i,j}(m)$) and the betas ($\beta_{i,j}(m)$) as follows:

$\alpha_{i,j}(m) = \min^*\{Medge[i][j-1][k] + \alpha_{i,j-1}(m \oplus x(k)) | \text{all possible } k\}$ $\beta_{i,j}(m) = \min^*\{Medge[i][j+1][k] + \beta_{i,j+1}(m \oplus x(k)) | \text{all possible } k\}$ Now that these values of alpha and beta are available for each of the symbols within a received symbol block, the edge messages Medge[i][j][k] (that communicatively couple the symbol nodes to the check nodes) are updated using these calculated alphas and betas values.

For j=0 to deg($c_i$)−1 and all possible k, the updating of the edge messages Medge[i][j][k] may be performed as follows:

$Medge[i][j][k] = \min^*\{[\alpha_{i,j}(0) + \beta_{i,j}(x(k))], [\alpha_{i,j}(1) + \beta_{i,j}(x(k) \oplus 1)]\}$ The min* processing functionality described herein may be better understood by the following description. The min* processing includes determining a minimum value from among two values (e.g., shown as min(A,B) in min* processing) as well as determining a logarithmic correction factor (e.g., shown as $\ln(1+e^{-|A-B|})$ in min* processing) in selecting the smaller metric. In addition, it is also noted that max* processing may alternatively be performed in place of min* processing. The max* processing operation also includes a logarithmic correction in selecting the larger metric. It is noted that the various embodiments of the invention may be implemented using the max* operations in lieu of the min* operation when preferred in a given implementation.

The min* processing, when operating on inputs A and B, may be expressed as follows:

$\min^*(A,B) = \min(A,B) - \ln(1+e^{-|A-B|})$

Again, the min* processing may alternatively be performed using max* processing. The max* processing, when operating on inputs A and B, may be expressed as follows:

$\max^*(A,B) = \max(A,B) + \ln(1+e^{-|A-B|})$

Moreover, when multiple min* operations are to be performed on multiple values (e.g., more than 2), the min* processing may be expressed as follows:

$\min^*(x_1, \ldots, x_N) = \min^*(\min^*(x_1, \ldots, x_{N-1}), x_N)$ (EQ 4)

After the check node processing has been completed, a symbol sequence estimate and symbol node update functional block operates using the check node update messages to continue the decoding processing.

Since the total number of edges is the same count from either side (e.g., from either the symbol node side or the check node side), the edges are intrinsically re-ordered according to the symbols that are being decoded. This re-ordering may be intrinsically performed using a LUT (Look-Up Table) to ensure the proper ordering of the check node updating. In other words, the LUT may be implemented to perform the function of which edge information to take when performing the symbol sequence estimate and symbol node update. In addition, this re-ordering functionality may be inherently implemented in hardware for proper ordering of the check node updating such that it corresponds to an order that is appropriate to the symbol node updating. For proper decoding of the symbols of the sequence (e.g., first symbol to last symbol), there needs to be some ordering of the symbols. However, this symbol ordering is not critical when performing the check node updating. That is to say, the ordering of the check node updating may then be performed according to any desired ordering, and to ensure proper decoding of the symbols according to the desired order (e.g., first symbol to last symbol), the check node updating is performed to ensure that the edge messages are inherently appropriately ordered according to the desired order for the decoding processing.

More specifically, this decoding processing may be understood with respect to the edge messages Medge[i][j][k], where i runs across all of the symbol nodes, where j runs according to the degree of the edges from the symbol nodes, and where k runs according to the labels of the LDPC bipartite graph.

This embodiment described with respect to this diagram is shown with respect to a code that includes 3 bit symbols, coded according to 8 PSK (8 Phase Shift Key) modulation. However, it is noted that such a decoding approach may also be adapted very easily to decoding signals having an even larger number of bits. For example, this decoding approach may be adapted to perform decoding of signals having symbols of higher order modulations including 16 QAM (16 Quadrature Amplitude Modulation), 16 APSK (16 Asymmetric Phase Shift Keying), 64 QAM, and even other modulation types without departing from the scope and spirit of the invention.

The label on the j-th edge from the check node i may be denoted as $L_{i,j}$. A new function, sh(L,v), may be defined and employed to assist in the decoding processing describer herein. This new function sh(L,v) may be defined as follows:

$$sh(L, (v_0, v_1, v_2)) = \begin{cases} v_2 & L = 1 \\ v_1 & L = 2 \\ (v_1, v_2) & L = 3 \\ v_0 & L = 4 \\ (v_0, v_2) & L = 5 \\ (v_0, v_1) & L = 6 \\ (v_0, v_1, v_2) & L = 7 \end{cases} \quad (EQ\ 5)$$

After the edge messages have been intrinsically and appropriately re-ordered using the approach described above, the symbol sequence estimate and symbol node update functional block continues to operate according to the following procedure.

For m=0, . . . , 7, the possible values for the soft symbol estimates are computed (e.g., the possible values for the soft information of the symbols is calculated) as follows:

$$p_i(m) = Metric_i[m] + \sum_{j=0}^{deg(s_i)-1} \left( \sum_{L_{i,j}} Medge[i][j][sh(L_{i,j}, m)] \right),$$

where $Metric_i[m]$ is the appropriate symbol metric obtained from the received signal according to its appropriate modulation (constellation and mapping values).

The symbol sequence estimate and symbol node update functional block continues by estimating the symbols using the soft symbol estimates. More specifically, the estimate of the symbol $s_i$ to m is made such that $p_i(m)$ is the smallest value selected from among all of the possible values of $p_i(0)$, $p_i(1)$, . . . , $p_i(7)$.

After the estimate of the symbols is made using the soft symbol estimates, the edge messages are updated within the symbol sequence estimate and symbol node update functional block using the older edge messages. More specifically, the edge message are updated as follows:

The processing may be better understood by considering the edge label $L_{i,j}$, 1. if $L_{i,j}$=7, then for m=0, . . . , 7, Medge[i][j][k]=$p_i$[m]−Medge[i][j][m].

2. alternatively, if $L_{i,j}$=3, 5, 6, then for $m_0$, $m_1 \in \{0,1\}$, then the values of the edge messages may be defined as:

$$Medge[i][j][(m_0, m_1)] = \begin{cases} min^*(p_i(0, m_0, m_1), p_i(1, m_0, m_1)) - Medge[i][j][m_0, m_1] & L_{i,j} = 3 \\ min^*(p_i(m_0, 0, m_1), p_i(m_0, 1, m_1)) - Medge[i][j][m_0, m_1] & L_{i,j} = 5 \\ min^*(p_i(m_0, m_1, 0), p_i(m_0, m_1, 1)) - Medge[i][j][m_0, m_1] & L_{i,j} = 6 \end{cases}$$

3. alternatively, if $L_{i,j}$=1, 2, 4, then for m=0, 1, then the values of the edge messages may be defined as:

$$Medge[i][j][(m)] = \begin{cases} min^*\{p_i(k_0, k_1, m) \mid k_0, k_1 \in \{0, 1\}\} - Medge[i][j][m] & L_{i,j} = 1 \\ min^*\{p_i(k_0, m, k_1) \mid k_0, k_1 \in \{0, 1\}\} - Medge[i][j][m] & L_{i,j} = 2 \\ min^*\{p_i(m, k_0, k_1) \mid k_0, k_1 \in \{0, 1\}\} - Medge[i][j][m] & L_{i,j} = 4, \end{cases}$$

where the right hand side edge of these equations is the old edge message passed from the check node.

Continuing on with the iterative decoding processing, using the updated edge messages (that are updated either a predetermined number of times and/or until convergence of the edge messages has been met within a certain degree of precision), then the best estimates of the symbols of a received symbol block may be made.

Figure 27:
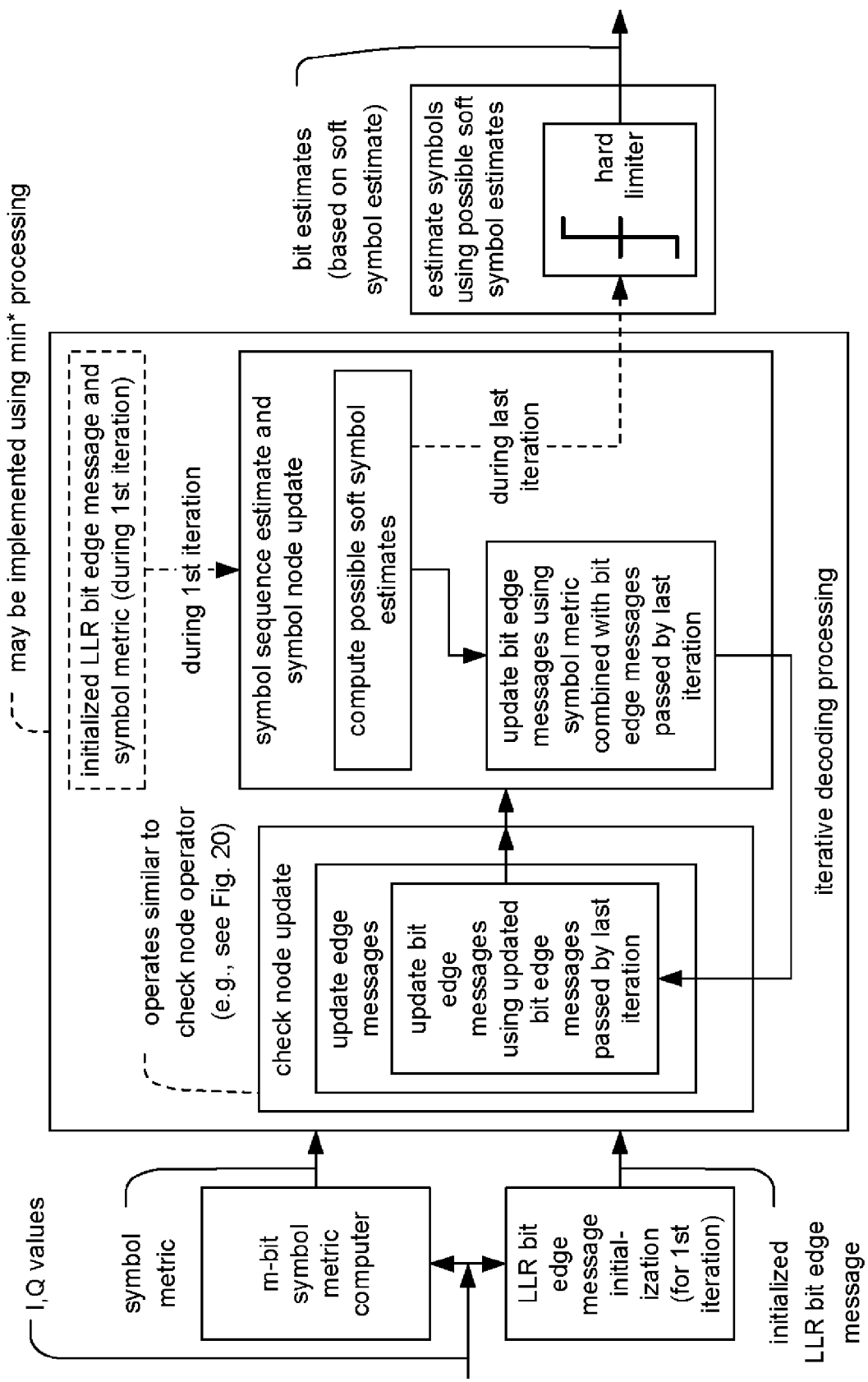
FIG. 27 is a diagram illustrating an embodiment of hybrid decoding functionality (having a reduced complexity when compared to symbol decoding) of LDPC (Low Density Parity Check) coded modulation signals according to the invention.

FIG. 27 is a diagram illustrating an embodiment of hybrid decoding functionality (having a reduced complexity when compared to symbol decoding) of LDPC (Low Density Parity Check) coded modulation signals according to the invention. This embodiment showing hybrid decoding processing may be viewed as being a modification (e.g., a departure) of the previous decoding processing approaches described up to now. In general, similar decoding functional blocks are employed within the iterative decoding processes as shown within the symbol decoding embodiments described above, but the manner in which these functional blocks operate is different; these differences provide for a less complex decoding approach, and (as is seen below with respect to comparing the performance of various decoding approaches) the hybrid decoding approach also provides for a significant improvement in performance (e.g., when compared to bit decoding only).

This hybrid decoding functionality begins by receiving the I, Q values of the received signal. Thereafter, an m-bit symbol metric computer functional block calculates the corresponding symbol metrics using the I, Q values. Also, a functional block performs the LLR (log likelihood ratio) bit edge message initialization for use in the first decoding iteration; this initialization need only be performed once. If desired, this initial LLR bit edge message may be initialized to a value of 0 for the initial iteration (e.g., iteration i=0). From these functional blocks, the symbol metric and the initialized LLR bit edge message are passed to an iterative decoding processing functional block that includes a check node update functional block and a symbol sequence estimate and symbol node update functional block. These initial conditions (or initial values) of the LLR bit edge message and the symbol metric are employed by the symbol sequence estimate and symbol node update functional block during a $1^{st}$ decoding iteration of the iterative decoding processing.

The check node update functional block operates in a relatively similar manner as the check node operator functional block that is described above with respect to the LDPC coded modulation decoding functionality using bit metric approach (e.g., see FIG. 20). In general, the check node update functional block performs updating of the edge messages received from a symbol sequence estimate and symbol node update functional block. This symbol sequence estimate and symbol node update functional block (of the hybrid decoding approach) differs from the symbol sequence estimate and symbol node update functional block (of the symbol decoding approach).

When performing the update of the edge messages within the check node update functional block, the check node update functional block updates the bit edge messages using the updated bit edge messages passed by the last iteration. During a first decoding iteration, this may include using the initialized values of the bit edge message. However, during the iterative decoding processing, the check node update functional block passed the updated edge messages to the symbol sequence estimate and symbol node update functional block.

Again, it is noted that the symbol sequence estimate and symbol node update functional block uses the initial conditions of the LLR bit edge message during its first iteration of the iterative decoding processing. It also uses the initially received symbol metric value during subsequent iterations of the iterative decoding processing. The symbol sequence estimate and symbol node update functional block initially performs computation of the possible soft symbol estimates. Then, the symbol sequence estimate and symbol node update functional block uses this information to assist in the updating of the edge messages. More specifically, the symbol sequence estimate and symbol node update functional block updates the bit edge messages using the computed symbol metric (from the m-bit symbol metric computer) combined with the bit edge message passed by the last iteration from the check node update functional block. From one perspective, this shows the hybrid decoding functionality such that a combined use of bit level information and symbol level information are both used in a manner that (as is also described below) that provides a significant reduction in complexity and ease of implementation while providing performance that may be as good as the symbol decoding approach in some embodiments. In general, the performance of the hybrid decoding approach is as good as or worse than the symbol decoding approach; however, the hybrid decoding approach may be implemented significantly easier than the symbol decoding approach (e.g., with significantly reduced processing, memory, and memory management resources).

The iterative decoding processing continues between the symbol sequence estimate and symbol node update functional block and the check node update functional block such that the edge messages are continually, successively and alternatively updated in an effort to converge on a final value of the bit edge messages (either after performing a predetermined number of iterations or after a sufficient degree of accuracy is achieved and the bit edge messages have converged on a final value, that meets the sufficient degree of accuracy). The updating is successive and alternative from the perspective that the symbol sequence estimate and symbol node update functional block performs an updating, and then the check node update functional block performs an updating, and then the iterative decoding processing continues.

During a last decoding iteration, the symbol sequence estimate and symbol node update functional block may be implemented to perform an estimate of the symbols using the possible soft symbol estimates that have been calculated. This soft symbol estimate is then output from the symbol sequence estimate and symbol node update functional block to a hard limiter where hard decisions may be made for the individual bits within the soft symbol estimate. This final output may be viewed as being the individual bit estimates of the bits within the symbol that is being decoded using the hybrid decoding approach. That is to say, the hard limiter makes bit estimates based on the best estimate for each of the symbols such that the bit estimates are hard decisions for each of the individual bits of those respective symbols.

In one implementation (described here with respect to the FIG. 27), these iterative decoding processing steps, performed by the symbol sequence estimate and symbol node update functional block and the check node update functional block, are repeated a predetermined number of iterations (e.g., repeated n times, where n is selectable).

Figure 28:
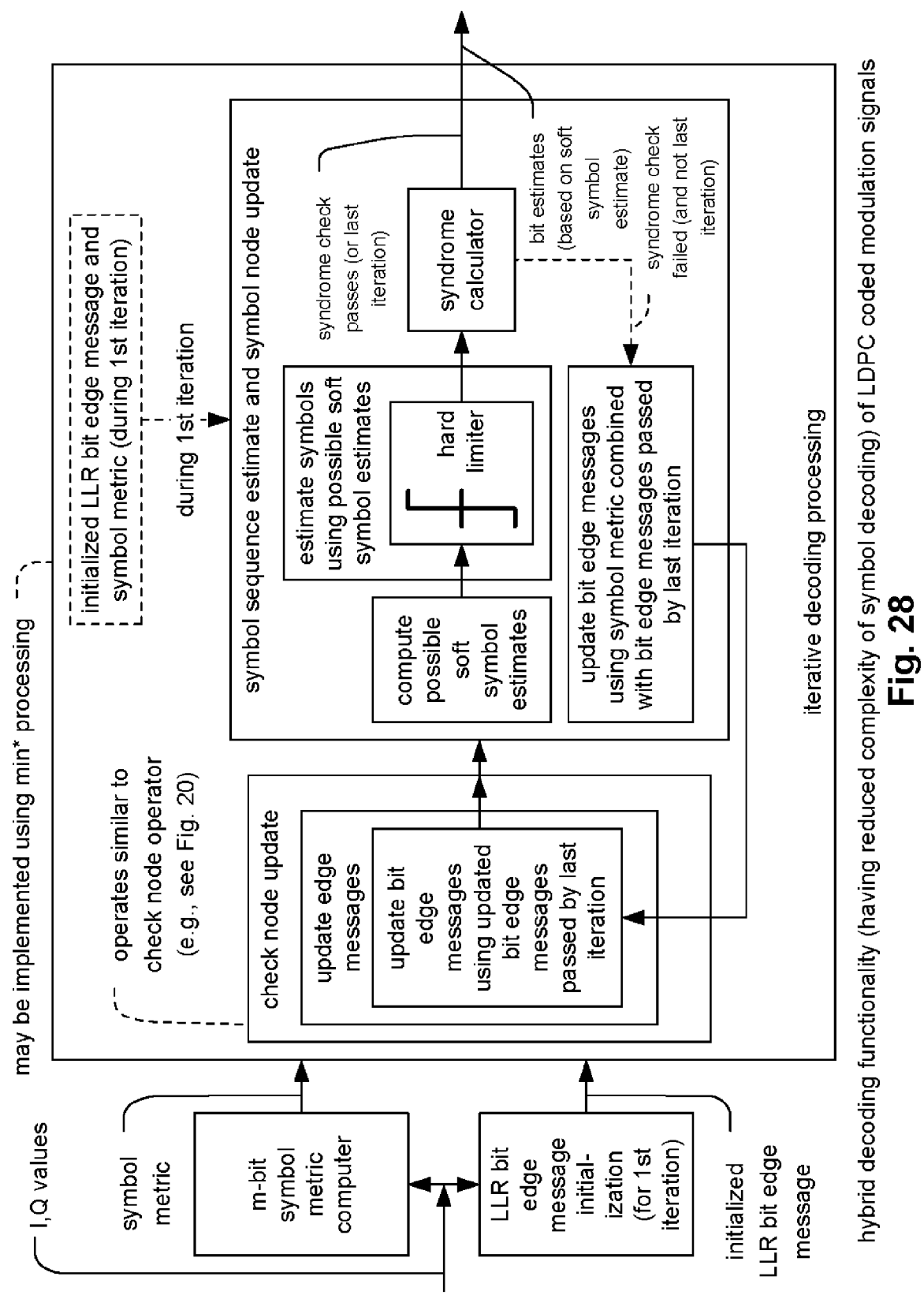
FIG. 28 is a diagram illustrating another embodiment of hybrid decoding functionality (having a reduced complexity when compared to symbol decoding) of LDPC coded modulation signals according to the invention.

FIG. 28 is a diagram illustrating another embodiment of hybrid decoding functionality (having a reduced complexity when compared to symbol decoding) of LDPC coded modulation signals according to the invention. In this alternative implementation, these iterative decoding processing steps are repeated until the syndromes of the LDPC code are all equal to zero (within a certain degree of precision). As mentioned above, soft symbol estimate is generated within the symbol sequence estimate and symbol node update functional block. This soft output information may be provided to a hard limiter where hard decisions may be made, and that hard information may be provided to a syndrome calculator to determined whether the syndromes of the LDPC code are all equal to zero (within a certain degree of precision). When they are not, a syndrome check failed signal may be provided to the iterative decoding processing functional block (and when it is determined that this decoding iteration is not the last decoding iteration), and the iterative decoding processing continues again by appropriately updating and passing the bit edge messages between the check node update functional block and the symbol sequence estimate and symbol node update functional block. After all of these iterative decoding processing steps have been performed, then the best estimates of the bits are output based on the soft symbol estimates. It is also noted that some additional decisions and/or operations may be implemented when the situation arises where the syndromes of the LDPC code are not converging substantially to zero (within a certain degree of precision) and yet the last decoding iteration has in fact been performed.

This functionality diagrams described above with respect to the FIG. 27 and the FIG. 28 show at least two possible ways in which the hybrid decoding approach may be performed to allow for the decoding of LDPC coded signals using both bit level and symbol level information (e.g., thereby being hybrid).

Several different examples of how to perform the decoding of various types of LDPC coded signals (e.g., including straight-forward LDPC coded signals, LDPC coded modulation signals, LDPC variable modulation signal, LDPC variable code rate signals, and so on), each of these various approaches to decoding of such LDPC coded signals may benefit from the simultaneous and parallel processing nature of updating the edge messages. Initially, an approach is presented by which LDPC bit-check parallel decoding can be performed. Each of the other various types of LDPC decoding (e.g., bit only decoding (with bit metric updating), symbol decoding, and hybrid decoding) are also presented showing the simultaneous and parallel processing nature of updating the edge messages therein.

Before some of the details of this novel decoding approach are presented, some aspects of parallel-block LDPC coded signals are presented. It is noted here that a typical bit LDPC coded signal may also be viewed as being a block-parallel LDPC coded signal with each block (from the viewpoint of a parallel-block LDPC coded signal) as having a singular element.

One of the advantages of using LDPC coded signals in various types of communication systems (several of which are described above) is that the iterative decoding processing of the LDPC coded signal can be carried out in parallel. That is to say, the updating of the edges messages may be carried out in parallel and simultaneously for all of the bit nodes and for all of the check nodes. In various embodiments described below, the edge message update processor at the bit node is referred to as the bit engine processor, and the edge message update processor at the check node is referred to as the check engine processor. If an LDPC coded signal has N bit nodes and R check nodes, one can have N bit engine processors running in parallel, as well as R check engine processors running in parallel. However, when N is very large, with today's technology, it can be too expensive to have such a large parallel processing implementation.

One way to reduce the processing requirements (and therefore the relatively high implementation costs) is to employ parallel-block LDPC coded signals. The properties of such block LDPC coded signals are defined as follows:

Let p be a positive integer and let N=pn and R=pr.

1. Partition N bit nodes $0, \ldots, pn-1$ into n sub-blocks such that every block has p elements. Denote the i-th block by $B_i$ with the bit nodes $b_{i,0}, \ldots, b_{i,p-1}$ in it, where $i=0, \ldots, n-1$. We call $B_i$ bit-block node.

2. Partition R check nodes $0, \ldots, pr-1$ into k blocks such that every block has p elements. Denote the i-th block by $C_i$ with the check nodes $c_{i,0}, \ldots, c_{i,p-1}$, where $i=0, \ldots, r-1$. We call $C_i$ the check-block node.

3. The block-bipartite graph is constructed between n bit-block nodes and r check-block nodes with the following properties. If $B_i$ and $C_j$ are connected in the graph, then there is a permutation $\pi_{i,j}$ of $\{0, 1, \ldots, p-1\}$ such that $(b_{i,k}, c_{j,\pi_{ij}(k)})$, $k=0, \ldots, p-1$ are the edges in the bit bipartite graph of the bit LDPC code. Here some bit to check edges in a block may not be existent in the actual bit bipartite graph. Therefore, if such a case arises, then those edges are not real. Moreover, the parallel edges in the block-bipartite graph are allowed. However, with the parallel edges, the corresponded permutations must be different to accommodate that situation. To illustrate these characteristics, a particular example is provided below (with respect to the FIG. 33) to illustrate the characteristics of a parallel-block LDPC coded signal. However, before that, the manner of setting up for performing LDPC bit-check parallel decoding as well as some generalized embodiments of some of the aspects of LDPC bit-check parallel decoding functionality are described firstly below (e.g., see FIG. 29, FIG. 30, FIG. 31A, FIG. 31B, and FIG. 32).

Figure 29:
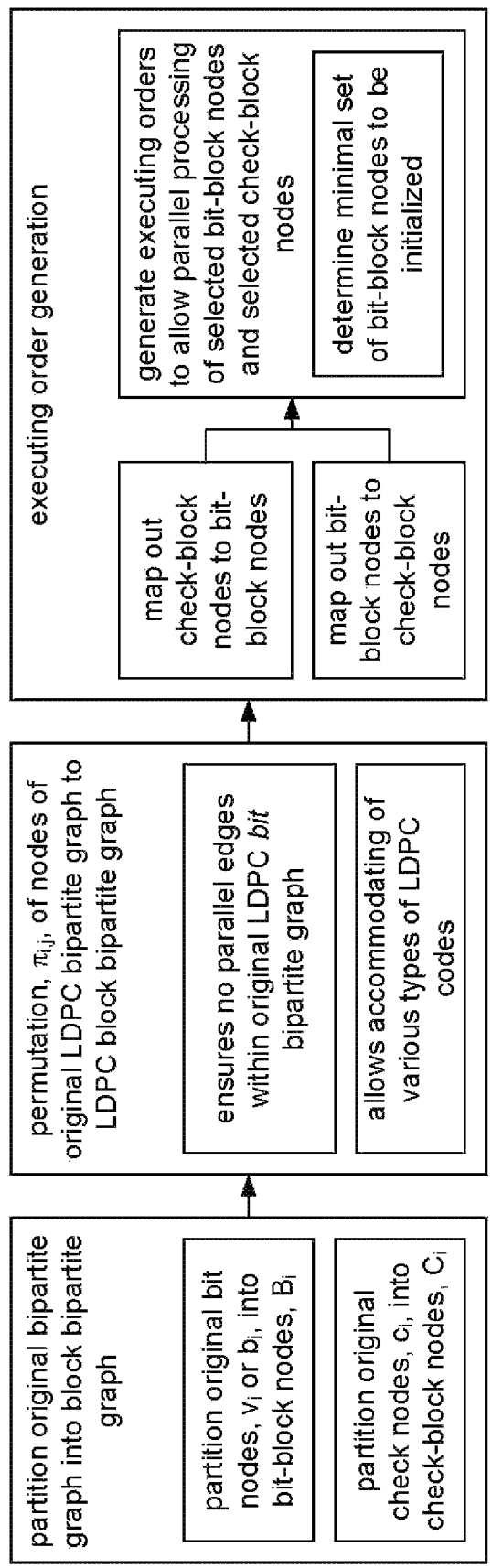
FIG. 29 is a diagram illustrating an embodiment of LDPC bit-check parallel decoding set up that is performed according to the invention.

FIG. 29 is a diagram illustrating an embodiment of LDPC bit-check parallel decoding set up that is performed according to the invention. In order to perform LDPC bit-check parallel decoding, an original bipartite graph is partitioned into a block bipartite graph. The original bit nodes, $b_i$ (or variable nodes, $v_i$) are partitioned into bit-block nodes, $B_i$. Similarly, the original check nodes, $c_i$, are also partitioned into check-block nodes, $C_i$. The manner in which the bit nodes (or variable nodes) were connected to the check nodes within the original LDPC bipartite graph is translated, using a permutation $\pi_{i,j}$, to the manner in which the bit-block nodes are connected to the check-block nodes within the generated LDPC block-bipartite graph. The use of this permutation, $\pi_{i,j}$, ensures the continuation of the non-existence of any parallel edges within the original LDPC bit bipartite graph. That is to say, the use of the permutation, $\pi_{i,j}$, ensures that the no parallel will exist within the original LDPC bipartite graph when converting to the "LDPC block-bipartite graph" domain to perform the LDPC bit-check parallel decoding. There may be cases where the LDPC block-bipartite graph actually does have some parallel edges, but the use of the permutation, $\pi_{i,j}$, ensures that there will not be any parallel edges within the LDPC bipartite graph. Generally speaking, the use of various values of the permutation, $\pi_{i,j}$, ensures govern the manner in which the edges are updated when performing the iterative decoding processing.

By using various values of a permutation, $\pi_{i,j}$, the LDPC bit-check parallel decoding functionality presented herein is thereby capable of accommodating a wide variety of original LDPC codes. That is to say, any of a wide variety of types of LDPC bipartite graphs may be linked to a wide variety of types of LDPC block-bipartite graphs thereby broadening the range of LDPC codes that may be processing according to various aspects of the invention. The permutation, $\pi_{i,j}$, allows the translation between the original LDPC bipartite graph and the LDPC block-bipartite graph so that various types of LDPC codes may be accommodated. It is noted that the permutation, $\pi_{i,j}$, may be designed a number of different ways. One way of generating a permutation, $\pi_{i,j}$, is to employ cyclical shifts to translate between the original bit LDPC bipartite graph and the generated LDPC block-bipartite graph. Again, the use of the permutation, $\pi_{i,j}$, allows a great deal of freedom to choose any of various types of LDPC codes. In short, the use of a permutation, $\pi_{i,j}$, allows a user to use a wider variety of types of LDPC codes (e.g., the selection of which LDPC code that can be used when performing LDPC bit-check parallel decoding is not fixed). Clearly, different permutations may be employed when translating between different original LDPC bipartite graphs to various generated LDPC block-bipartite graphs.

Thereafter, executing orders are generated. This generation of executing orders involves mapping out the connections between all of the check-block nodes to all of the bit-block nodes within the newly generated LDPC block-bipartite graph. In addition, this generation of executing orders involves mapping out the connections between all of the bit-block nodes to all of the check-block nodes. These respective mappings may be categorized in tabular format, as is shown below in some various alternative embodiments. Using these various mappings for all of the connections between the bit-block nodes to all of the check-block nodes and for all of the connections between the check-block nodes to all of the bit-block nodes, the actual executing orders may be generated. These executing orders allow for the parallel processing and updating of edges (of the LDPC block-bipartite graph) in accordance with the LDPC bit-check parallel decoding.

It is noted that the selection of these executing orders is performed by a designer of the LDPC bit-check parallel decoding functionality. That is to say, a designer needs to select the particular executing orders in order to effectuate the LDPC bi-check parallel decoding processing. This selection of the executing orders may be viewed as one of the most difficult and arduous tasks of designing LDPC bit-check parallel decoding functionality. When generating these executing orders, this functionality also involves determining a minimal set of bit-block nodes to be initialized to help effectuate the parallel decoding processing of simultaneous processing of edge corresponding to at least one bit-block node and at least one check-block node.

FIG. 30 is a diagram illustrating an embodiment of LDPC bit-check parallel decoding functionality that operates according to the invention. This diagram of LDPC bit-check parallel decoding functionality first shows how edge messages corresponding to a minimal set of bit-block nodes are initialized before continuing on and performing the parallel decoding processing; this is shown as being performed during a time 0.

Once the edges corresponding to this minimal set of bit-block nodes have been initialized during this time 0, the parallel decoding processing begins starting with a time 1. The use of various values of a permutation, $\pi_{i,j}$, are employed in this embodiment to govern the manner in which edges are processed according to this parallel decoding processing.

The simultaneous and parallel processing of edges of a 1$^{st}$ at least one check-block node(s) and processing of edges of a 1$^{st}$ at least one bit-block node(s) is performed. It is noted that edges corresponding to as few as 1 check-block node and edges corresponding to as few as 1 bit-block node may be processed during this time 1. Once these particular edge(s) with respect to bit-block nodes and edge(s) with respect to check-block nodes, they are then available for use within the other corresponding functional blocks during subsequent time periods.

For example, once the edges corresponding to a particular bit-block node have been updated during the time 1, these edges are available for processing with respect to any of various check-block nodes during subsequent times (e.g., time 2 and later). The converse of this is also true; once the edges corresponding to a particular check-block node have been updated during the time 1, these edges are available for processing with respect to any of various bit-block nodes during subsequent times (e.g., time 2 and later). The intelligent and appropriate design of the executing orders ensures that the appropriate edges with respect to the both bit-block nodes and edges with respect to check-block nodes are available for subsequent decoding iterations. This parallel processing (of updating edges with respect to bit-block nodes and updating edges with respect to check-block nodes) is performed a number of times (e.g., from time 1 to time 2 . . . to time n).

After a number of parallel decoding iterations, the bit-block nodes(s) (e.g., the bits) are re-ordered based on the executing orders that have been employed to support the parallel decoding processing described above. That is to say, the use of the various values of the permutation, $\pi_{i,j}$, that have been employed to govern the processing (e.g., the accessing, re-ordering, and processing/updating) of the edges according to the executing orders and more specifically the use of the executing orders according to the LDPC block-bipartite graph inherently performed some re-ordering of the bit-block nodes(s) during the parallel processing. This final functional block performs the re-ordering of the bit-block nodes(s) such that the bit-block nodes(s) are in an appropriate order form which best estimates can be made of the information bits included within a codeword extracted from a received signal that is being decoded according to these corresponding principles of the invention.

For example, the re-ordering may be viewed as getting the bits back to an appropriate order such that they may be output from the executing order controlled edge message updating functional block in the appropriate order in which the data (that was originally encoded into the LDPC signal) is now being decoded. For example, this re-ordering of the bits is performed before extracting the bit soft information and outputting the soft estimates of the bits of a symbol of a sequence of discrete-valued modulation symbols generated from a received LDPC coded signal. Bit soft information is thereafter extracted from the bits that have been appropriately re-ordered to undo the ordering effects that the executing orders had thereon. From this bit soft information, best estimates are made of the one or more information bits within the original LDPC signal that is being decoded.

The following two diagrams are provided to show, in greater detail, some possible examples by which actual connectivity may be made between the individual check nodes that have been grouped to form a check block node j and the individual bit nodes that have been grouped to form a bit block node i. It is noted that these example embodiments are simply illustrative of some ways in which the individual check nodes within a check block node and the individual bit block nodes within a bit block nodes may be communicatively coupled according to a permutation, $\pi_{i,j}$. Clearly, many other embodiments showing communicatively coupling in different manners may also fall under the scope of the invention.

These various links between the individual check nodes within a check block node and the individual bit nodes within a bit block node (as denoted by various permutation values, $\pi_{i,j}^1$ and $\pi_{i,j}^2$) show the linkage between the LDPC block-bipartite graph and the LDPC bipartite graph (which has no parallel edges). Each of these examples is a permutation, $\pi$, of $\{0, 1, 2, \ldots, n\}$ as being a one to one (1 to 1) mapping on $\{0, 1, 2, \ldots, n\}$.

FIG. 31A is a diagram illustrating an embodiment of an example permutation, $\pi_{i,j}^1$, providing linkage between LDPC block bipartite graph and LDPC bipartite graph according to the invention. In this example, the permutation is defined as being a map, $\pi_1$, of $\{0, 1, 2, \ldots, n\}$ as defined by the following:

$$\pi_1(0)=1, \pi_1(1)=3, \pi_1(2)=0, \pi_1(3)=4, \text{ and } \pi_1(4)=2.$$

This is a permutation which can be denoted by (01342).

According to this permutation, the individual check nodes within the check-block node j are connected to the individual bit nodes within the bit-block node i as follows:
1. check node $j_0$ connects to bit node $i_2$.
2. check node $j_1$ connects to bit node $i_0$.
3. check node $j_2$ connects to bit node $i_4$.
4. check node $j_3$ connects to bit node $i_1$.
5. check node $j_4$ connects to bit node $i_3$.

FIG. 31B is a diagram illustrating another embodiment of an example permutation, $\pi_{i,j}^2$, providing linkage between LDPC block bipartite graph and LDPC bipartite graph according to the invention. In this example, the permutation is defined as being a map, $\pi_2$, of $\{0, 1, 2, \ldots, n\}$ as defined by the following:

$$\pi_2(0)=4, \pi_2(1)=0, \pi_2(2)=1, \pi_2(3)=2, \text{ and } \pi_2(4)=3.$$

This is a permutation which can be denoted by (04321). This permutation, $\pi_{i,j}^2$, is also a cyclic shift permutation.

According to this permutation, the individual check nodes within the check-block node j are connected to the individual bit nodes within the bit-block node i as follows:
1. check node $j_0$ connects to bit node $i_1$.
2. check node $j_1$ connects to bit node $i_2$.
3. check node $j_2$ connects to bit node $i_3$.
4. check node $j_3$ connects to bit node $i_4$.
5. check node $j_4$ connects to bit node $i_0$.

Even in the event that it is supposed that the check-block j and the bit-block i have 2 parallel edges (e.g., two separate edge connection from a single check-block node to a single bit-block node), then the use of either of these two different permutations, $\pi_{i,j}^1$ or $\pi_{i,j}^2$ (that direct the connectivity between the individual check nodes within the check-block node j are connected to the individual bit nodes within the bit-block node i as indicated in the FIG. 31A and the FIG. 31B, respectively) ensures that there is no parallel edges between the check nodes and the bit nodes contained within the check-block node j and the bit-block node i, respectively. As mentioned also above, the use of a permutation, $\pi_{i,j}$, ensures that no parallel edges exist within the LDPC bit bipartite graph (e.g., the original LDPC bipartite graph) even though they may in fact exist within the LDPC block bipartite graph.

FIG. 32 is a diagram illustrating an alternative embodiment of LDPC bit-check parallel decoding functionality that operates according to the invention. This decoding functionality is similar to that describe in the embodiment above within the FIG. 30 up to the time n.

For example, the diagram of LDPC bit-check parallel decoding functionality also first shows how edge messages corresponding to a minimal set of bit-block nodes are initialized before continuing on and performing the parallel decoding processing; this is shown as being performed during a time 0.

Also in similar manner as within the embodiment of the FIG. 30, once the edges corresponding to this minimal set of bit-block nodes have been initialized during this time 0, the parallel decoding processing begins starting with a time 1. The use of various values of a permutation, $\pi_{i,j}$, are employed in this embodiment to govern the manner in which edges are processed according to this parallel decoding processing.

The simultaneous and parallel processing of edges of a $1^{st}$ at least one check-block node(s) and processing of edges of a $1^{st}$ at least one bit-block node(s) is performed. It is noted that edges corresponding to as few as 1 check-block node and edges corresponding to as few as 1 bit-block node may be processed during this time 1. Once these particular edge(s) with respect to bit-block nodes and edge(s) with respect to check-block nodes, they are then available for use within the other corresponding functional blocks during subsequent time periods.

For example, once the edges corresponding to a particular bit-block node have been updated during the time 1, these edges are available for processing with respect to any of various check-block nodes during subsequent times (e.g., time 3 and later). The converse of this is also true; once the edges corresponding to a particular check-block node have been updated during the time 1, these edges are available for processing with respect to any of various bit-block nodes during subsequent times (e.g., time 2 and later). The intelligent and appropriate design of the executing orders ensures that the appropriate edges with respect to the both bit-block nodes and edges with respect to check-block nodes are available for subsequent decoding iterations. This parallel processing (of updating edges with respect to bit-block nodes and updating edges with respect to check-block nodes) is performed a number of times (e.g., from time 1 to time 2 . . . to time n).

However, the last functional blocks of this diagram differ from the immediately preceding embodiment. In this embodiment, after a number of parallel decoding iterations have been performed, at least one additional decoding iteration is performed without executing order control. This performing of at least one additional decoding iteration inherently re-orders the bit block node(s) (e.g., the bits) whose order may have undergone some ordering according to the executing orders employed to support the parallel decoding processing.

This last additional decoding iteration may be viewed as performing the LDPC decoding without the auspices of the LDPC block-bipartite graph. That is to say, this last decoding iteration is performed solely as using an LDPC decoding approach (e.g., not performing a LDPC bit-check parallel decoding approach). In other words, the edge messages are processed with respect to the individual check nodes within the LDPC bipartite graph (e.g., not with respect to the check-block nodes within the LDPC block-bipartite graph), and the edge messages are then processed with respect to the individual bit nodes within the LDPC bipartite graph (e.g., not with respect to the bit-block nodes within the LDPC block-bipartite graph).

This final decoding iteration is not performed in parallel, and this leads to a certain degree of latency in the overall decoding processing.

However, although this final decoding iteration is not performed in parallel, it nevertheless alleviates the need to re-order the bit-block nodes(s) (e.g., the bits) based on the executing orders that have been employed to support the parallel decoding processing. After this final decoding iteration has been performed without the auspices of executing order control, there is no need to perform any re-ordering of the bit-block nodes(s) (e.g., the bits) before extracting the bit soft information and outputting the soft estimates of the bits of a symbol of a sequence of discrete-valued modulation symbols generated from a received LDPC coded signal. Bit soft information is thereafter extracted from the bits that are inherently appropriately re-ordered to correspond to the LDPC bipartite graph (thanks to this final decoding iteration that is performed without executing order control). From this bit soft information, best estimates are made of the one or more information bits within the original LDPC signal that is being decoded.

FIG. 33 is a diagram illustrating an embodiment of an LDPC block-bipartite graph that is arranged according to the invention. As can be seen within this diagram, the bit nodes are arranged into a number of bit-block nodes. For example, the original bit nodes, $b_0, b_2, \ldots, b_n$, are all arranged into the bit-block node, $B_1$, and the bit nodes, $b_k, b_{k+1}, \ldots, b_{k+(n-1)}$, are all arranged into the bit-block node, $B_c$. Similarly, the check nodes are arranged into a number of check-block nodes. For example, the original check nodes, $c_0, c_2, \ldots, c_n$, are all arranged into the check-block node, $C_1$, and the bit nodes, $b_k$, $b_{k+1}, \ldots, b_{k+(n-1)}$, are all arranged into the check-block node, $C_d$. The manner in which the edges within this LDPC block-bipartite graph are translated from an LDPC bipartite graph may be described as being a permutation, $\pi_{i,j}$. That is to say, the permutation, $\pi_{i,j}$, is the relation between the manner in which edges are connected between bit nodes and check nodes within an LDPC bipartite graph and the manner in which edges are connected between bit-block nodes and check-block nodes within an LDPC block-bipartite graph.

It is also noted that there are a variety of ways in which the original bit nodes may be partitioned into bit-block nodes, and there are also a variety of ways in which the original check nodes may be partitioned into check-block nodes. This is may be performed in an appropriate way as determined by a designer of such a system or method employing various aspects of the invention. Moreover, the selection of which type of permutation, $\pi_{i,j}$, should be employed is also at the discretion of the designer of such a system or method. In general, the designer must seek to ensure there are no parallel edges within the block-bipartite graph when selecting the permutation, $\pi_{i,j}$.

As mentioned above, an example is provided with respect to the FIG. 34 below to illustrate the characteristics of a parallel-block LDPC coded signal.

Figure 34:
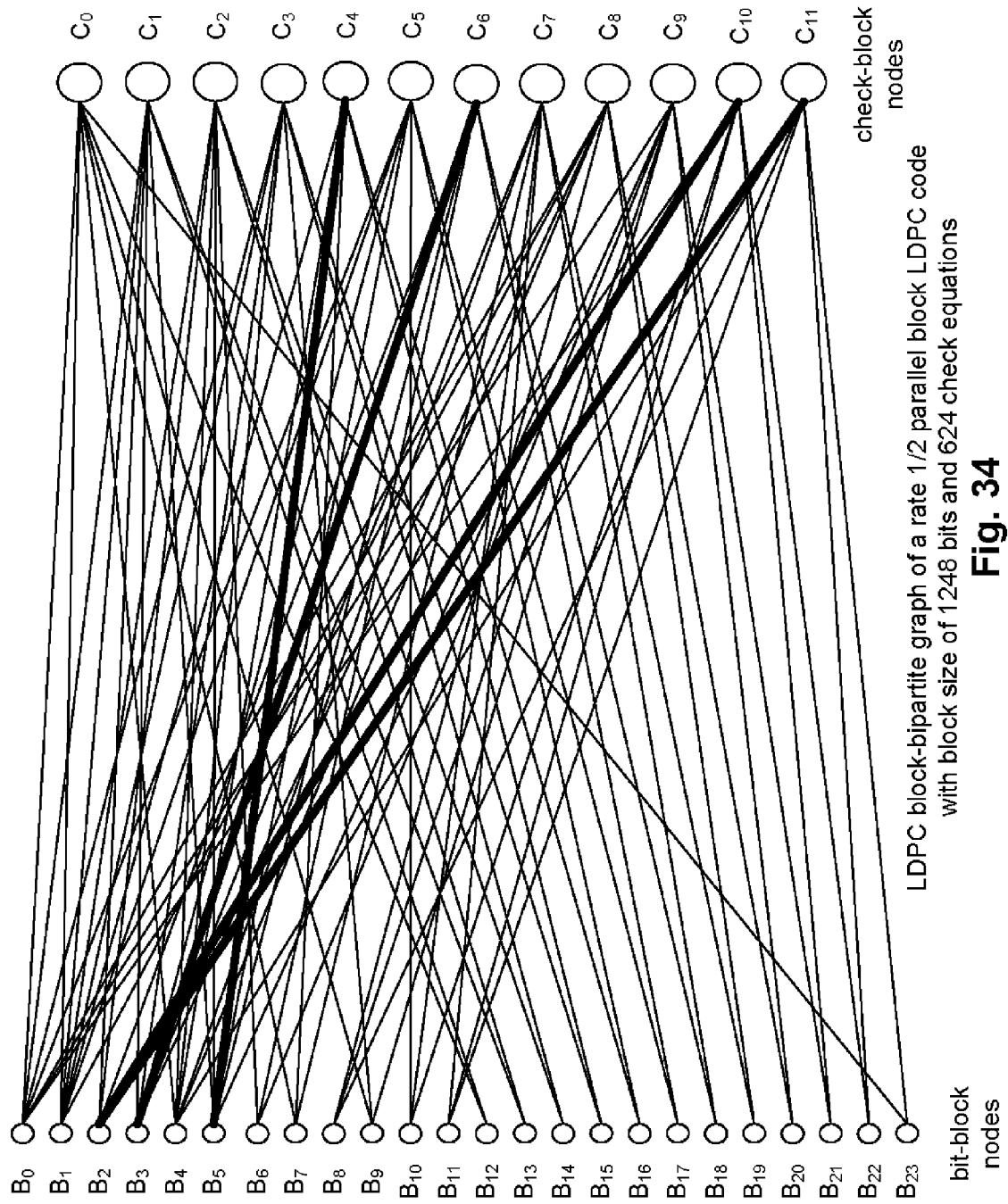
FIG. 34 is a diagram illustrating an embodiment of an LDPC block-bipartite graph of a rate ½ parallel block LDPC code with block size of 1248 bits and 624 check equations according to the invention.

FIG. 34 is a diagram illustrating an embodiment of an LDPC block-bipartite graph of a rate ½ parallel block LDPC code with block size of 1248 bits and 624 check equations according to the invention. In the graph, a dark edge represents the parallel edges. This diagram considers an example rate ½ LDPC code with bit length 1248 and 624 check equations. Let p=52. Then there are 24 bit-blocks (shown as $B_0$, $B_1, B_2, \ldots, B_{23}$) and 12 check-blocks (shown as $C_0, C_1$, $C_2, \ldots, C_{11}$). The first 12 bit-blocks are $B_i=\{52i, 52i+1, \ldots, 52(i+1)i-1\}$, $i=0, \ldots, 11$. The next 12 bit-blocks are characterized as $B_j=\{52j, 52j+12, 52j+24, \ldots, 52j+51\times12\}$, $j=0, \ldots, 11$. A pictorial illustration of this particular block-bipartite graph is given in the FIG. 34.

In this diagram, a dark edge represents the parallel edges. The permutation, $\pi_{i,j}$, of every edge is a cyclical shift which is listed below within the table of the FIG. 35.

FIG. 35 is a diagram illustrating a table showing permutations for all edges of the LDPC block-bipartite graph of the FIG. 34 according to the invention. Again, the permutation, $\pi_{i,j}$, of every edge is a cyclical shift as indicated in this Table 1 of this diagram. In the Table 1 shown in this diagram, if there is no number in a cell, this indicates that there is no connection between those particular nodes (e.g., no connection between the bit-block nodes and the check-block nodes), otherwise the number represents the depth of the cyclical shift. The two numbers represent the two cyclic shifts for parallel edges.

Some examples of parallel-block LDPC codes have been presented above (including regular LDPC codes where the each individual bit node is considered as being a bit-block node and each check node is considered as being a check-block node—e.g., each block has only one element). In addition, the LDPC codes used in the European standard of DVB-2 represent another example of parallel-block LDPC codes that may benefit from the various aspects of the invention. These LDPC codes are described in the following reference:

"Digital video broadcasting (DVB) second generation framing structure, channel coding and modulation system for broadcasting, iterative services, news gathering and other broadband satellite applications," ETSI EN 302 307, V1.1.1, 2004-01.

More examples of parallel-block LDPC codes can be found in the following 3 references:
1. H. Zhong and T. Zhang, "Design of VLSI implementation-oriented LDPC codes," *IEEE Semiannual Vehicular Technology Conference (VTC)*, October 2003.
2. S. J. Johnson and S. R. Weller, "Quasi-cyclic LDPC codes from difference families," *3rd AusCTW*, Canberra, Australia, Feb. 4-5, 2002.
3. F. Verdier and D. Declercq, "A LDPC parity check matrix construction for parallel hardware decoding," *3rd International Symposium on Turbo-Codes & Related Topics Brest*, France, September 2003.

Moreover, as briefly mentioned above, it is noted that a conventional bit LDPC code itself can be considered as a block-parallel LDPC code with every block having only one (1) element. Therefore, in the remainder of this description, the terminology of parallel-block LDPC coded signals may be viewed as representing both bit LDPC codes and parallel-block LDPC codes (where bit LDPC codes simply being one type of parallel-block LDPC code).

Also, the various communication system and device embodiments that are represented above illustrate the general encoding of signals according to LDPC encoding. Any of these various embodiments that include performing LDPC encoding may be viewed as generating parallel-block LDPC coded signals as well. Therefore, any of the various embodiments that illustrate LDPC bit-check parallel decoding may be viewed as operable to decode both bit LDPC coded signals and parallel-block LDPC coded signals. Again, a general LDPC coded signal may be viewed as being a one particular type of parallel-block LDPC coded signal (e.g., where every block includes only one (1) element).

The operation of a non-bit-check parallel approach to decoding of LDPC coded signals is initially presented here for useful comparison to the bit-check parallel decoding approach that is presented in greater detail below.

The non-bit-check parallel approach to decoding of LDPC coded signals is presented here:
1. For $i=0, \ldots, n-1$, carry p bit engines in parallel to update the edge message for all the bit-block node $B_i$ (which includes initialization of the edge messages with the bit metrics);
2. For $i=0, \ldots, r-1$, carry p check engines in parallel to update the edge message for check-block node $C_i$;
3. If the number of iterations does not meet the limit (of total number of decoding iterations to be performed), then the decoding goes back to step 1. Otherwise, hard decisions are made based on soft information corresponding to the edge messages, and a best estimate of a codeword is made and subsequently output.

An alternative to step 3 shown above may be performed as follows:

Hard decisions may be performed to produce the estimated codeword (corresponding to a particular decoding iteration), and the decoding is performed to carry the syndrome check to it. If the estimated codeword does not pass the syndrome check, then the decoding goes back to step 1. Otherwise, a best estimate of a codeword is made and subsequently output.

In this non-bit-check parallel to decoding of LDPC coded signals, the check engine processors start processing after all of the edge messages are obtained by the bit engine processors. Usually, the edge messages are stored in one memory, such as RAM (Random Access Memory), where the p values of edge messages corresponding to edge $(B_i,C_j)$ are grouped together. This non-bit-check parallel approach to decoding of LDPC coded signals (or parallel-block LDPC coded signals), operates by updating all of the edges of one or more bit-block nodes (step 1 above), then updating all of the edges of one or more check-block nodes (step 2 above), and then alternatively repeating these steps (step 1 and step 2 above). There is no parallel operation such that some of the edges of any bit-block can be updated simultaneously with the edges of any check-block. Steps 1 and 2 cannot be performed simultaneously in the non-bit-check parallel approaches to decoding of LDPC coded signals.

That is to say, within this immediately above-described non-bit-check parallel approach to decoding of LDPC coded signals, the check engine processors and the bit engine processors are not operating simultaneously and in parallel. The operational steps 1 and 2 presented just above are not performed simultaneously and in parallel.

A novel approach to decoding is now presented herein by which the operational steps 1 and 2 presented just above can in fact be performed simultaneously and in parallel. Various systems and method for performing LDPC bit-check parallel decoding are presented here.

To ease this presentation, an example is provided using the same LDPC code that is also described above. The code has 1248 bits grouped to 24 bit-blocks (shown as $B_0, B_1, B_2, \ldots, B_{23}$) and 12 check-blocks (shown as $C_0, C_1, C_2, \ldots, C_{11}$) as presented above. Every check node, except for the first check node, has a degree of 7. Therefore, as indicated in the Table 2 of the FIG. 35 (block-bipartite graph of a rate ½ parallel block LDPC code), every check-block node connects 7 bit-block nodes.

The following Table 2 (shown within FIG. 35) gives such connections.

FIG. 36 is a diagram illustrating a table showing the mapping of check-block node to bit-block node edges of the LDPC block-bipartite graph of the FIG. 33 according to the invention. This Table 2 provides the particular connections between the check-block nodes and the bit-block nodes according to the particular original LDPC code employed and the permutation, $\pi_{i,j}$, that translates the original bit LDPC bipartite graph to the LDPC block-bipartite graph. As a first example, the check-block node, $C_0$, is connected to each of the bit-block nodes, $B_0$, $B_1$, $B_4$, $B_7$, $B_9$, $B_{12}$, $B_{23}$. Other connections between other check-block nodes and bit-block nodes may similarly be found within this Table 2.

The correspondence of the bit-block to check-block relationship of the above described Table 2 may be swapped to generate the Table 3 (shown within FIG. 37).

FIG. 37 is a diagram illustrating a table showing the mapping of bit-block node to check-block node edges of the LDPC block-bipartite graph of the FIG. 34 according to the invention. This Table 3 provides the particular connections between the bit-block nodes and the check-block nodes according to the particular original LDPC code employed and the permutation, $\pi_{i,j}$, that translates the original bit LDPC bipartite graph to the LDPC block-bipartite graph. As a first example, the bit-block node, $B_0$, is connected to each of the check-block nodes, $C_0$, $C_1$, $C_3$, $C_5$, $C_8$, $C_9$, $C_{10}$. Other connections between other bit-block nodes and check-block nodes may similarly be found within this Table 2.

Based on the above two tables (Table 2 and Table 3 shown within the FIG. 36 and the FIG. 37, respectively), and the assumption that a bit engine processor and a check engine processor use substantially the same time to update an edge message, a table of executing orders may be generated (as shown below in Table 4 (shown within FIG. 38). In this Table 4, the operation of both the bit engine processor and the check engine processor of the corresponding bit-block node and check-block nodes of the same row are operable to update the edge messages simultaneously and in parallel to one another.

FIG. 38 is a diagram illustrating a table showing executing orders that correspond to the LDPC block-bipartite graph of the FIG. 34 according to the invention. This Table 7 includes a minimal set of edges with respect to bit-block nodes that are initialized to support bit-check parallel decoding processing during subsequent decoding iterations according to this group of executing orders. Thereafter, edges with respect to check-block nodes and also edges with respect to check-block nodes may be updated simultaneously and in parallel.

Various criteria may be employed when selected the executing orders that may be used to perform the iterative decoding processing such that edges with respect to certain bit-block nodes and also certain check-block nodes may be processed simultaneously and in parallel. A concise approach by which such executing orders may be generated is provided below:

Criterion for Generating Executing Orders:

At the check-block node during iteration, i, if a check-block node, c, is in the k-th row, then all the bit-block nodes which are connected to the check-block node c (e.g., $b_0, \ldots, b_m$) should be as follows:

1. in the row indicated by $k-l_0, \ldots, k-l_m$, respectively, with $l_j > 0$. Moreover, those rows of the bit-block nodes should also have the same bit-block node iteration, i;

2. not in the rows before the k-th row with the bit-block node iteration number, i.

For example, this decision making criteria by which the executing orders may be designed may be better understood by looking at an example. When looking at the check-block node 10 at iteration 1. It is in the $14^{th}$ row. The bit-block nodes connected to this check-block nodes are as follows:

0, 2, 10, 11, 21, 22 where 0 is in the $2^{nd}$ row of the bit-block iteration 1

2 is in the $5^{th}$ row of bit-block iteration 1

10 is in the $4^{th}$ row of the bit-block iteration 1

11 is in the $8^{th}$ row of the bit-block iteration 1

21 is in the $7^{th}$ row of the bit-block iteration 1

22 is in the $8^{th}$ row of the bit-block iteration 1

Moreover, none of 0, 2, 10, 11, 21, 22 are in the rows before $14^{th}$ row with bit-block node iteration 2.

Using these appropriately constructed executing orders, the operation of the LDPC bit-check parallel decoding functionality using bit metric (e.g., as shown in one embodiment within the FIG. 47), may be constructed to operate as follows:

1. For an given iteration number 1, the decoder is operable to follow the executing orders table to update the edge messages corresponding to both bit-block nodes and check-block nodes simultaneously and in parallel;

2. Hard decisions are made based on the edge messages, and a best estimate of the codeword is made and subsequently output. Alternatively, after all of the bit engine processors have finished one decoding iteration, hard decision may be made and carried to perform the syndrome check (e.g., by the syndrome calculator). If the estimated codeword does not pass the syndrome check, then the decoding processing goes back to step 1. Otherwise, a best estimate of the codeword is made and subsequently output.

It is also noted here that the completion of various bit iterations and check iterations may not be completed synchronously. For example, in the executing orders of this particular embodiment, the bit iteration 1 is shown as being completed before 6 groups of time units before the check iteration 1 is shown as being completed. The completion of various bit iterations and check iterations can be completed alternatively and successively, as shown in this particular embodiment. This is in stark contrast to the prior art approaches by which a complete bit iteration is completed before a check iteration is begun, and by which a complete check iteration is completed before a bit iteration is begun.

Although it is possible to read from a memory, or to write to a memory, for two addresses at the same time (e.g., within dual access capable memory devices), a less complex and more inexpensive type of memory (e.g., only single access capable memory devices) may also be employed. It saves hardware if only one address is accessed to or from the memory at any given time, in that, cheaper single access capable memory devices may be employed. Using the simultaneous and parallel processing approach provided herein to perform decoding of parallel-block LDPC coded signals (including bit LDPC coded signals), only need two memories are needed, namely a left memory and a right memory (or alternatively referred to as a first memory and a second memory). Of course, a single memory (e.g., a dual access capable memory) may alternatively be employed that is logically partitioned into a left and right portion.

Using these two memories, step 1 of the above presented decoding approach is presented in greater detail with respect to Table 5 (shown in 4 parts within the FIG. 39, FIG. 40, FIG. 41, and FIG. 42) for the same ½ LDPC code that is defined previously.

FIG. 39, FIG. 40, FIG. 41, and FIG. 42 are diagrams illustrating tables showing various portions of an operation table indicating memory accesses that correspond to the LDPC block-bipartite graph of the FIG. 34 according to the invention. In these 4 diagrams that illustrate the Table 5, "L" refers to the left memory (e.g., a first memory) and "R" refers to a right memory (e.g., a second memory). Again, this left memory (e.g., a first memory) and right memory (e.g., a second memory) may also be simply logical partitions or portions of a single memory device (e.g., a dual access capable memory).

Some possible memory arrangement embodiments that support the processing steps of this Table 5 are also described in greater detail below within FIG. 53A and the FIG. 53B for various types of LDPC decoders as indicated therein.

The Table 5 shows that if I iterative decoding iterations are carried out, the bit-check parallel decoder needs $$84\left(I + \frac{1}{2}\right)$$

time units. Since the block-bipartite graph of the code has total 84 edges, the conventional decoder needs 2×84I=168I time units.

Thus, the LDPC bit-check parallel decoder saves (50−(50/I))% latency. When the number of iterations is more than 49, the new decoder gives about 49% saving. When I=50, then 42+84I=4242 and 168I=8420.

Therefore, in the time that a conventional type LDPC decoder has run only 26 iterations, an LDPC bit-check parallel decoder constructed according to the invention is able to finish all 50 LDPC bit-check decoding iterations. That means that such a LDPC bit-check parallel decoder operates at almost double the speed of a conventional type LDPC decoder.

In general, for decoding parallel-block LDPC coded signals (as well as for decoding bit LDPC coded signals), one can first generate the tables mapping the connections from bit-block nodes to check-block nodes and check-block nodes to bit-block nodes (e.g., as provided above within the Table 2 and the Table 3 of the FIG. 36 and the FIG. 37, respectively, for one particular example). Then, according to these two appropriately constructed tables and the degree property of the parallel-block LDPC code, another table may be generated to include the appropriate executing orders such that the edge messages may be updated with respect to the variable block-nodes (e.g., bit-block nodes in the example presented above) and with respect to the check-block nodes simultaneously and in parallel.

Using the executing order control operation as provided by such a table, an appropriately designed operation table for LDPC bit-check parallel decoding can be generated to control the manner in which edges are processed and memory is accesses. Then the bit-check parallel decoder can follow the operation table to decode the LDPC coded signal.

As an example, when considering a block-parallel LDPC code that has E edges and I iterations are needed for that code, then the LDPC bit-check parallel decoder needs at most E(I+1) time units while a conventional decoder needs 2×E×I time units. Therefore, the new LDPC bit-parallel decoder saves almost half the latency of a conventional LDPC decoder.

It is generally understood in the art that a bit engine processor typically is less complex than a check engine processor. Therefore, one can built a bit engine processor with a twice faster speed (2×) than that of a check engine processor. With this situation, one can generate another table (an alternative table) of executing orders that is operable to decode a code generated using the example provided above.

The Table 4 (shown within the FIG. 38) is designed based on the assumption that the check engine processor and the bit engine processor are able to process edge messages in substantially the same amount of time. However, the following Table 6 (shown in FIG. 43) is an alternatively generated table of executing orders for the same rate ½ LDPC code that is presented above except when using a bit engine processor with a twice faster speed (2×) than that of a check engine processor. That is to say, given the fact that the bit engine processor operates relatively faster than a check engine processor, a more appropriately tailored table of executing orders may be generated.

FIG. 43 is a diagram illustrating a table showing alternative executing orders (alternative to the FIG. 38) that correspond to the LDPC block-bipartite graph of the FIG. 34 according to the invention.

From the Table 6 and the Table 4 (shown within the FIG. 43 and FIG. 38, respectively) and the above description, it can be seen that if I iterations are carried out, the LDPC bit-check parallel decoder needs 24+168I time units, while the conventional decoder needs 84+2×84=252 time units to finish one iterative decoding iteration. Thus, it needs 252I time units to finish I iterations. Thus, when the number of iterative decoding iterations is more than 7, the LDPC bit-check parallel decoder saves more than 32% latency. When I=50, then 24+168I=8424 and 252I=12600, thus bit-check parallel decoder saves 33% latency. In other words while a conventional LDPC decoder has run 34 iterations, the new LDPC bit-check parallel decoder has already finished all 50 decoding iterations. Alternatively, this may be described by the fact that the LDPC bit-check parallel decoder could carry 20 more iterations than the conventional decoder does in the same time period.

In order to have the ordered date output, one may desire to combine the bit-check parallel decoder with the conventional decoder as follows:

1. For an given iteration number l, following the executing table to update edge messages;

2. The l+1-th iteration is carried out by convention decoder, i.e. firstly carry out bit engine processors' edge message updating followed by the check engine processors' edge message updating.

3. Hard decisions are made based on the edge messages and the estimated codeword is output. (Or after the all bit engine processors have finished one iteration, hard decisions are made and carried to the syndrome check processing (e.g., as by a syndrome calculator). If the codeword does not pass the syndrome check, then the decoding processing goes back to step 1. Otherwise, a best estimate of codeword is made and the estimated codeword is subsequently output.

Figure 44:
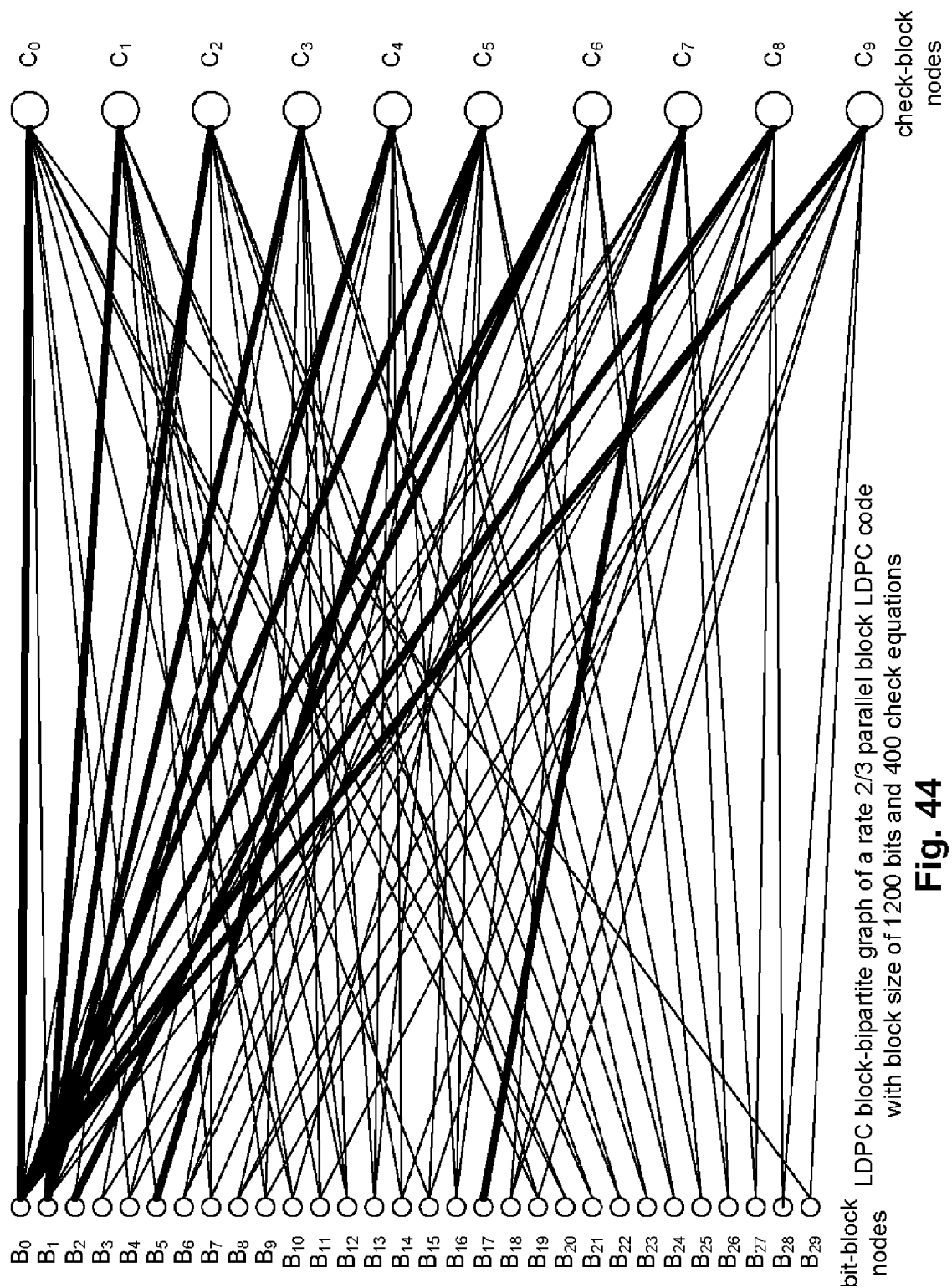
FIG. 44 is a diagram illustrating an embodiment of an LDPC block-bipartite graph of a rate $2/3$ parallel block LDPC code with block size of 1200 bits and 400 check equations according to the invention.

FIG. 44 is a diagram illustrating an embodiment of an LDPC block-bipartite graph of a rate ⅔ parallel block LDPC code with block size of 1200 bits and 400 check equations according to the invention. This example considers a rate ⅔ LDPC code with bit length 1200 and 400 check equations. This rate ⅔ LDPC code may be represented as follows:

Let p=40. Then there are 30 bit-blocks and 10 check-blocks. The first 20 bit blocks are $B_i$=(40i, 40i+1, . . . , 40(i+1)i−1), i=0, . . . , 20. The next 10 bit-block nodes are $B_j$=(40j, 40j+10, 40j+20, . . . , 40j+39×10), j=0, . . . , 9. The LDPC block-bipartite graph is provided pictorially in the FIG. 44. In the LDPC block-bipartite graph, a dark edge represents the parallel edges. The permutation of the edge (i,j) is represented as $\pi_{i,j}$. There are two edges between bit-block node 0 and the check-block node 0. There are three different permutations, namely $\pi_{0,0}^1$ and $\pi_{0,0}^2$ and Similarly there are different permutations:

$\pi_{0,5}^1, \pi_{0,5}^2, \pi_{0,6}^1, \pi_{0,6}^2, \pi_{0,8}^1, \pi_{0,8}^2, \pi_{0,9}^1, \pi_{0,9}^2$
$\pi_{1,1}^1, \pi_{1,1}^2, \pi_{1,1}^3, \pi_{1,2}^1, \pi_{1,2}^2, \pi_{1,3}^1, \pi_{1,3}^2, \pi_{1,4}^1, \pi_{1,4}^2, \pi_{2,6}^2,$
$\pi_{5,5}^1, \pi_{5,5}^2$
and $\pi_{17,7}^1, \pi_{17,7}^2, \pi_{17,7}^3$.

This particular LDPC code has 1200 bits grouped to 30 bit-block nodes and 10 check-block nodes as presented previously. Every check node, except the first check node, has a degree of 10. Therefore, as indicated in the corresponding LDPC block-bipartite graph, every check-block node connects 10 bit-block nodes. The Table 7 (shown within the FIG. 45) provides such connections.

FIG. 45 is a diagram illustrating a table showing the mapping of check-block node to bit-block node edges of the LDPC block-bipartite graph of the FIG. 44 according to the invention. Similar to the Table 2 provides above (within the FIG. 36 for another example), this Table 7 provides the particular connections between the check-block nodes and the bit-block nodes according to this particular original LDPC code employed and the permutation, $\pi_{i,j}$, that translates the original bit LDPC bipartite graph to the LDPC block-bipartite graph.

FIG. 46 is a diagram illustrating a table showing executing orders that correspond to the LDPC block-bipartite graph of the FIG. 44 according to the invention. Also similar to the other example embodiment described below, the generation of this Table 8 that includes execution orders that control the updating of edges corresponding to bit-block nodes and updating of edges corresponding to check-block nodes simultaneously and in parallel. As is also the case with respect to the embodiment described above, this Table 8 also includes a minimal set of edges with respect to bit-block nodes that are initialized to support bit-check parallel decoding processing during subsequent decoding iterations according to this group of executing orders. After the initialization of this minimal set of edges with respect to bit-block nodes, edges with respect to check-block nodes and also edges with respect to check-block nodes may be updated simultaneously and in parallel.

Figure 47:
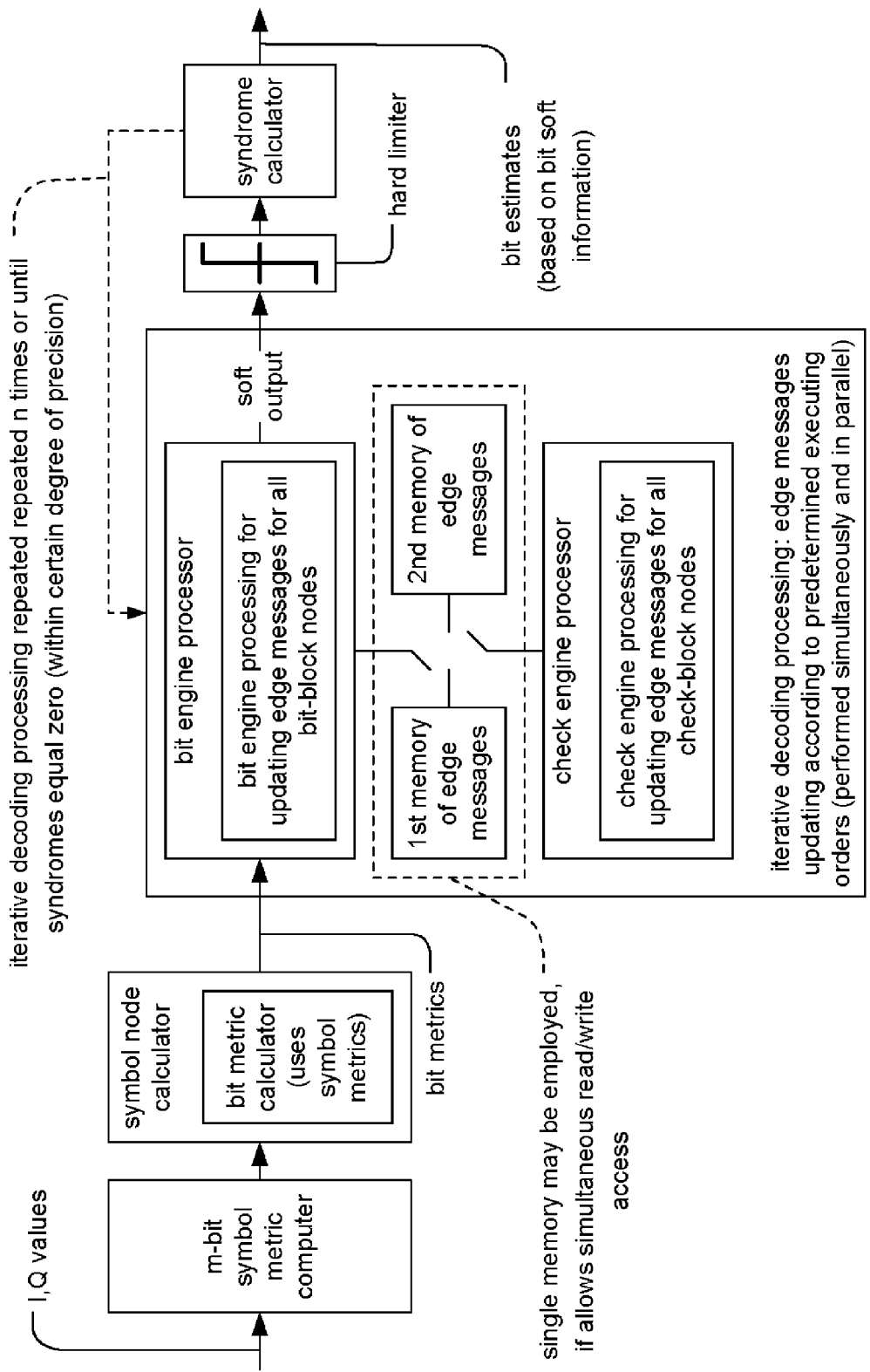
FIG. 47 is a diagram illustrating an embodiment of LDPC bit-check parallel decoding functionality using bit metric according to the invention.

FIG. 47 is a diagram illustrating an embodiment of LDPC bit-check parallel decoding functionality using bit metric according to the invention. Initially, before performing the iterative decoding processing that involves parallel processing of edges with respect to bit-block nodes and processing of edges with respect to check-block nodes (using at least one bit engine processor and at least one check engine processor), this embodiment operates similar to the embodiment described above with respect to FIG. 20.

For example, after receiving the I, Q values of a signal at the symbol nodes, an m-bit symbol metric computer functional block calculates the corresponding symbol metrics. At the symbol nodes, these symbol metrics are then passed to a symbol node calculator functional block that uses these received symbol metrics to calculate the bit metrics corresponding to those symbols. These bit metrics are then passed to the bit nodes connected to the symbol nodes.

The iterative decoding processing of this embodiment differs from that of the embodiment of the FIG. 20, in that, the updating of edge messages with respect to the bit-block nodes and the updating of the edge messages with respect to the check-block nodes are both performed simultaneously and in parallel. At least one bit engine processor and at least one check engine processor operate in cooperation to perform updating of edge messages with respect to bit-block nodes and check-block nodes, respectively. These at least one bit engine processor and at least one check engine processor also both use a $1^{st}$ memory of edge messages and a $2^{nd}$ memory of edge messages. Again, as mentioned within other embodiments, this $1^{st}$ memory and this $2^{nd}$ memory may be implemented as single access memory devices. Alternatively, this $1^{st}$ memory and this $2^{nd}$ memory may be implemented as logical partitions or portions within a dual access memory device. When a bit engine processor accesses the $1^{st}$ memory of edge messages, a check engine processor accesses the $2^{nd}$ memory of edge messages. For example, when the bit engine processor updates a first group of edge messages with respect to at least one bit-block nodes, the bit engine processor accesses the $1^{st}$ memory of edge messages, and when the check engine processor updates a first group of edge messages with respect to at least one check-block nodes, the check engine processor accesses the $2^{nd}$ memory of edge messages. Then, the update processing alternates: when the bit engine processor then updates a second group of edge messages with respect to at least one bit-block nodes, the bit engine processor accesses the $2^{nd}$ memory of edge messages. When the check engine processor updates a second group of edge messages with respect to at least one check-block nodes, the check engine processor accesses the $1^{st}$ memory of edge messages.

The iterative decoding processing may be repeated a predetermined number of iterations (e.g., repeated n times, where n is selectable). Alternatively, these iterative decoding processing steps are repeated until the syndromes of the LDPC code are all equal to zero (within a certain degree of precision).

Soft output information is generated within the bit engine processor during each of the decoding iterations. In this embodiment, this soft output may be provided to a hard limiter where hard decisions may be made, and that hard information may be provided to a syndrome calculator to determined whether the syndromes of the LDPC code are all equal to zero (within a certain degree of precision). That is to say, the syndrome calculator determines whether each syndrome associated with the LDPC code is substantially equal to zero as defined by some predetermined degree of precision. For example, when a syndrome has a mathematically non-zero value that is less than some threshold as defined by the predetermined degree of precision, then that syndrome is deemed to be substantially equal to zero. When a syndrome has a mathematically non-zero value that is greater than the threshold as defined by the predetermined degree of precision, then that syndrome is deemed to be substantially not equal to zero.

When the syndromes are not substantially equal to zero, the iterative decoding processing continues again by appropriately updating and passing the edge messages between the at least one bit engine processor and the at least one check engine processor. After all of these iterative decoding processing steps have been performed, then a best estimate of the bits (that cooperatively form a codeword) is output based on the bit soft information. In the approach of this embodiment, the bit metric values that are calculated by the symbol node calculator functional block are fixed values and used repeatedly in updating the bit node values.

Figure 48:
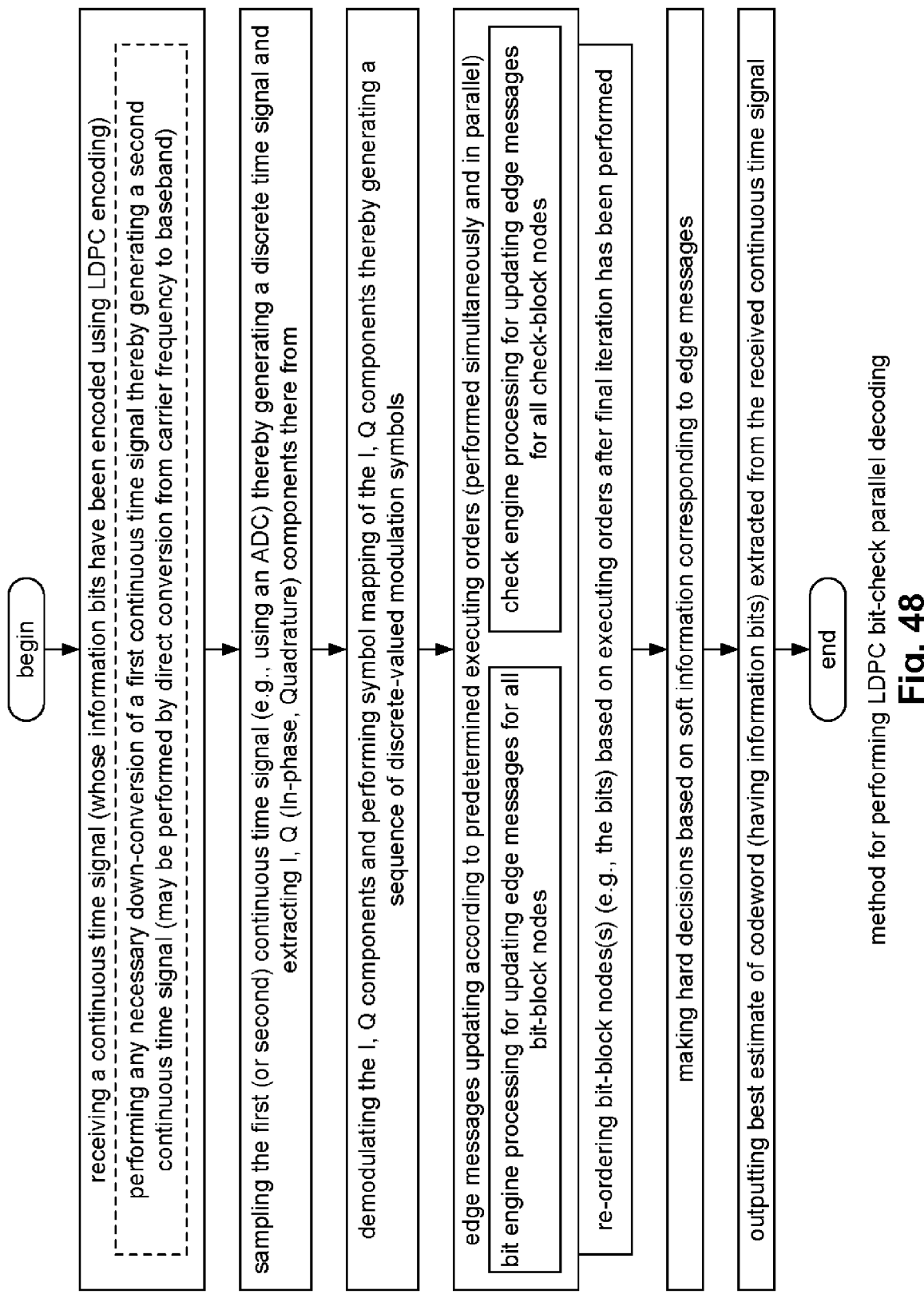
FIG. 48 is a flowchart illustrating an embodiment of a method for performing LDPC bit-check parallel decoding according to the invention.

FIG. 48 is a flowchart illustrating an embodiment of a method for performing LDPC bit-check parallel decoding according to the invention. The method involves receiving a continuous time signal. The information bits that have been encoded within this continuous time signal have been encoded using LDPC encoding. This LDPC encoding may be viewed as being parallel-block LDPC encoding. Upon the receiving of this continuous time signal, it is also noted that the method may involve performing any necessary down-conversion of a first continuous time signal (e.g., the originally received continuous time signal) thereby generating a second continuous time signal. This down conversion may be performed by direct conversion from carrier frequency to baseband, or it may alternatively be performed by passing through an IF (Intermediate Frequency) as well without departing from the scope and spirit of the invention.

The method then involves sampling the first (or second) continuous time signal (e.g., using an ADC) thereby generating a discrete time signal and extracting I, Q (In-phase, Quadrature) components there from. The method then also involves demodulating the I, Q components and performing symbol mapping of the I, Q components thereby generating a sequence of discrete-valued modulation symbols. The method then involves performing edge message updating according to predetermined executing orders. This updating of the edge messages with respect to the check-block nodes and the edge messages with respect to the bit-block nodes is performed simultaneously and in parallel. For example, the method involves bit engine processing for updating edge messages for all bit-block nodes, and the method also involves check engine processing for updating edge messages for all check-block nodes.

In this particular embodiment, the method involves re-ordering the bit-block nodes(s) (e.g., the bits) based on the executing orders that have been employed to direct the parallel decoding processing described above. This re-ordering of the bit-block nodes(s) (e.g., the bits) is performed after a final decoding iteration has been performed. The method also involves making hard decisions based on soft information corresponding to the finally updated edge messages. Using these hard decisions, the method then involves outputting a best estimate of the transmitted codeword (having at least one information bit included therein) that is extracted from the received continuous time signal.

Figure 49:
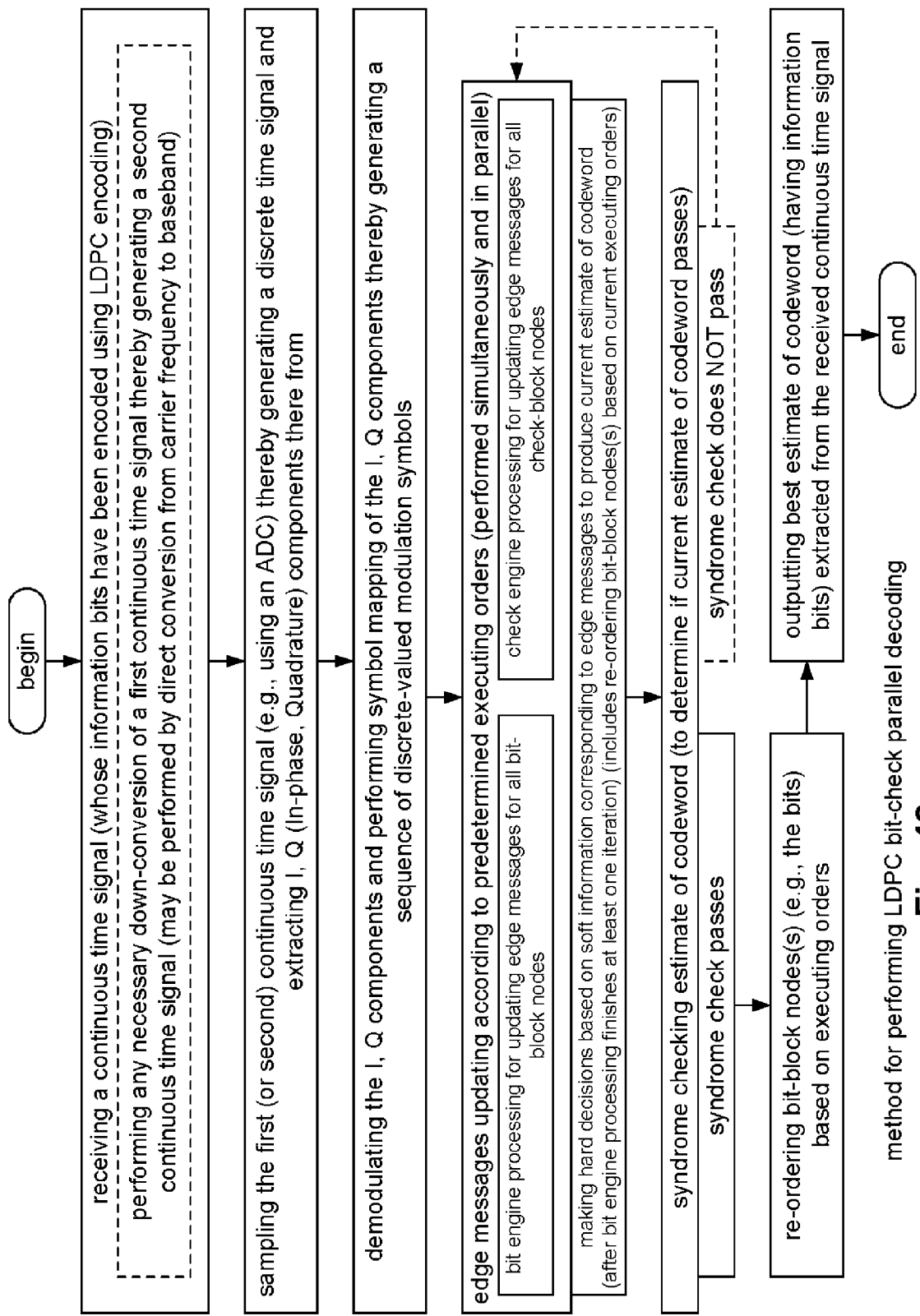
FIG. 49 is a flowchart illustrating an alternative embodiment of a method for performing LDPC bit-check parallel decoding according to the invention.

FIG. 49 is a flowchart illustrating an alternative embodiment of a method for performing LDPC bit-check parallel decoding according to the invention. Initially, this particular method operates very similarly to the embodiment described above with respect to the FIG. 48. The method involves receiving a continuous time signal. The information bits that have been encoded within this continuous time signal have been encoded using LDPC encoding. This LDPC encoding may be viewed as being parallel-block LDPC encoding. Upon the receiving of this continuous time signal, it is also noted that the method may involve performing any necessary down-conversion of a first continuous time signal (e.g., the originally received continuous time signal) thereby generating a second continuous time signal. This down conversion may be performed by direct conversion from carrier frequency to baseband, or it may alternatively be performed by passing through an IF (Intermediate Frequency) as well without departing from the scope and spirit of the invention.

The method then involves sampling the first (or second) continuous time signal (e.g., using an ADC) thereby generating a discrete time signal and extracting I, Q (In-phase, Quadrature) components there from. The method then also involves demodulating the I, Q components and performing symbol mapping of the I, Q components thereby generating a sequence of discrete-valued modulation symbols. The method then involves performing edge message updating according to predetermined executing orders. This updating of the edge messages with respect to the check-block nodes and the edge messages with respect to the bit-block nodes is performed simultaneously and in parallel. For example, the method involves bit engine processing for updating edge messages for all bit-block nodes, and the method also involves check engine processing for updating edge messages for all check-block nodes.

However, this method now departs from the operation of the method of the FIG. 48. In this particular embodiment, the method involves making hard decisions based on soft information corresponding to edge messages to produce a current estimate of the codeword. This estimation also includes re-ordering of the bit-block nodes(s) based on the current status of the executing orders to make an effective current estimate of the codeword. That is to say, the current status of the executing orders is taken into account to arrange the bit-block nodes(s) (e.g., the bits) in an appropriate order so that an effective current estimate of the codeword with the bits in the proper order. The current status of the executing orders may be viewed as being the executing orders that have been employed up to this point. Also, it is noted that this making of hard decisions is performed after bit engine processing has finished at least one decoding iteration.

After this current estimate of the codeword is made, then the method involves performing syndrome checking of the current estimate of the codeword. This is performed to determine if this current estimate of the codeword indeed passes the syndrome check. If the syndrome check does NOT pass, then the method involves returning to the edge messages updating that is performed according to predetermined executing orders (performed simultaneously and in parallel). However, if it is found that the syndrome check does in fact pass, then the method involves re-ordering the bit-block nodes(s) (e.g., the bits) based on the executing orders that have been employed up to this point to direct the parallel decoding processing described above. This re-ordering of the bit-block nodes(s) (e.g., the bits) is performed after a final decoding iteration has been performed as governed by the syndrome checking procedures described above.

Using these appropriately re-ordered bit-block nodes(s) (e.g., the bits), the method then involves outputting a best estimate of the transmitted codeword (having at least one information bit included therein) that is extracted from the received continuous time signal. The best estimate of the transmitted codeword is generated by making hard decisions based on soft information corresponding to the finally updated edge messages.

The principles presented above to performing LDPC bit-check parallel decoding functionality and methods using bit metric may also be extended to other variations and embodiments that may be employed to decode LDPC coded signals. For example, these principles of performing simultaneous and in parallel updating of the edge messages may be adapted to decoding according to LDPC bit-check parallel decoding functionality using bit metric (with bit metric updating), LDPC symbol-check parallel decoding functionality using symbol metric, and LDPC hybrid-check parallel decoding functionality using both symbol metric and bit metric. Some approaches to how this simultaneous and in parallel updating of the edge messages with respect to variable-block nodes and check-block nodes may be performed, for each of these particular approaches to decoding, are presented in the following referenced diagrams.

Figure 50:
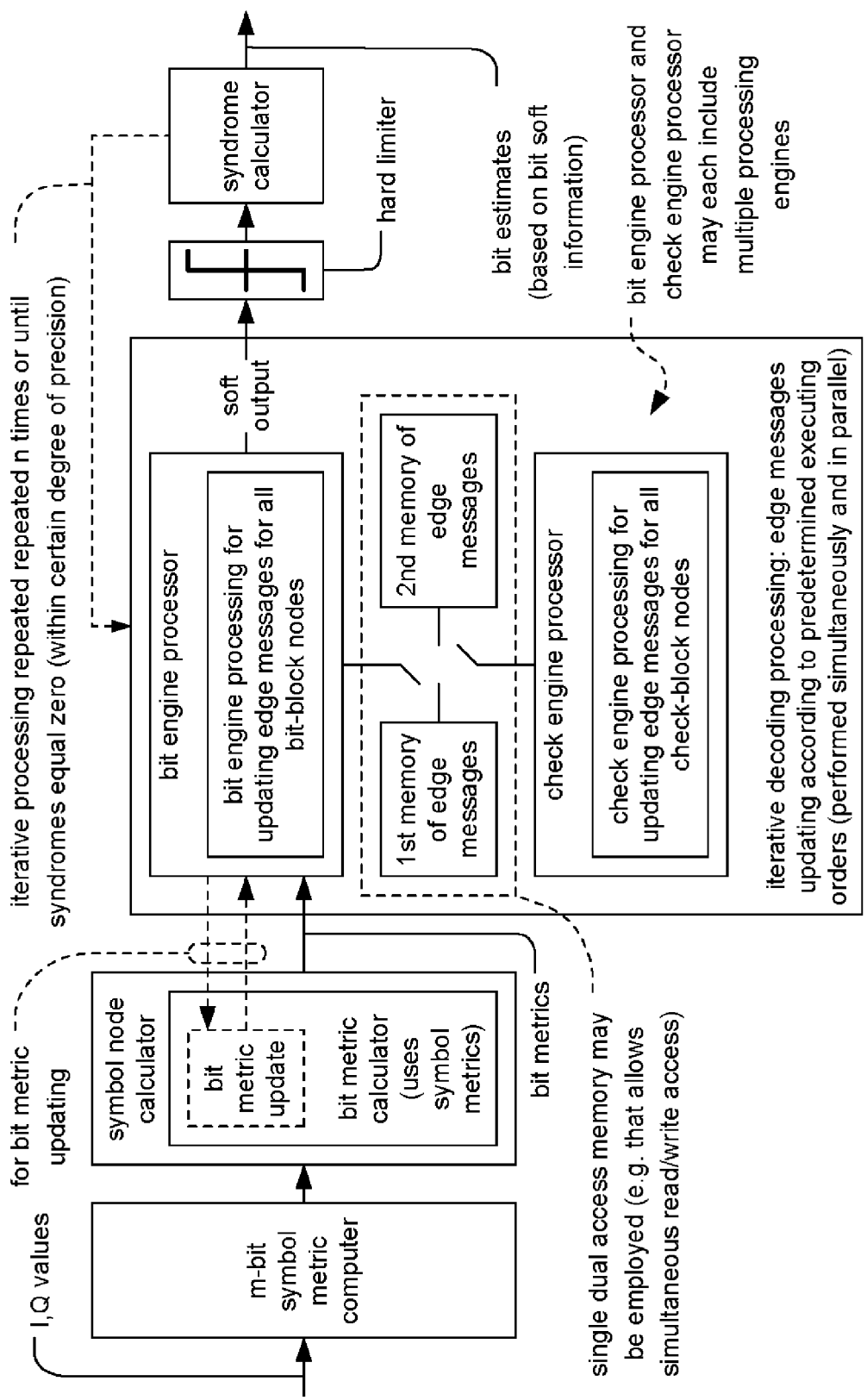
FIG. 50 is a diagram illustrating an embodiment of LDPC bit-check parallel decoding functionality using bit metric (with bit metric updating) according to the invention.

FIG. 50 is a diagram illustrating an embodiment of LDPC bit-check parallel decoding functionality using bit metric (with bit metric updating) according to the invention. Initially, before performing the iterative decoding processing that involves parallel processing of edges with respect to bit-block nodes and processing of edges with respect to check-block nodes (using at least one bit engine processor and at least one check engine processor), this embodiment operates similar to the embodiment described above with respect to FIG. 22.

To perform decoding of an LDPC coded modulation signal having an m-bit signal sequence, the functionality of this diagram may be employed. After receiving the I, Q (In-phase, Quadrature) values of a signal at the symbol nodes, an m-bit symbol metric computer functional block calculates the corresponding symbol metrics. At the symbol nodes, these symbol metrics are then passed to a symbol node calculator functional block that uses these received symbol metrics to calculate the bit metrics corresponding to those symbols. These bit metrics are then passed to the bit nodes connected to the symbol nodes. The symbol node calculator functional block is also operable to perform bit metric updating during subsequent decoding iterations.

The iterative decoding processing of this embodiment differs from that of the embodiment of the FIG. 22, in that, the updating of edge messages with respect to the bit-block nodes and the updating of the edge messages with respect to the check-block nodes are both performed simultaneously and in parallel. At least one bit engine processor and at least one check engine processor operate in cooperation to perform updating of edge messages with respect to bit-block nodes and check-block nodes, respectively. These at least one bit engine processor and at least one check engine processor also both use a $1^{st}$ memory of edge messages and a $2^{nd}$ memory of edge messages. Again, as mentioned within other embodiments, this $1^{st}$ memory and this $2^{nd}$ memory may be implemented as single access memory devices. Alternatively, this $1^{st}$ memory and this $2^{nd}$ memory may be implemented as logical partitions or portions within a dual access memory device. When a bit engine processor accesses the $1^{st}$ memory of edge messages, a check engine processor accesses the $2^{nd}$ memory of edge messages. For example, when the bit engine processor updates a first group of edge messages with respect to at least one bit-block nodes, the bit engine processor accesses the $1^{st}$ memory of edge messages, and when the check engine processor updates a first group of edge messages with respect to at least one check-block nodes, the check engine processor accesses the $2^{nd}$ memory of edge messages. Then, the update processing alternates: when the bit engine processor then updates a second group of edge messages with respect to at least one bit-block nodes, the bit engine processor accesses the $2^{nd}$ memory of edge messages. When the check engine processor updates a second group of edge messages with respect to at least one check-block nodes, the check engine processor accesses the $1^{st}$ memory of edge messages.

The iterative decoding processing may be repeated a predetermined number of iterations (e.g., repeated n times, where n is selectable). Alternatively, these iterative decoding processing steps are repeated until the syndromes of the LDPC code are all equal to zero (within a certain degree of precision).

Soft output information is generated within the bit engine processor during each of the decoding iterations. In this embodiment, this soft output may be provided to a hard limiter where hard decisions may be made, and that hard information may be provided to a syndrome calculator to determined whether the syndromes of the LDPC code are all equal to zero (within a certain degree of precision). That is to say, the syndrome calculator determines whether each syndrome associated with the LDPC code is substantially equal to zero as defined by some predetermined degree of precision. For example, when a syndrome has a mathematically non-zero value that is less than some threshold as defined by the predetermined degree of precision, then that syndrome is deemed to be substantially equal to zero. When a syndrome has a mathematically non-zero value that is greater than the threshold as defined by the predetermined degree of precision, then that syndrome is deemed to be substantially not equal to zero.

When the syndromes are not substantially equal to zero, the iterative decoding processing continues again by appropriately updating and passing the edge messages between the at least one bit engine processor and the at least one check engine processor. After all of these iterative decoding processing steps have been performed, then a best estimate of the bits (that cooperatively form a codeword) is output based on the bit soft information. In the approach of this embodiment, the bit metric values that are calculated by the symbol node calculator functional block can be updated during subsequent decoding iterations for use in updating edge messages with respect to bit-block nodes.

Figure 51:
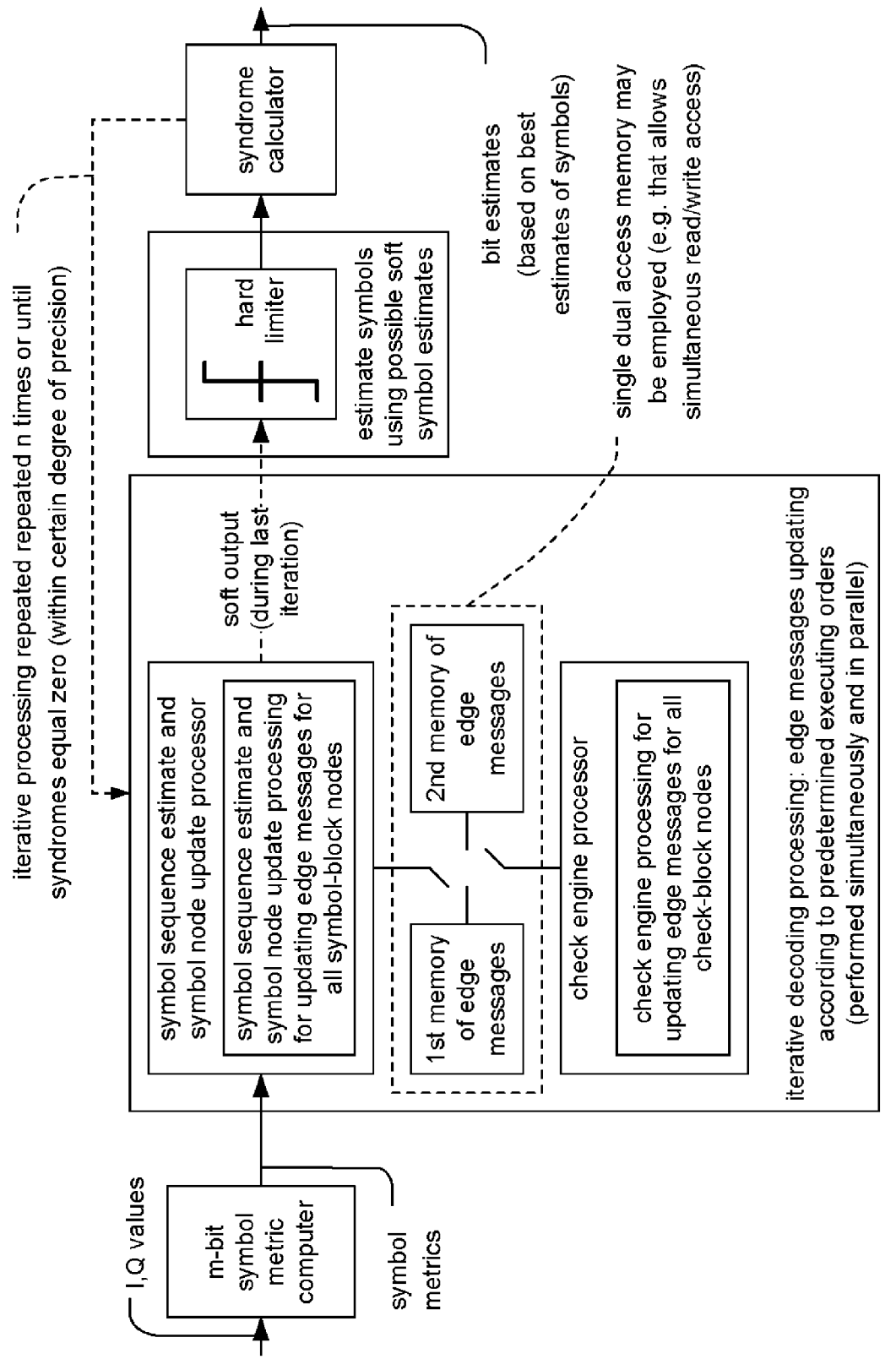
FIG. 51 is a diagram illustrating an embodiment of LDPC symbol-check parallel decoding functionality using symbol metric according to the invention.

FIG. 51 is a diagram illustrating an embodiment of LDPC symbol-check parallel decoding functionality using symbol metric according to the invention. Initially, before performing the iterative decoding processing that involves parallel processing of edges with respect to symbol-block nodes and processing of edges with respect to check-block nodes (using at least one symbol sequence and symbol node update processor and at least one check engine processor), this embodiment operates similar to the embodiment described above with respect to FIG. 26B. The initial decoding processing of this embodiment operates similarly to that of FIG. 26B.

However, the iterative decoding processing of this embodiment differs from that of the embodiment of the FIG. 26B, in that, the updating of edge messages with respect to the symbol-block nodes and the updating of the edge messages with respect to the check-block nodes are both performed simultaneously and in parallel. At least one symbol sequence and symbol node update processor and at least one check engine processor operate in cooperation to perform updating of edge messages with respect to symbol-block nodes and edge messages with respect to check-block nodes, respectively. These at least one symbol sequence and symbol node update processor and at least one check engine processor also both use a $1^{st}$ memory of edge messages and a $2^{nd}$ memory of edge messages. Again, as mentioned within other embodiments, this $1^{st}$ memory and this $2^{nd}$ memory may be implemented as single access memory devices. Alternatively, this $1^{st}$ memory and this $2^{nd}$ memory may be implemented as logical partitions or portions within a dual access memory device. When a symbol sequence and symbol node update processor accesses the $1^{st}$ memory of edge messages, a check engine processor accesses the $2^{nd}$ memory of edge messages. For example, when the symbol sequence and symbol node update processor updates a first group of edge messages with respect to at least one symbol-block nodes, the symbol sequence and symbol node update processor accesses the $1^{st}$ memory of edge messages. When the check engine processor updates a first group of edge messages with respect to at least one check-block nodes, the check engine processor accesses the $2^{nd}$ memory of edge messages. Then, the update processing alternates: when the symbol sequence and symbol node update processor then updates a second group of edge messages with respect to at least one symbol-block nodes, the symbol sequence and symbol node update processor accesses the $2^{nd}$ memory of edge messages. When the check engine processor updates a second group of edge messages with respect to at least one check-block nodes, the check engine processor accesses the $1^{st}$ memory of edge messages.

The iterative decoding processing may be repeated a predetermined number of iterations (e.g., repeated n times, where n is selectable). Alternatively, these iterative decoding processing steps are repeated until the syndromes of the LDPC code are all equal to zero (within a certain degree of precision).

Soft output information is generated within the symbol sequence and symbol node update processor during each of the decoding iterations. In this embodiment, this soft output may be provided to a hard limiter where hard decisions may be made, and that hard information may be provided to a syndrome calculator to determined whether the syndromes of the LDPC code are all equal to zero (within a certain degree of precision). That is to say, the syndrome calculator determines whether each syndrome associated with the LDPC code is substantially equal to zero as defined by some predetermined degree of precision. For example, when a syndrome has a mathematically non-zero value that is less than some threshold as defined by the predetermined degree of precision, then that syndrome is deemed to be substantially equal to zero. When a syndrome has a mathematically non-zero value that is greater than the threshold as defined by the predetermined degree of precision, then that syndrome is deemed to be substantially not equal to zero.

When the syndromes are not substantially equal to zero, the iterative decoding processing continues again by appropriately updating the edge messages with respect to symbol-block nodes and the edge messages with respect to check-block nodes using the at least one symbol sequence and symbol node update processor and the at least one check engine processor. All of these iterative decoding processing steps have been performed, then a best estimate of the one or more symbols (that cooperatively form a codeword) is output based on the symbol soft information.

Figure 52:
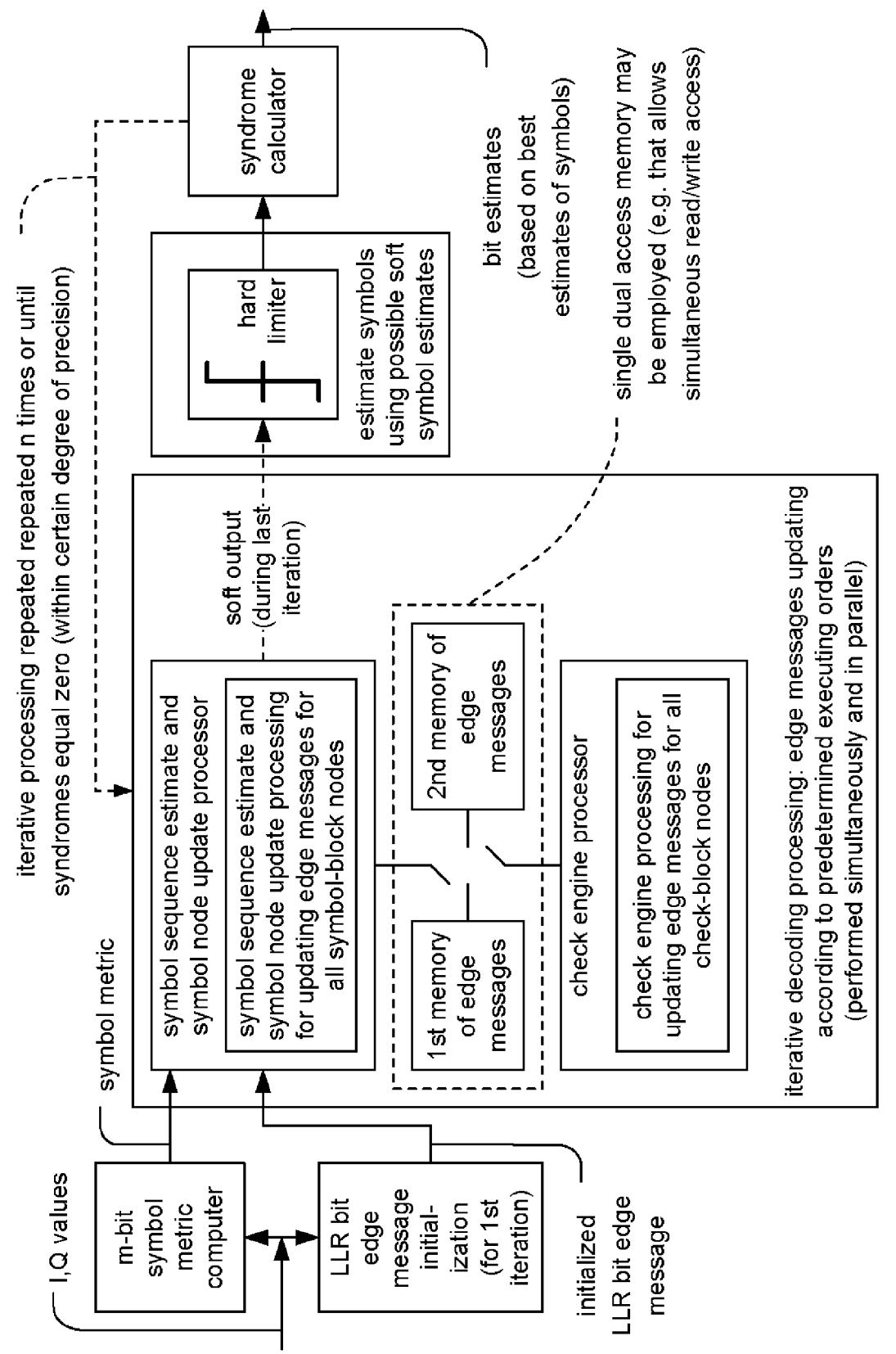
FIG. 52 is a diagram illustrating an embodiment of LDPC hybrid-check parallel decoding functionality using both symbol metric and bit metric according to the invention.

FIG. 52 is a diagram illustrating an embodiment of LDPC hybrid-check parallel decoding functionality using both symbol metric and bit metric according to the invention. Initially, before performing the iterative decoding processing that involves parallel processing of edges with respect to the combination of bit-block nodes and symbol-block nodes (e.g., using both bit-block nodes and symbol-block nodes thereby being hybrid) and processing of edges with respect to check-block nodes (using at least one symbol sequence and symbol node update processor and at least one check engine processor), this embodiment operates similar to the embodiment described above with respect to FIG. 27. The initial decoding processing of this embodiment operates similarly to that of FIG. 27.

However, the iterative decoding processing of this embodiment differs from that of the embodiment of the FIG. 27, in that, the updating of edge messages with respect to the hybrid combination of bit-block nodes and symbol-block nodes and the updating of the edge messages with respect to the check-block nodes are both performed simultaneously and in parallel. At least one symbol sequence and symbol node update processor and at least one check engine processor operate in cooperation to perform updating of edge messages with respect to hybrid combination of bit-block nodes and symbol-block nodes and check-block nodes, respectively. These at least one symbol sequence and symbol node update processor and at least one check engine processor also both use a $1^{st}$ memory of edge messages and a $2^{nd}$ memory of edge messages. Again, as mentioned within other embodiments, this $1^{st}$ memory and this $2^{nd}$ memory may be implemented as single access memory devices. Alternatively, this $1^{st}$ memory and this $2^{nd}$ memory may be implemented as logical partitions or portions within a dual access memory device. When a symbol sequence and symbol node update processor accesses the $1^{st}$ memory of edge messages, a check engine processor accesses the $2^{nd}$ memory of edge messages. For example, when the symbol sequence and symbol node update processor updates a first group of edge messages with respect to at least one hybrid combination of bit-block nodes and symbol-block nodes, the symbol sequence and symbol node update processor accesses the $1^{st}$ memory of edge messages. When the check engine processor updates a first group of edge messages with respect to at least one check-block nodes, the check engine processor accesses the $2^{nd}$ memory of edge messages. Then, the update processing alternates: when the symbol sequence and symbol node update processor then updates a second group of edge messages with respect to at least one hybrid combination of bit-block nodes and symbol-block nodes, the symbol sequence and symbol node update processor accesses the $2^{nd}$ memory of edge messages. When the check engine processor updates a second group of edge messages with respect to at least one check-block nodes, the check engine processor accesses the $1^{st}$ memory of edge messages.

Similar to some of the other embodiments described above, the iterative decoding processing may be repeated a predetermined number of iterations (e.g., repeated n times, where n is selectable). Alternatively, these iterative decoding processing steps are repeated until the syndromes of the LDPC code are all equal to zero (within a certain degree of precision).

Hybrid type soft output information (including both symbol and bit level information) is generated within the symbol sequence and symbol node update processor during each of the decoding iterations. In this embodiment, this soft output may be provided to a hard limiter where hard decisions may be made, and that hard information may be provided to a syndrome calculator to determined whether the syndromes of the LDPC code are all equal to zero (within a certain degree of precision). That is to say, the syndrome calculator determines whether each syndrome associated with the LDPC code is substantially equal to zero as defined by some predetermined degree of precision. For example, when a syndrome has a mathematically non-zero value that is less than some threshold as defined by the predetermined degree of precision, then that syndrome is deemed to be substantially equal to zero. When a syndrome has a mathematically non-zero value that is greater than the threshold as defined by the predetermined degree of precision, then that syndrome is deemed to be substantially not equal to zero.

When the syndromes are not substantially equal to zero, the iterative decoding processing continues again by appropriately updating the edge messages with respect to the hybrid combination of bit-block nodes and symbol-block nodes and the edge messages with respect to check-block nodes using the at least one symbol sequence and symbol node update processor and the at least one check engine processor. All of these iterative decoding processing steps have been performed, then a best estimate of the one or more symbols, and the bits included therein (that cooperatively form a codeword) is output based on the hybrid soft information (e.g., the symbol soft information and the bit soft information).

FIG. 53A is a diagram illustrating an embodiment of a $1^{st}$ step of LDPC bit-check parallel decoding processing according to the invention. This diagram shows very simply how a P bit engine processors and P check engine processors operate with respect to a left memory of edge messages and a right memory of edge messages. During a first time period, when the P bit engine processors are updating edge messages contained within the left memory of edge messages, the P check engine processors are updating edge messages contained within the right memory of edge messages. Then the accessing of the memories by the P bit engine processors and the P check engine processors alternates. During a second time period, when the P bit engine processors are updating edge messages contained within the right memory of edge messages, the P check engine processors are updating edge messages contained within the left memory of edge messages. It is again noted that the right and left memory could be two separate memory devices (e.g., such as single access type memories). Alternatively, the right and left memory could be logical partitions or portions within a single memory devices (e.g., such as dual access type memory).

FIG. 53B is a diagram illustrating an embodiment of a $1^{st}$ step of LDPC symbol-check parallel decoding processing according to the invention. This diagram shows very simply how a P symbol engine processors and P check engine processors operate with respect to a left memory of edge messages and a right memory of edge messages. During a first time period, when the P symbol engine processors are updating edge messages contained within the left memory of edge messages, the P check engine processors are updating edge messages contained within the right memory of edge messages. Then the accessing of the memories by the P symbol engine processors and the P check engine processors alternates. During a second time period, when the P symbol engine processors are updating edge messages contained within the right memory of edge messages, the P check engine processors are updating edge messages contained within the left memory of edge messages. It is again noted that the right and left memory could be two separate memory devices (e.g., such as single access type memories). Alternatively, the right and left memory could be logical partitions or portions within a single memory devices (e.g., such as dual access type memory).

It is also noted that the methods described within the preceding figures may also be performed within any of the appropriate system and/or apparatus designs (communication systems, communication transmitters, communication receivers, communication transceivers, and/or functionality described therein) that are described above without departing from the scope and spirit of the invention.

Moreover, it is also noted that the various functionality, system and/or apparatus designs, and method related embodiments that are described herein may all be implemented in the logarithmic domain thereby enabling multiplication operations to be performed using addition and division operations to be performed using subtraction.

In view of the above detailed description of the invention and associated drawings, other modifications and variations will now become apparent. It should also be apparent that such other modifications and variations may be effected without departing from the spirit and scope of the invention.

What is claimed is:

1. A decoder that is operable to decode an LDPC (Low Density Parity Check) coded signal, the decoder comprising:
a check engine processor that is operable to update a first plurality of check-block edge messages thereby generating a second plurality of check-block edge messages during a time period; and
a bit engine processor that is operable to update a first plurality of bit-block edge messages thereby generating a second plurality of bit-block edge messages during the time period; and wherein:
after a final parallel decoding iteration, the bit engine processor is operable to process a most recently updated plurality of bit-block edge messages to generate soft information corresponding to at least one information bit encoded into the LDPC coded signal.

2. The decoder of claim 1, further comprising:
a hard limiter that is operable to process the soft information thereby generating a hard estimate corresponding to the at least one information bit encoded into the LDPC coded signal.

3. The decoder of claim 1, further comprising:
a hard limiter that is operable to process the soft information thereby generating a hard estimate corresponding to the at least one information bit encoded into the LDPC coded signal; and
a syndrome calculator that is operable process the hard estimate to determine whether all syndromes of an LDPC code by which the LDPC coded signal is generated are equal to zero.

4. The decoder of claim 1, further comprising:
a dual access memory that can be accessed simultaneously by each of the check engine processor and the bit engine processor for reading or writing of check-block edge messages and bit-block edge messages.

5. The decoder of claim 1, wherein:
the check engine processor is operable to process a third plurality of bit-block edge messages to update the first plurality of check-block edge messages thereby generating the second plurality of check-block edge messages during the time period; and
the bit engine processor is operable to process a third plurality of check-block edge messages to update the first plurality of bit-block edge messages thereby generating the second plurality of bit-block edge messages during the time period.

6. The decoder of claim 1, wherein:
the first plurality of bit-block edge messages corresponds to edges connected to a first bit-block node of an LDPC block bipartite graph;
the first bit-block node includes a first subset of bit nodes of an LDPC bipartite graph of an LDPC code by which the LDPC coded signal is generated;
the first plurality of check-block edge messages corresponds to edges connected to a first check-block node of the LDPC block bipartite graph;
the first check-block node includes a first subset of check nodes of the LDPC bipartite graph;
a permutation corresponds a first mapping of a first plurality of edge connections between bit-block nodes and check-block nodes within the LDPC block bipartite graph and a second mapping of a second plurality of edge connections between bit nodes and check nodes within the LDPC bipartite graph; and
an execution order that is generated based on the first mapping and the second mapping governs which check-block edge messages and which bit-block edge messages are updated by the check engine processor and the bit engine processor, respectively, during the time period.

7. The decoder of claim 1, wherein:
after the final parallel decoding iteration, the bit engine processor is operable to process the most recently updated plurality of bit-block edge messages and to re-order the most recently updated plurality of bit-block edge messages according to bit nodes of an LDPC bipartite graph of an LDPC code by which the LDPC coded signal is generated; and
the bit engine processor is operable to employ the re-ordered, most recently updated plurality of bit-block edge messages to generate the soft information corresponding to at least one information bit encoded into the LDPC coded signal.

8. The decoder of claim 1, wherein:
after the final parallel decoding iteration, the bit engine processor and the check engine processor are operable to perform a non-parallel decoding iteration that is operable to re-order the most recently updated plurality of bit-block edge messages according to bit nodes of an LDPC bipartite graph of an LDPC code by which the LDPC coded signal is generated;
during the non-parallel decoding iteration, the bit engine processor is operable to generate a most recently updated plurality of bit edge messages corresponding to all bit nodes of the LDPC bipartite graph; and the bit engine processor is operable to employ the most recently updated plurality of bit edge messages to generate the soft information corresponding to at least one information bit encoded into the LDPC coded signal.

9. The decoder of claim 1, wherein:
the decoder is implemented within a wireless communication device.

10. The decoder of claim 1, wherein:
the decoder is implemented within a communication device; and
the communication device is implemented within at least one of a satellite communication system, an HDTV (High Definition Television) communication system, a cellular communication system, a microwave communication system, a point-to-point communication system, a uni-directional communication system, a bi-directional communication system, a one to many communication system, a fiber-optic communication system, a WLAN (Wireless Local Area Network) communication system, and a DSL (Digital Subscriber Line) communication system.

11. A decoder that is operable to decode an LDPC (Low Density Parity Check) coded signal, the decoder comprising:
a check engine processor that is operable to update a first plurality of check-block edge messages thereby generating a second plurality of check-block edge messages during a time period as directed by an execution order;
a bit engine processor that is operable to update a first plurality of bit-block edge messages thereby generating a second plurality of bit-block edge messages during the time period as directed by the execution order; and wherein:
after a final parallel decoding iteration:
the check engine processor is operable to employ a first plurality of bit edge messages to update a first plurality of check edge messages thereby generating a second plurality of check edge messages; and
the bit engine processor is operable to:
employ the second plurality of check edge messages to update a second plurality of bit edge messages thereby generating a third plurality of bit edge messages; and
employ the third plurality of bit edge messages to generate soft information corresponding to at least one information bit encoded into the LDPC coded signal;
the soft information corresponding to the at least one information bit encoded into the LDPC coded signal is used to make a hard estimate of the at least one information bit encoded into the LDPC coded signal;
the first plurality of bit edge messages and the third plurality of bit edge messages correspond to all bit nodes of an LDPC bipartite graph of an LDPC code by which the LDPC coded signal is generated.

12. The decoder of claim 11, wherein:
the first plurality of bit-block edge messages corresponds to edges connected to a first bit-block node of an LDPC block bipartite graph;
the first bit-block node includes a first subset of bit nodes of an LDPC bipartite graph;
the first plurality of check-block edge messages corresponds to edges connected to a first check-block node of the LDPC block bipartite graph;
the first check-block node includes a first subset of check nodes of the LDPC bipartite graph; and a permutation corresponds a first mapping of a first plurality of edge connections between bit-block nodes and check-block nodes within the LDPC block bipartite graph and a second mapping of a second plurality of edge connections between bit nodes and check nodes within the LDPC bipartite graph; and
the execution order is generated based on the first mapping and the second mapping.

13. The decoder of claim 11, wherein:
during initialization, the bit engine processor is operable to initialize bit-block edge messages corresponding to a minimal set of bit-block nodes needed to effectuate subsequent parallel decoding to be performed by the bit engine processor and the check engine processor; and
during each iteration of a plurality of parallel decoding iterations performed after initialization, the bit engine processor and the check engine processor operate simultaneously and in parallel to one another.

14. The decoder of claim 11, further comprising:
a hard limiter that is operable to process the soft information thereby generating the hard estimate corresponding to the at least one information bit encoded into the LDPC coded signal; and
a syndrome calculator that is operable process the hard estimate to determine whether all syndromes of the LDPC code by which the LDPC coded signal is generated are equal to zero.

15. The decoder of claim 11, further comprising:
a dual access memory that can be accessed simultaneously by each of the check engine processor and the bit engine processor for reading or writing of check-block edge messages and bit-block edge messages.

16. The decoder of claim 11, wherein:
the decoder is implemented within a wireless communication device.

17. The decoder of claim 11, wherein:
the decoder is implemented within a communication device; and
the communication device is implemented within at least one of a satellite communication system, an HDTV (High Definition Television) communication system, a cellular communication system, a microwave communication system, a point-to-point communication system, a uni-directional communication system, a bi-directional communication system, a one to many communication system, a fiber-optic communication system, a WLAN (Wireless Local Area Network) communication system, and a DSL (Digital Subscriber Line) communication system.

18. A method for decoding an LDPC (Low Density Parity Check) coded signal, the method comprising:
updating a first plurality of check-block edge messages thereby generating a second plurality of check-block edge messages during a time period; and
updating a first plurality of bit-block edge messages thereby generating a second plurality of bit-block edge messages during the time period; and wherein:
after a final parallel decoding iteration, processing a most recently updated plurality of bit-block edge messages to generate soft information corresponding to at least one information bit encoded into the LDPC coded signal.

19. The method of claim 18, wherein:
the first plurality of bit-block edge messages corresponds to edges connected to a first bit-block node of an LDPC block bipartite graph;

the first bit-block node includes a first subset of bit nodes of an LDPC bipartite graph of an LDPC code by which the LDPC coded signal is generated;

the first plurality of check-block edge messages corresponds to edges connected to a first check-block node of the LDPC block bipartite graph;

the first check-block node includes a first subset of check nodes of the LDPC bipartite graph;

a permutation corresponds a first mapping of a first plurality of edge connections between bit-block nodes and check-block nodes within the LDPC block bipartite graph and a second mapping of a second plurality of edge connections between bit nodes and check nodes within the LDPC bipartite graph; and an execution order that is generated based on the first mapping and the second mapping governs which check-block edge messages and which bit-block edge messages are updated during the time period.

20. The method of claim 18, wherein:

the method is performed within a decoder;

the decoder is implemented within a communication device; and the communication device is implemented within at least one of a satellite communication system, an HDTV (High Definition Television) communication system, a cellular communication system, a microwave communication system, a point-to-point communication system, a uni-directional communication system, a bi-directional communication system, a one to many communication system, a fiber-optic communication system, a WLAN (Wireless Local Area Network) communication system, and a DSL (Digital Subscriber Line) communication system.

\* \* \* \* \*

UNITED STATES PATENT AND TRADEMARK OFFICE
CERTIFICATE OF CORRECTION

| | | |
|---|---|---|
| PATENT NO. | : 7,958,428 B2 | Page 1 of 1 |
| APPLICATION NO. | : 11/846761 | |
| DATED | : June 7, 2011 | |
| INVENTOR(S) | : Ba-Zhong Shen et al. | |

It is certified that error appears in the above-identified patent and that said Letters Patent is hereby corrected as shown below:

Col. 58, line 1, in claim 3: after "operable" insert --to--
Col. 60, line 25, claim 14: after "operable" insert --to--

Signed and Sealed this
Thirtieth Day of October, 2012

David J. Kappos
*Director of the United States Patent and Trademark Office*